United States Patent
Lee et al.

(10) Patent No.: US 12,080,830 B2
(45) Date of Patent: Sep. 3, 2024

(54) PIXEL, DISPLAY DEVICE INCLUDING SAME, AND MANUFACTURING METHOD THEREFOR

(71) Applicant: SAMSUNG DISPLAY CO., LTD., Yongin-si (KR)

(72) Inventors: Won Ho Lee, Yongin-si (KR); Jong Hyuk Kang, Yongin-si (KR); Hyun Deok Im, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 391 days.

(21) Appl. No.: 17/602,138

(22) PCT Filed: Jan. 16, 2020

(86) PCT No.: PCT/KR2020/000813
§ 371 (c)(1),
(2) Date: Oct. 7, 2021

(87) PCT Pub. No.: WO2020/209484
PCT Pub. Date: Oct. 15, 2020

(65) Prior Publication Data
US 2022/0149244 A1  May 12, 2022

(30) Foreign Application Priority Data
Apr. 8, 2019  (KR) .................. 10-2019-0041012

(51) Int. Cl.
*H01L 33/38*  (2010.01)
*H01L 27/15*  (2006.01)
(Continued)

(52) U.S. Cl.
CPC .......... *H01L 33/387* (2013.01); *H01L 27/156* (2013.01); *H01L 33/005* (2013.01);
(Continued)

(58) Field of Classification Search
CPC ... H01L 33/387; H01L 27/156; H01L 33/005; H01L 33/62; H01L 2933/0016;
(Continued)

(56) References Cited

U.S. PATENT DOCUMENTS 7,777,219 B2  8/2010  Lee
8,216,440 B2  7/2012  Shibata et al.
(Continued)

FOREIGN PATENT DOCUMENTS

CN  107611153  1/2018
CN  108206228  6/2018
(Continued)

OTHER PUBLICATIONS

International Search Report, with English translation, corresponding to International Application No. PCT/KR2020/000813 dated May 1, 2020.
(Continued)

*Primary Examiner* — Herve-Louis Y Assouman
(74) *Attorney, Agent, or Firm* — KILE PARK REED & HOUTTEMAN PLLC

(57) ABSTRACT

A pixel includes electrode pairs successively disposed in a first direction, and each including a first sub-electrode and a second sub-electrode successively disposed in the first direction; light emitting elements each electrically connected between the first sub-electrode and the second sub-electrode of any one the electrode pairs; a first connection electrode electrically connected between the first sub-electrode of a first electrode pair and a first power supply; and a second connection electrode electrically connected between the second sub-electrode of a last electrode pair and a second power supply. The second sub-electrode of a remaining electrode pair other than the last electrode pair is spaced apart from the first sub-electrode of a subsequent electrode (Continued)

pair with at least one first sub-electrode or at least one second sub-electrode disposed therebetween, and is electrically connected to the first sub-electrode of the subsequent electrode pair.

21 Claims, 25 Drawing Sheets

(51) Int. Cl.
    *H01L 33/00*     (2010.01)
    *H01L 33/62*     (2010.01)

(52) U.S. Cl.
    CPC ...... *H01L 33/62* (2013.01); *H01L 2933/0016* (2013.01); *H01L 2933/0066* (2013.01)

(58) Field of Classification Search
    CPC ........... H01L 2933/0066; H01L 25/167; H01L 25/0753; H01L 27/1214; H10B 63/00
    See application file for complete search history.

(56) References Cited

U.S. PATENT DOCUMENTS

| | | |
|---|---|---|
| 9,110,357 B2 | 8/2015 | Natsumeda et al. |
| 10,026,777 B2 | 7/2018 | Kang et al. |
| 10,461,123 B2 | 10/2019 | Kim et al. |
| 10,672,946 B2 | 6/2020 | Cho et al. |
| 2004/0075629 A1 | 4/2004 | Yasukawa |
| 2012/0153319 A1 | 6/2012 | Hsu |
| 2018/0012876 A1* | 1/2018 | Kim ...................... H01L 33/387 |
| 2018/0019377 A1* | 1/2018 | Kim ........................ H01L 33/44 |
| 2018/0138157 A1 | 5/2018 | Im et al. |
| 2018/0175104 A1 | 6/2018 | Kang et al. |
| 2018/0175106 A1 | 6/2018 | Kim et al. |

FOREIGN PATENT DOCUMENTS

| | | |
|---|---|---|
| JP | 4381428 | 12/2009 |
| JP | 2014-75550 | 4/2014 |
| JP | 2014-123583 | 7/2014 |
| JP | 2015-11784 | 1/2015 |
| KR | 10-2004-0015934 | 2/2004 |
| KR | 10-2016-0059569 | 5/2016 |
| KR | 10-2018-0071465 | 6/2018 |
| KR | 10-2018-0072909 | 7/2018 |
| KR | 10-2020-0032809 | 3/2020 |
| TW | I321858 | 3/2010 |
| WO | 2011/142456 | 11/2011 |
| WO | 2012/140942 | 10/2012 |

OTHER PUBLICATIONS

Written Opinion, with English translation, corresponding to International Application No. PCT/KR2020/000813, dated May 1, 2020.
Indian First Examination Report for Indian Patent Application or Patent No. 202117045927, dated Mar. 21, 2022.
Chinese Office Action for Chinese Patent Application No. 202080027513.5, dated Feb. 6, 2024.

* cited by examiner

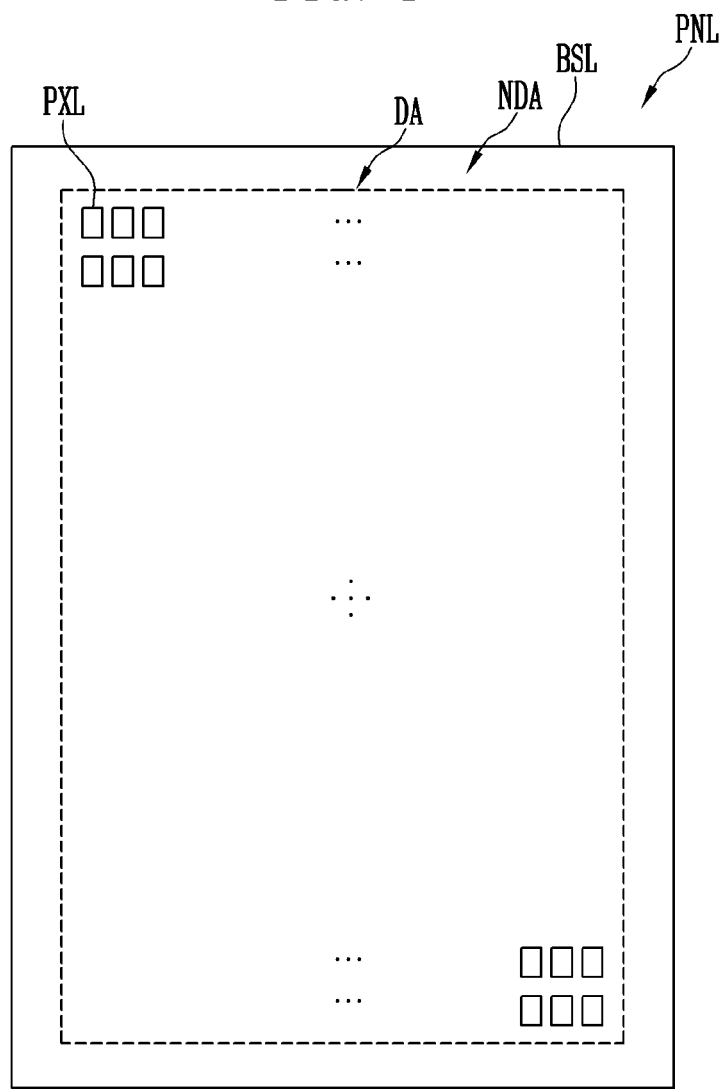

SET1[K]: SET1[1], SET1[2], SET1[3], SET1[4], SET1[5], SET1[6]
SET2[K]: SET2[1], SET2[2], SET2[3], SET2[4], SET2[5], SET2[6]
LDK: LD1, LD2, LD3, LD4, LD5, LD6

PIXEL, DISPLAY DEVICE INCLUDING SAME, AND MANUFACTURING METHOD THEREFOR

CROSS-REFERENCE TO RELATED APPLICATION(S)

This application is a national entry of International Application No. PCT/KR2020/000813, filed on Jan. 16, 2020, which claims under 35 U.S.C. § 119(a) and 365(b) priority to and benefits of Korean Patent Application No. 10-2019-0041012, filed on Apr. 8, 2019 in the Korean Intellectual Property Office, the entire contents of which are incorporated herein by reference.

BACKGROUND

1. Technical Field

Embodiments relate to a pixel, a display device including the pixel, and a method of fabricating the display device.

2. Description of Related Art

Recently, a technique of manufacturing a subminiature light emitting element using a material having a reliable inorganic crystal structure and manufacturing a light emitting device using the light emitting element has been developed. For example, a technique of fabricating subminiature light emitting elements having a small size corresponding to a range from the nanometer scale to the micrometer scale, and forming light sources of various light emitting devices, for example, pixels of display devices using the subminiature light emitting elements, has been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a pixel including a light emitting element, a display device including the pixel, and a method of fabricating the display device.

According to an aspect of the disclosure, a pixel may include electrode pairs successively disposed in a first direction, and each of the electrode pairs including a first sub-electrode and a second sub-electrode successively disposed in the first direction; light emitting elements, each of the light emitting elements being electrically connected between the first sub-electrode and the second sub-electrode of any one of the electrode pairs; a first connection electrode electrically connected between the first sub-electrode of a first electrode pair of the electrode pairs and a first power supply; and a second connection electrode electrically connected between the second sub-electrode of a last electrode pair of the electrode pairs and a second power supply. The second sub-electrode of a remaining electrode pair other than the last electrode pair of the electrode pairs is spaced apart from the first sub-electrode of a subsequent electrode pair with at least one first sub-electrode or at least one second sub-electrode disposed therebetween, and is electrically connected to the first sub-electrode of the subsequent electrode pair.

In an embodiment, respective first sub-electrodes and respective second sub-electrodes of two electrode pairs successively disposed among the electrode pairs may be disposed in opposite directions such that the respective first sub-electrodes of the two electrode pairs or the respective second sub-electrodes of the two electrode pairs are adjacent to each other.

In an embodiment, a first sub-electrode and a second sub-electrode of each odd numbered electrode pair among the electrode pairs may be successively disposed in the first direction. A first sub-electrode and a second sub-electrode of each even numbered electrode pair among the electrode pairs may be disposed in reverse order in the first direction.

In an embodiment, each of the light emitting elements may include a first end electrically connected to the first sub-electrode of one of the electrode pairs; and a second end electrically connected to the second sub-electrode of one of the electrode pairs.

In an embodiment, the first end and the second end of each of the light emitting elements may be a P-type end and an N-type end, respectively. Each of the light emitting elements may be electrically connected in a forward direction between the first sub-electrode and the second sub-electrode of one of the electrode pairs.

In an embodiment, the pixel may further include first contact electrodes respectively disposed on first sub-electrodes of the electrode pairs and electrically and respectively connecting each of the first sub-electrodes to a first end of an adjacent light emitting element; and second contact electrodes respectively disposed on second sub-electrodes of the electrode pairs and electrically and respectively connecting each of the respective second sub-electrodes to a second end of an adjacent light emitting element.

In an embodiment, the second sub-electrode of the remaining electrode pair other than the last electrode pair may be electrically connected to the first sub-electrode of the subsequent electrode pair through a corresponding one of intermediate connection electrodes.

In an embodiment, each intermediate connection electrode may integrally extend from one of the second sub-electrode of the remaining electrode pair and the first sub-electrode of the subsequent electrode pair.

In an embodiment, the first contact electrode or the second contact electrode that is disposed on a remaining sub-electrode of the second sub-electrode of the remaining electrode pair and the first sub-electrode of the subsequent electrode pair may include a protrusion protruding in a second direction intersecting the first direction and may be electrically connected to the each intermediate connection electrode.

In an embodiment, each of the first sub-electrode and the second sub-electrode of the electrode pairs may include a reflective electrode layer including a reflective conductive material. Each of the first contact electrode and the second contact electrode may include a transparent electrode layer including a transparent conductive material.

In an embodiment, the pixel may further include an emission area enclosed by an opaque bank and including the electrode pairs and the light emitting elements. The first direction may be a longitudinal direction of the emission area.

In an embodiment, the electrode pairs may include three or more electrode pairs. The light emitting elements may be dispersed and disposed in three or more serial stages including the respective electrode pairs, and may be electrically connected to each other in a series-parallel combination structure.

In an embodiment, the pixel may further include an emission area enclosed by an opaque bank and including the electrode pairs and the light emitting elements. The first direction may be a transverse direction of the emission area.

In an embodiment, the electrode pairs may include two or more electrode pairs each including first sub-electrodes and second sub-electrodes extending in a longitudinal direction of the emission area.

In an embodiment, the pixel may further include at least one of a first dummy electrode electrically isolated and disposed adjacent to the first electrode pair; and a second dummy electrode electrically isolated and disposed adjacent to the last electrode pair.

In an embodiment, the pixel may further include banks respectively disposed below at least one of the first sub-electrode and the second sub-electrode of the electrode pairs.

In an embodiment, a part of the banks may be respectively disposed below two first sub-electrodes or two second sub-electrodes successively disposed in the first direction among the first sub-electrodes and second sub-electrodes of the electrode pairs such that the part of the banks overlap the two first sub-electrodes or the two second sub-electrodes.

In an embodiment, the banks may be individually separated and disposed below each of the first sub-electrodes and the second sub-electrodes of the electrode pairs.

A display device in accordance with an embodiment may include a pixel disposed in a display area. The pixel may include electrode pairs successively disposed in a first direction, and each of the electrode pairs including a first sub-electrode and a second sub-electrode successively disposed in the first direction; light emitting elements, each of the light emitting elements being electrically connected between the first sub-electrode and the second sub-electrode of any one of the electrode pairs; a first connection electrode electrically connected between the first sub-electrode of a first electrode pair of the electrode pairs and a first power supply; and a second connection electrode electrically connected between the second sub-electrode of a last electrode pair of the electrode pairs and a second power supply. The second sub-electrode of a remaining electrode pair other than the last electrode pair of the electrode pairs may be spaced apart from the first sub-electrode of a subsequent electrode pair with at least one first sub-electrode or at least one second sub-electrode disposed therebetween, and may be electrically connected to the first sub-electrode of the subsequent electrode pair.

A method of fabricating a display device in accordance with an embodiment may include forming, in an emission area of each pixel, electrode pairs each of the electrode pairs including a pair of a first sub-electrode and a second sub-electrode and successively disposed in a first direction, and a first alignment line and a second alignment line respectively electrically connected to the first sub-electrodes and the second sub-electrodes of the electrode pairs; supplying light emitting elements to the emission area, and applying alignment signals to the first alignment line and the second alignment line to align the light emitting elements; individually separating the first sub-electrodes and the second sub-electrodes of the electrode pairs; and re-connecting the first sub-electrodes and the second sub-electrodes of the electrode pairs such that the aligned light emitting elements are electrically connected in a forward direction between the first sub-electrodes and the second sub-electrodes of the electrode pairs. The forming of the electrode pairs may include forming a double electrode pattern by successively disposing a first sub-electrode or a second sub-electrode of each of successive electrode pairs of the electrode pairs and forming the first sub-electrode or the second sub-electrodes of each of the successive electrode pairs to be integral with each other. The individually separating of the first sub-electrodes and the second sub-electrodes of the electrode pairs may include separating the double electrode pattern into respective first sub-electrodes or respective second sub-electrodes.

In a pixel in accordance with embodiments, a display device including the pixel, and a method of fabricating the display device, a light source unit may be formed efficiently using light emitting elements supplied to an emission area of each pixel, and the light emitting elements may be more uniformly arranged or disposed between electrode pairs of the light source unit. Consequently, the emission efficiency and the luminance of each pixel may be enhanced, and a failure rate may be reduced.

BRIEF DESCRIPTION OF THE DRAWINGS

The above and other aspects and features of the disclosure will become more apparent by describing in detail embodiments thereof with reference to the attached drawings, in which:

FIG. 4 is a schematic plan view illustrating a display device in accordance with an embodiment.

DETAILED DESCRIPTION OF THE EMBODIMENTS

Figure 1A:
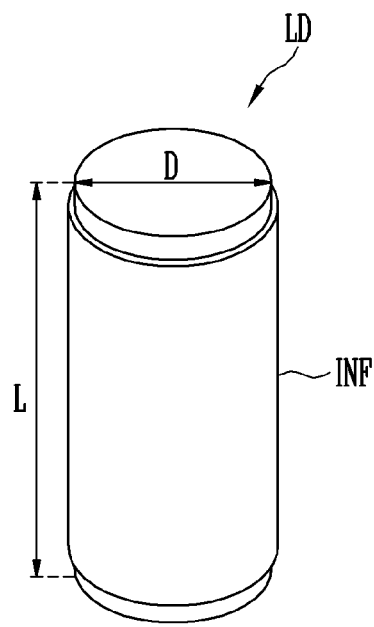
FIGS. 1A and 1B are respectively a schematic perspective view and a schematic cross-sectional view illustrating a light emitting element in accordance with an embodiment.

Reference will now be made in detail to various embodiments, examples of which are illustrated in the accompanying drawings and described below, since embodiments can be variously modified in many different forms. However, the disclosure is not limited to the following embodiments and may be modified into various forms.

Some elements which may not be directly related to the features of the disclosure in the drawings may be omitted to clearly explain the disclosure. Furthermore, the sizes, ratios, etc. of some elements in the drawings may be slightly exaggerated. It should be noted that the same reference numerals are used to denote the same or similar elements throughout the drawings, and repetitive explanation will be omitted.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. Ina case in which a third element intervenes between the first and second element, the first and second element may be understood as being indirectly opposed to one another, although still facing each other.

It will be further understood that the terms "comprise", "include", "have", and variations thereof when used in this specification, specify the presence of stated features, integers, steps, operations, elements, components, and/or combinations of them but do not preclude the presence or addition of one or more other features, integers, steps, operations, elements, components, and/or combinations thereof.

Furthermore, in case that a first component or part is disposed on a second component or part, the first component or part may be not only directly on the second component or part but a third component or other components or part or parts may also intervene between them. Furthermore, the term "position", "direction", etc. used in the following description are defined in relative terms, and it should be noted that they may be changed into a reverse position or direction depending on a view angle or direction. Furthermore, a singular form may include a plural form as well.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 1B, 2A, 2B, 3A, and 3B are schematic perspective views and schematic cross-sectional views each illustrating a light emitting element LD in accordance with an embodiment. Although FIGS. 1A to 3B illustrate substantially cylindrical rod-type light emitting elements LD, the type and/or shape of the light emitting elements LD in accordance with the disclosure is not limited thereto.

Figure 1B:
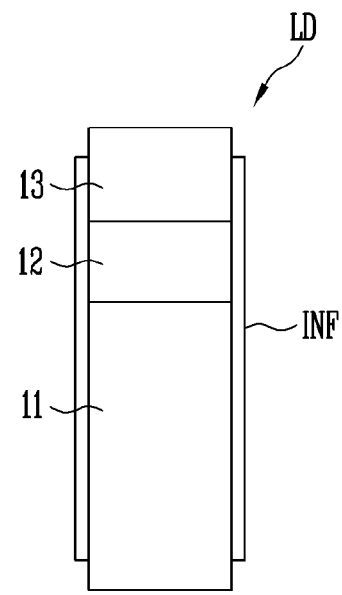

Referring to FIGS. 1A and 1B, a light emitting element LD in accordance with an embodiment may include a first conductivity type semiconductor layer 11 (also referred to as "first semiconductor layer"), a second conductivity type semiconductor layer 13 (also referred to as "second semiconductor layer"), and an active layer 12 interposed between the first and second conductivity type semiconductor layers 11 and 13. For example, the light emitting element LD may include the first conductivity type semiconductor layer 11, the active layer 12, and the second conductivity type semiconductor layer 13 which may be successively stacked each other in a longitudinal direction.

In an embodiment, the light emitting element LD may be provided in the form of a rod extending in one direction. If the direction in which the light emitting element LD extends is defined as a longitudinal direction, the light emitting element LD may have a first end and a second end with respect to the longitudinal direction.

In an embodiment, one of the first and second conductivity type semiconductor layers 11 and 13 may be disposed on the first end of the light emitting element LD. The other one of the first and second conductivity type semiconductor layers 11 and 13 may be disposed on the second end of the light emitting element LD.

In an embodiment, the light emitting element LD may be a rod-type light emitting diode fabricated in the form of a rod on a wafer substrate by an etching scheme or the like, but the disclosure is not limited thereto. In this specification, the term "rod-type" embraces a rod-like shape and a bar-like shape such as a substantially cylindrical shape and a substantially prismatic shape extending in a longitudinal direction (for example, having an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanometer scale to the micrometer scale. For example, each light emitting element LD may have a diameter D and/or a length L ranging from the nanometer scale to the micrometer scale. However, in the disclosure, the size of the light emitting element LD is not limited thereto. For example, the size of the light emitting element LD may be changed in various ways depending on design conditions of various devices, for example, a display device, which employs, as a light source, a light emitting device using a light emitting element LD.

The first conductivity type semiconductor layer 11 may include, for example, at least one N-type semiconductor layer. For instance, the first conductivity type semiconductor layer 11 may include an N-type semiconductor layer which may include any one semiconductor material of InAlGaN, GaN, AlGaN, InGaN, AlN, and InN, and is doped with a first conductive dopant such as Si, Ge, or Sn. However, the material for forming the first conductivity type semiconductor layer 11 is not limited to this, and the first conductivity type semiconductor layer 11 may be formed of various other materials.

The active layer 12 may be disposed on the first conductivity type semiconductor layer 11 and have a single or multi-quantum well (MQW) structure. In an embodiment, a cladding layer (not shown) doped with a conductive dopant may be formed over and/or under or below the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If a voltage equal to or greater than a threshold voltage is applied between the opposite ends of the light emitting element LD, the light emitting element LD may emit light by combination of electron-hole pairs in the active layer 12. Since light emission of the light emitting element LD can be controlled based on the foregoing principle, the light emitting element LD may be used as a light source of various light emitting devices as well as a pixel of the display device.

The second conductivity type semiconductor layer 13 may be disposed on the active layer 12 and include a semiconductor layer having a type different from that of the first conductivity type semiconductor layer 11. For example, the second conductivity type semiconductor layer 13 may include at least one P-type semiconductor layer. For instance, the second conductivity type semiconductor layer 13 may include a P-type semiconductor layer which may include any one semiconductor material of InAlGaN, GaN, AlGaN, InGaN, AlN, and InN, and is doped with a second conductive dopant such as Mg. However, the material for forming the second conductivity type semiconductor layer 13 is not limited to this, and the second conductivity type semiconductor layer 13 may be formed of various other materials.

In an embodiment, the light emitting element LD may further include an insulating film INF provided or disposed at the surface of the light emitting element LD. The insulating film INF may be formed at the surface of the light emitting element LD to enclose an outer circumferential surface of at least the active layer 12, and may further enclose areas of the first and second conductivity type semiconductor layers 11 and 13. Here, the insulating film INF may allow the opposite ends of the light emitting element LD that have different polarities to be exposed to the outside. For example, the insulating film INF may expose one end or an end of each of the first and second conductivity type semiconductor layers 11 and 13 that are disposed at the respective opposite ends of the light emitting element LD with respect to the longitudinal direction, for example, may expose two base sides of the cylinder (in FIGS. 1A and 1B, the top and bottom surfaces of the light emitting element LD) rather than covering or overlapping the two base sides.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but it is not limited thereto. In other words, the material that forms the insulating film INF is not limited to a particular material, and the insulating film INF may be formed of various insulating materials.

In an embodiment, the light emitting element LD may further include additional other components as well as the first conductivity type semiconductor layer 11, the active layer 12, the second conductivity type semiconductor layer 13, and/or the insulating film INF. For example, the light emitting element LD may further include one or more fluorescent layers, one or more active layers, one or more semiconductor layers, and/or one or more electrode layers disposed on one end or an end of the first conductivity type semiconductor layer 11, the active layer 12, and/or the second conductivity type semiconductor layer 13.

Figure 2A:
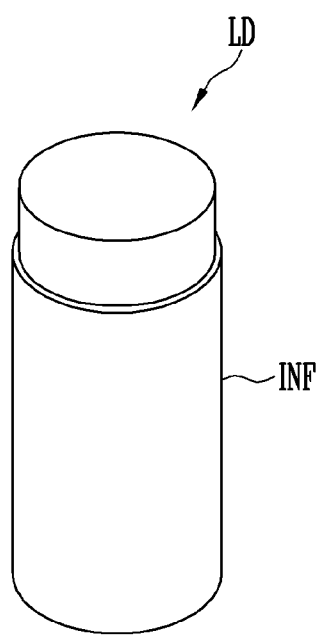
FIGS. 2A and 2B are respectively a schematic perspective view and a schematic cross-sectional view illustrating a light emitting element in accordance with an embodiment.
Figure 2B:
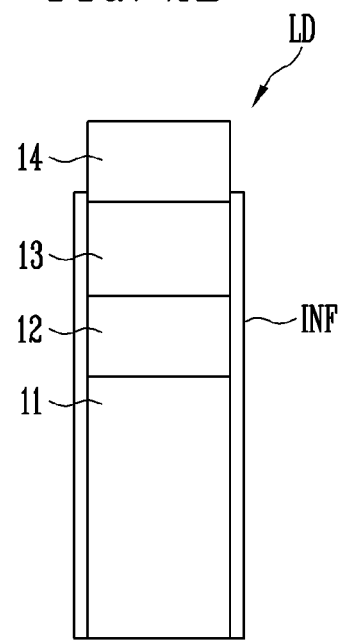
Figure 3A:
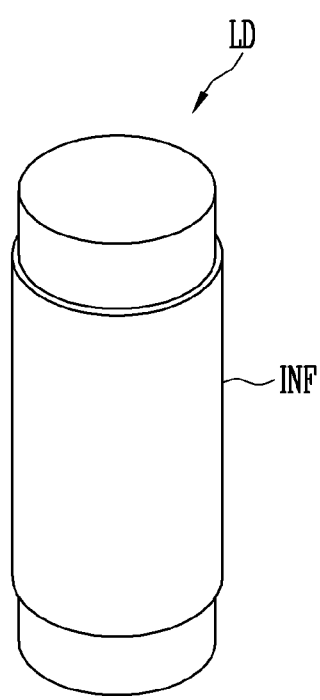
FIGS. 3A and 3B are respectively a schematic perspective view and a schematic cross-sectional view illustrating a light emitting element in accordance with an embodiment.
Figure 3B:
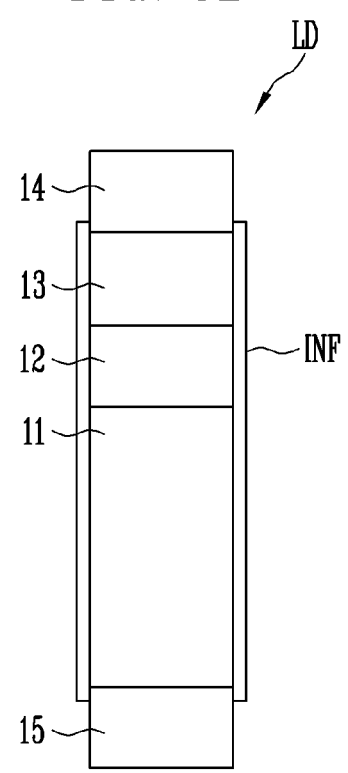

For example, as illustrated in FIGS. 2A and 2B, the light emitting element LD may further include at least one electrode layer 14 disposed on one end or an end of the second conductivity type semiconductor layer 13. In an embodiment, as illustrated in FIGS. 3A and 3B, the light emitting element LD may further include at least one electrode layer 15 disposed on one end or an end of the first conductivity type semiconductor layer 11.

Each of the electrode layers 14 and 15 may be an ohmic contact electrode, but it is not limited thereto. Each of the electrode layers 14 and 15 may include metal or metal oxide. For example, each of the electrode layers 14 and 15 may be formed of chromium (Cr), titanium (Ti), aluminum (Al), gold (Au), nickel (Ni), oxides or alloys thereof, and/or transparent electrode materials such as indium tin oxide (ITO), indium zinc oxide (IZO), zinc oxide (ZnO), or indium tin zinc oxide (ITZO) alone or in combination. In an embodiment, the electrode layers 14 and 15 may be substantially transparent or translucent. Thereby, light generated from the light emitting element LD may be emitted to the outside after passing through the electrode layers 14 and 15.

In an embodiment, the insulating film INF may at least partially enclose the outer circumferential surfaces of the electrode layers 14 and 15, or may not enclose the outer circumferential surfaces. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. As an example, in an embodiment, the insulating film INF may not be provided.

In case that the insulating film INF is provided or disposed at the surface of the light emitting element LD, for example, on the surface or a surface of the active layer 12, the active layer 12 may be prevented from short-circuiting with at least one electrode which is not shown (for example, at least one contact electrode of contact electrodes connected to the opposite ends of the light emitting element LD), etc., within the spirit and the scope of the disclosure. Consequently, the electrical stability of the light emitting element LD may be secured. In the description of each embodiment of the disclosure, the term "connecting (or connection)" may comprehensively refer to physical and/or electrical connecting (or connection). Furthermore, the term "connecting (or connection)" may comprehensively refer to direct and/or indirect connecting (or connection) and integral or non-integral connecting (or connection).

Furthermore, by forming the insulating film INF at the surface of the light emitting element LD, occurrence of a defect on the surface of the light emitting element LD may be minimized, whereby the lifetime and efficiency of the light emitting element LD may be improved. In case that the insulating film INF is formed at the surface of each light emitting element LD, even in case that light emitting elements LD are disposed adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that light emitting elements LD are mixed with a fluidic solution (or solvent) and supplied to each emission area (for example, an emission area of each pixel), the light emitting elements LD can be evenly dispersed rather than unevenly aggregating in the solution.

In an unlimited embodiment pertaining to this, the insulating film INF itself may be formed of a hydrophobic film using hydrophobic material, or an additional hydrophobic film formed of the hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). The hydrophobic material may include octadecyl trichlorosilane, fluoroalkyl trichlorosilane, perfluoroalkyl triethoxysilane, etc., within the spirit and the scope of the disclosure. Furthermore, the hydrophobic material may be a commercially available fluorine containing material such as Teflon™ or Cytop™, or a corresponding material.

A light emitting device including the light emitting element LD described above may be used not only in a display device but also in various devices which requires a light source. For instance, at least one subminiature light emitting element LD, for example, subminiature light emitting elements LD each having a size ranging from the nanometer scale to the micrometer scale, may be disposed in each pixel of the display panel to form a light source (or, a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

FIG. 4 is a schematic plan view illustrating a display device in accordance with an embodiment. In an embodiment, FIG. 4 illustrates a display device, for example, a display panel PNL provided in the display device, as an example of a device which may use, as a light source, the light emitting element LD described with reference to FIGS. 1A to 3B. For example, each of the pixels PXL of the display panel PNL may have at least one light emitting element LD.

For the sake of explanation, FIG. 4 simply illustrates the structure of the display panel PNL in accordance with an embodiment, focused on a display area DA. In an embodiment, although not illustrated, at least one driving circuit (for example, at least one of a scan driver and a data driver) and/or lines may be further provided in the display panel PNL.

Referring to FIG. 4, the display panel PNL in accordance with an embodiment may include abase layer BSL, and pixels PXL disposed on the base layer BSL. In detail, the display panel PNL and the base layer BSL for forming the display panel PNL may include a display area DA for displaying an image, and a non-display area NDA formed in an area other than the display area DA. The pixels PXL may be disposed in the display area DA on the base layer BSL.

In an embodiment, the display area DA may be disposed in a central area of the display panel PNL, and the non-display area NDA may be disposed in a peripheral area of the display panel PNL in such away as to enclose the display area DA. The locations of the display area DA and the non-display area NDA are not limited to this, and the locations thereof may be changed. The display area DA may form a screen in which an image is displayed.

The base layer BSL may form abase of the display panel PNL. In an embodiment, the base layer BSL may be a rigid or flexible substrate or film, and the material or properties thereof are not particularly limited. For example, the base layer BSL may be a rigid substrate made of glass or reinforced glass, a flexible substrate (or a thin film) formed of plastic or metal, or at least one insulating layer, and the material and/or properties thereof are not particularly limited.

Furthermore, the base layer BSL may be transparent, but the disclosure is not limited thereto. For instance, the base layer BSL may be a transparent, translucent, opaque, or reflective base.

An area of the base layer BSL may be defined as the display area DA in which the pixels PXL are disposed, and the other area thereof may be defined as the non-display area NDA. For example, the base layer BSL may include the display area DA including pixel areas in which the respective pixels PXL are formed, and the non-display area NDA disposed around the display area DA. Various lines and/or internal circuits which are connected to the pixels PXL of the display area DA may be disposed in the non-display area NDA.

In an embodiment, the pixels PXL may be disposed in each pixel area of the display area DA. In an embodiment, the pixels PXL may be arranged or disposed in the display area DA in a stripe or PenTile® arrangement manner, but the disclosure is not limited thereto. For example, the pixels PXL may be arranged or disposed in the display area DA in various arrangement manners.

Each pixel PXL may include at least one light source which is driven by a control signal (for example, a scan signal and a data signal) and/or a power supply (for example, a first power supply and a second power supply). For example, each of the pixels PXL may include a light emitting element LD in accordance with any one of embodiments of FIGS. 1A to 3B, for example, at least one subminiature rod-type light emitting element LD having a small size corresponding to the nanometer scale or the micrometer scale. However, in embodiments, the type of the light emitting element LD which may be used as a light source of the pixel PXL is not limited thereto. For example, in an embodiment, each pixel PXL may include a light emitting element that has a core-shell structure and is fabricated by a growth method. In an embodiment, the light emitting element having the core-shell structure may be a subminiature core-shell light emitting element having a small size corresponding to the nanometer scale to the micrometer scale, but the size of the light emitting element having the core-shell structure is not limited thereto.

In an embodiment, each pixel PXL may be formed of an active pixel. However, the types, structures, and/or driving schemes of the pixels PXL capable of being applied to the display device according to the disclosure are not particularly limited. For example, each pixel PXL may be formed of a pixel for passive or active display devices which have various structures and/or may be operated in various driving schemes.

FIGS. 5A to 5G are schematic diagrams of an equivalent circuit each illustrating a pixel PXL in accordance with an embodiment. For example, FIGS. 5A to 5G illustrate different embodiments of the pixel PXL which can be applied to an active display device. However, the types of pixels PXL and display devices to which embodiments may be applied are not limited thereto. In an embodiment, each pixel PXL illustrated in FIGS. 5A to 5G may be any one of the pixels PXL provided in the display panel PNL of FIG. 4. The pixels PXL may have substantially the same or similar structure.

Figure 5A:
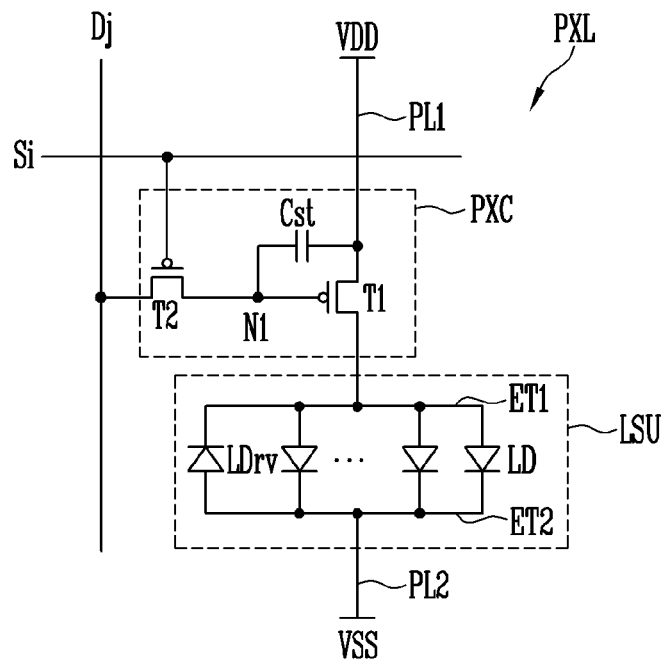
FIGS. 5A to 5G are schematic diagrams of an equivalent circuit each illustrating a pixel in accordance with an embodiment.

Referring to FIG. 5A, the pixel PXL in accordance with an embodiment may include a light source unit LSU that generates light having a luminance corresponding to a data signal. The pixel PXL may selectively further include a pixel circuit PXC that drives the light source unit LSU.

In an embodiment, the light source unit LSU may include light emitting elements LD, and a first electrode ET1 and a second electrode ET2 which electrically connect the light emitting elements LD between a first power supply VDD (or first power source) and a second power supply VSS (or second power source). For example, the light source unit LSU may include a first electrode ET1 connected to the first power supply VDD, a second electrode ET2 connected to the second power supply VSS, and light emitting elements LD connected in parallel to each other in an identical direction between the first and second electrodes ET1 and ET2. In an embodiment, the first electrode ET1 may be an anode electrode, and the second electrode ET2 may be a cathode electrode.

In an embodiment, each of the light emitting elements LD may include a P-type end connected to the first power supply VDD through at least the first electrode ET1, and an N-type end connected to the second power supply VSS through at least the second electrode ET2. In an embodiment, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between voltages of the first and second power supplies VDD and VSS may be set to a threshold voltage of the light emitting elements LD or more during at least an emission period of the pixel PXL.

In other words, the light emitting elements LD may be connected in parallel between the first and second power supplies VDD and VSS in a forward direction through the first and second electrodes ET1 and ET2. As such, each of the light emitting elements LD connected in a forward direction between the first and second power supplies VDD and VSS may form a valid light source. A group of valid light sources may form the light source unit LSU of the pixel PXL.

In an embodiment, each pixel PXL may further include a pixel circuit PXC electrically connected between the first or second power supply VDD or VSS and the light source unit LSU. For example, the first ends (for example, the P-type ends) of the light emitting elements LD that form each light source unit LSU may be connected in common to the pixel circuit PXC through the first electrode ET1 (also referred to as "first pixel electrode") of the light source unit LSU, and be electrically connected to the first power supply VDD through the pixel circuit PXC and the first power line PL1. The second ends (for example, the N-type ends) of the light emitting elements LD may be connected in common to the second electrode ET2 (also referred to as "second pixel electrode") of the light source unit LSU and be electrically connected to the second power supply VSS through the second electrode ET2 of the light source unit LSU and the second power line PL2.

The light emitting elements LD may emit light having a luminance corresponding to driving current supplied thereto through the corresponding pixel circuit PXC. For example, during each frame period, the pixel circuit PXC may supply, to the light source unit LSU, driving current corresponding to a gray scale value of data of the corresponding frame. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

In an embodiment, the light source unit LSU may further include at least one invalid light source, as well as including the light emitting elements LD that form each valid light source. For example, at least one reverse light emitting element LDrv may be further connected between the first and second electrodes ET1 and ET2 of the light source unit LSU.

Each reverse light emitting element LDrv, along with the light emitting elements LD that form the valid light sources, may be connected in parallel to each other between the first and second electrodes ET1 and ET2, and may be connected between the first and second electrodes ET1 and ET2 in a direction opposite to that of the light emitting elements LD. For example, the N-type end of the reverse light emitting element LDrv may be connected to the first power supply VDD via the first electrode ET1. The P-type end of the reverse light emitting element LDrv may be connected to the second power supply VSS via the second electrode ET2. Even in case that a driving voltage (for example, a forward directional driving voltage) is applied between the first and second electrodes ET1 and ET2, the reverse light emitting element LDrv remains deactivated. Hence, current substantially does not flow through the reverse light emitting element LDrv.

In an embodiment, at the step of aligning the light emitting elements LD between the first and second electrode ET1 and ET2 to form each light source unit LSU, the light emitting elements LD supplied to each pixel area (for example, the emission area of each pixel PXL) may be controlled to be aligned and biased in any one direction (for example, the forward direction) by adjusting alignment signals (or alignment voltages) to be applied to the first and second electrodes ET1 and ET2 or forming a magnetic field. For example, the light emitting elements LD may be aligned to be biased such that the number of light emitting elements LD connected in the forward direction between the first and second electrodes ET1 and ET2 of each pixel PXL is increased by controlling alignment signals (or alignment voltages) to be applied to the first and second electrodes ET1 and ET2 or forming a magnetic field. All of the light emitting elements LD may be connected in the forward direction between the first and second electrodes ET1 and ET2, or the number of light emitting elements LD connected in the forward direction between the first and second electrodes ET1 and ET2 may be greater than the number of at least one reverse light emitting elements LDrv. For example, approximately 70% (for example, 80% or more) of the light emitting elements connected between the first and second electrodes ET1 and ET2 (for example, the light emitting elements LD and LDrv connected in the forward direction and/or the reverse direction) may be light emitting elements LD connected in the forward direction.

The pixel circuit PXC may be connected to a scan line Si and a data line Dj of the corresponding pixel PXL. For example, if the pixel PXL is disposed at an i-th row (i is a natural number) and a j-th column (j is a natural number) of the display area DA, the pixel circuit PXC of the pixel PXL may be connected to an i-th scan line Si and a j-th data line Dj of the display area DA. In an embodiment, the pixel circuit PXC may include first and second transistors T1 and T2, and a storage capacitor Cst.

The first transistor T1 (also referred to as "driving transistor") may be connected between the first power supply VDD and the light source unit LSU. A gate electrode of the first transistor T1 may be connected to a first node N1. The first transistor T1 may control driving current to be supplied to the light source unit LSU in response to the voltage of the first node N1.

The second transistor T2 (also referred to as "switching transistor") may be connected between the data line Dj and the first node N1. A gate electrode of the second transistor T2 may be connected to the scan line Si. In case that a scan signal having a gate-on voltage (for example, a low-level voltage) is supplied from the scan line Si, the second transistor T2 is turned on to electrically connect the first node N1 to the data line Dj.

During each frame period, a data signal of a corresponding frame is supplied to the data line Dj. The data signal is transmitted to the first node N1 via the second transistor T2. Thereby, a voltage corresponding to the data signal is charged to the storage capacitor Cst.

One electrode of the storage capacitor Cst may be connected to the first power supply VDD, and the other electrode thereof may be connected to the first node N1. The storage capacitor Cst may charge a voltage corresponding to a data signal to be supplied to the first node N1 during each frame period.

Although in FIG. 5A the transistors, for example, the first and second transistors T1 and T2, included in the pixel circuit PXC have been illustrated as being formed of P-type transistors, the disclosure is not limited to this. In other words, at least one of the first and second transistors T1 and T2 may be changed to an N-type transistor.

Figure 5B:
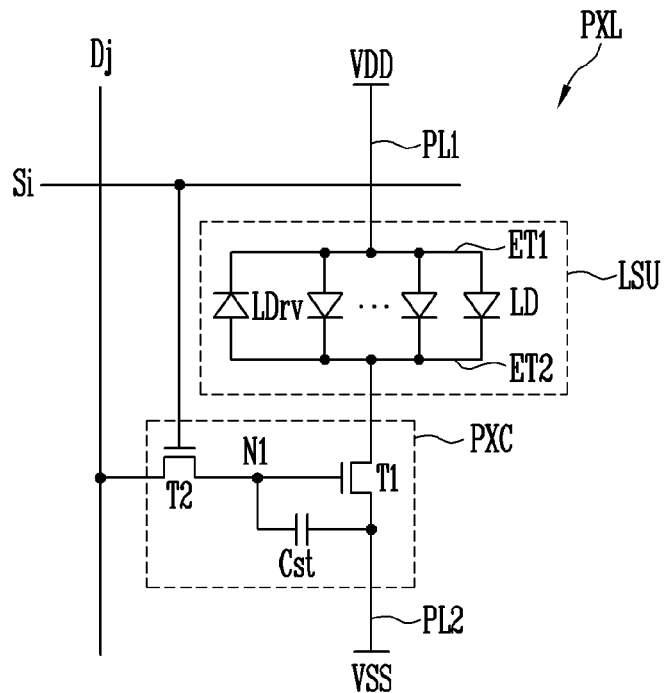

For example, as shown in FIG. 5B, both the first and second transistors T1 and T2 may be formed of N-type transistors. The gate-on voltage of the scan signal for writing the data signal supplied to the data line Dj in each frame period to the pixel PXL may be a high level voltage. Likewise, the voltage of the data signal for turning on the first transistor T1 may be a voltage having a level opposite to that of an embodiment of FIG. 5A. For example, in an embodiment of FIG. 5B, as a gray scale value that is to be expressed increases, a data signal having a higher voltage may be supplied.

The pixel PXL shown in FIG. 5B is substantially similar in configuration and operation to the pixel PXL of FIG. 5A, except that the connection positions of some or a part of circuit elements and the voltage levels of control signals (for example, a scan signal and a data signal) are changed depending on a change in type of the transistor. Therefore, detailed description of the pixel PXL of FIG. 5B will be omitted.

The structure of the pixel circuit PXC is not limited to embodiments shown in FIGS. 5A and 5B. In other words, the pixel circuit PXC may be formed of a pixel circuit which may have various structures and/or be operated by various driving schemes. For example, the pixel circuit PXC may be formed in the same manner as that of an embodiment illustrated in FIG. 5C.

Figure 5C:
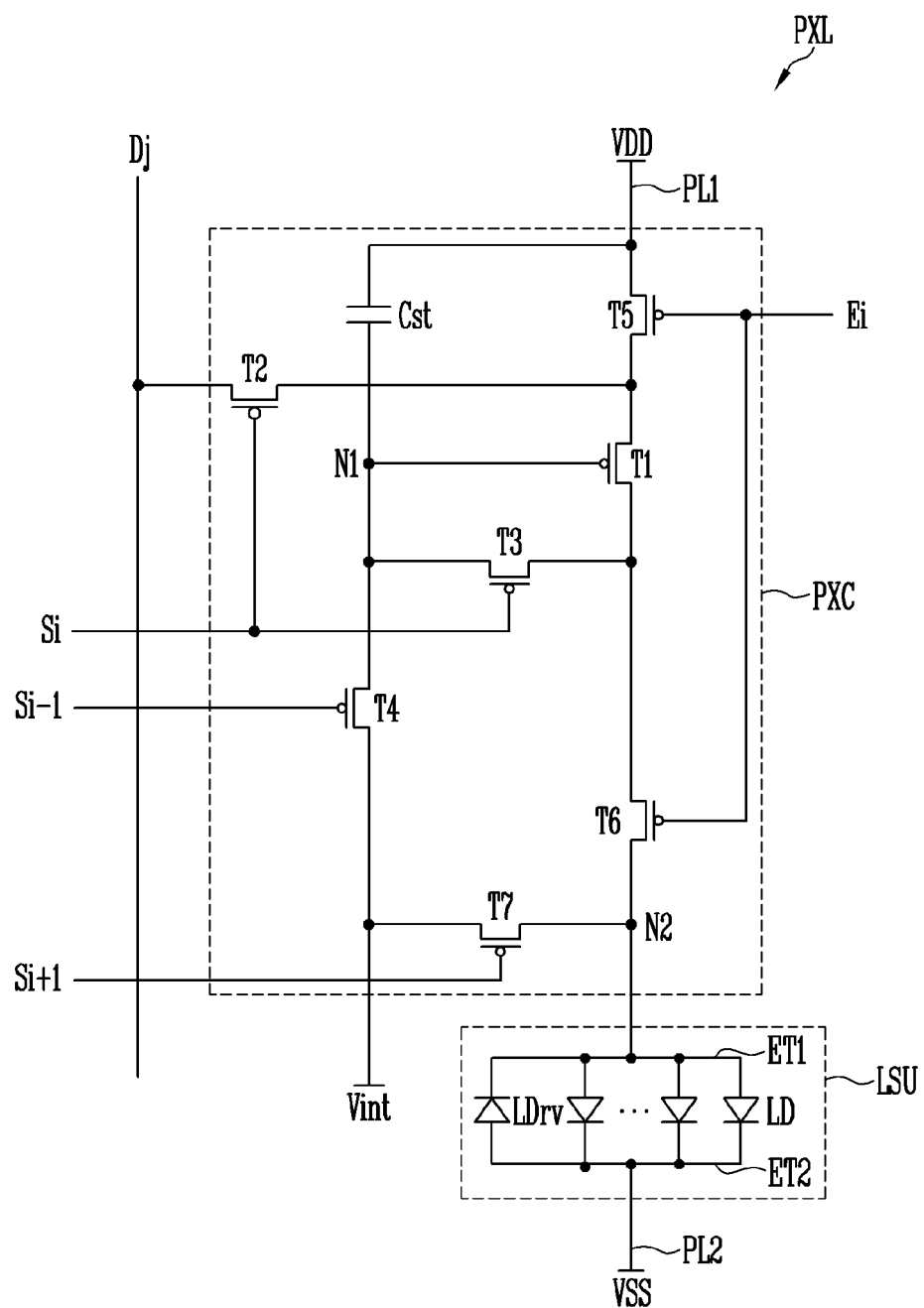

Referring to FIG. 5C, the pixel circuit PXC may be connected not only to a scan line Si of a corresponding horizontal line but also to at least one another scan line (or a control line). For example, the pixel circuit PXC of the pixel PXL disposed at the i-th row of the display area DA may be further connected to an i−1-th scan line Si−1 and/or an i+i-th scan line Si+1. In an embodiment, the pixel circuit PXC may be connected not only to the first and second power supplies VDD and VSS but also to another power supply (or another power source). For instance, the pixel circuit PXC may also be connected to an initialization power supply Vint (or initialization power source). In an embodiment, the pixel circuit PXC may include first to seventh transistors T1 to T7 and a storage capacitor Cst.

The first transistor T1 may be connected between the first power supply VDD and the light source unit LSU. For example, a first electrode (for example, a source electrode) of the first transistor T1 may be connected to the first power supply VDD through the fifth transistor T5 and the first power line PL1, and a second electrode (for example, a drain electrode) of the first transistor T1 may be connected via the sixth transistor T6 to the first electrode of the light source unit LSU (for example, the first pixel electrode and/or the first contact electrode of the corresponding pixel PXL). A gate electrode of the first transistor T1 may be connected to a first node N1. The first transistor T1 may control driving current to be supplied to the light source unit LSU in response to the voltage of the first node N1.

The second transistor T2 may be connected between the data line Dj and the first electrode of the first transistor T1. A gate electrode of the second transistor T2 may be connected to the corresponding scan line Si. In case that a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be connected between the second electrode of the first transistor T1 and the first node N1. A gate electrode of the third transistor T3 may be connected to the corresponding scan line Si. In case that a scan signal having a gate-on voltage is supplied from the scan line Si, the third transistor T3 may be turned on to connect the first transistor T1 in the form of a diode.

The fourth transistor T4 may be connected between the first node N1 and the initialization power supply Vint. A gate electrode of the fourth transistor T4 may be connected to a preceding scan line, for example, an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. In an embodiment, in case that the first transistor T1 is a P-type transistor, the voltage of the initialization power supply Vint for initializing the gate voltage of the first transistor T1 may be the lowest voltage of the data signal or less.

The fifth transistor T5 may be connected between the first power supply VDD and the first transistor T1. A gate electrode of the fifth transistor T5 may be connected to a corresponding emission control line, for example, an i-th emission control line Ei. The fifth transistor T5 may be turned off in case that an emission control signal having a gate-off voltage (for example, a high level voltage) is supplied to the emission control line Ei, and may be turned on in other cases.

The sixth transistor T6 may be connected between the first transistor T1 and the light source unit LSU. A gate electrode of the sixth transistor T6 may be connected to a corresponding emission control line, for example, the i-th emission control line Ei. The sixth transistor T6 may be turned off in case that an emission control signal having a gate-off voltage is supplied to the emission control line Ei, and may be turned on in other cases.

The seventh transistor T7 may be connected between a second node N2 to which the sixth transistor T6 and the first electrode of the light source unit LSU (for example, the first pixel electrode ET1 of the corresponding pixel PXL) are connected and the initialization power supply Vint. A gate electrode of the seventh transistor T7 may be connected to any one of scan lines of a subsequent stage (a subsequent horizontal pixel column), for example, to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU. During each initialization period in which the voltage of the initialization power supply Vint is transmitted to the light source unit LSU, the voltage of the first electrode of the light source unit LSU may be initialized. The control signal for controlling the operation of the seventh transistor T7 may be changed in various ways. For example, in an embodiment, the gate electrode of the seventh transistor T7 may be connected to a scan line of a corresponding horizontal line, for example, an i-th scan line Si. In case that a scan signal having a gate-on voltage may be supplied to the i-th scan line Si, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding both to the data signal applied to the first node N1 during each frame period and to the threshold voltage of the first transistor T1.

Although in FIG. 5C the transistors, for example, the first to seventh transistors T1 to T7, included in the pixel circuit PXC have been illustrated as being formed of P-type transistors, the disclosure is not limited thereto. For example, at least one of the first to seventh transistors T1 to T7 may be changed to an N-type transistor.

Although FIGS. 5A to 5C illustrate embodiments in which all valid light sources, for example, light emitting elements LD, constituting each light source unit LSU are connected in parallel to each other, the disclosure is not limited thereto. For example, in an embodiment, as illustrated in FIGS. 5D to 5G, the light source unit LSU of each pixel PXL may include serial stages which are successively connected to each other. In the following descriptions of embodiments of FIGS. 5D to 5G, detailed explanations of components (for example, the pixel circuit PXC) similar or equal to that of embodiments of FIGS. 5A to 5C will be omitted.

Figure 5D:
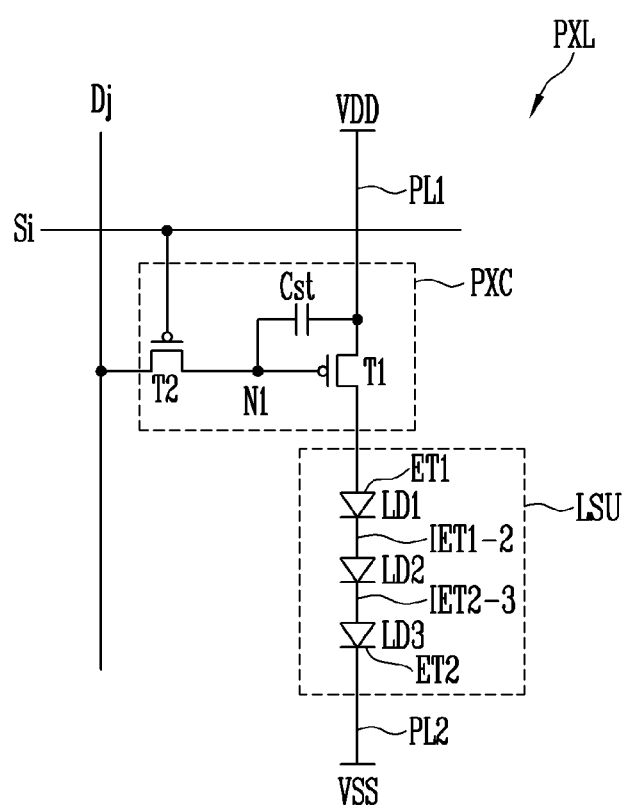

Referring to FIG. 5D, the light source unit LSU may include light emitting elements connected in series to each other. For example, the light source unit LSU may include first, second, and third light emitting elements LD1, LD2, and LD3 which are connected in series in a forward direction between the first power supply VDD and the second power supply VSS and constitute each valid light source. Hereinafter, in case that a specific or given light emitting element among the first, second, and third light emitting elements LD1, LD2, and LD3 is designated, the corresponding light emitting element will be referred to as a first light emitting element LD1, a second light emitting element LD2, or a third light emitting element LD3. The term "light emitting element LD" or "light emitting elements LD" will be used to arbitrarily designate at least one light emitting element of the first, second, and the third light emitting elements LD1, LD2, and LD3 or collectively designate the first, second, and third light emitting elements LD1, LD2, and LD3.

A P-type end of the first light emitting element LD1 may be connected to the first power supply VDD through the first electrode ET1 of the light source unit LSU, etc., within the spirit and the scope of the disclosure. An N-type end of the first light emitting element LD1 may be connected to a P-type end of the second light emitting element LD2 through a 1-2-th intermediate electrode IET1-2 connected between first and second serial stages. The P-type end of the second light emitting element LD2 may be connected to the N-type end of the first light emitting element LD1. An N-type end of the second light emitting element LD2 may be connected to a P-type end of the third light emitting element LD3 through a 2-3-th intermediate electrode IET2-3 connected between the second and third serial stages. The P-type end of the third light emitting element LD3 may be connected to the N-type end of the second light emitting element LD2. An N-type end of the third light emitting element LD3 may be connected to the second power supply VSS through the second electrode ET2 of the light source unit LSU and the second power line PL2. In this way, the first, second, and the third light emitting elements LD1, LD2, and LD3 may be connected in series between the first and second electrodes ET1 and ET2 of the light source unit LSU.

Although FIG. 5D illustrates an embodiment where the light emitting elements LD are connected to have a three-stage serial structure, the disclosure is not limited thereto. For example, in an embodiment, two light emitting elements LD may be connected to have a two-stage serial structure, or four or more light emitting elements LD may be connected to have a four- or more-stage serial structure.

In case that it is assumed that the same luminance is expressed using light emitting elements LD having the same conditions (for example, substantially the same size and/or number), in a light source unit LSU having a structure in which light emitting elements LD are connected in series, the voltage to be applied between the first and second electrodes ET1 and ET2 may be increased, and the amount of driving current flowing to the light source unit LSU may be reduced, compared to a light source unit LSU having a structure in which light emitting elements LD are connected in parallel. Therefore, in the case where the light source unit LSU of each pixel PXL is formed of a serial structure, panel current flowing through the display panel PNL may be reduced as the display device is driven. Hence, power consumption may be reduced.

Figure 5E:
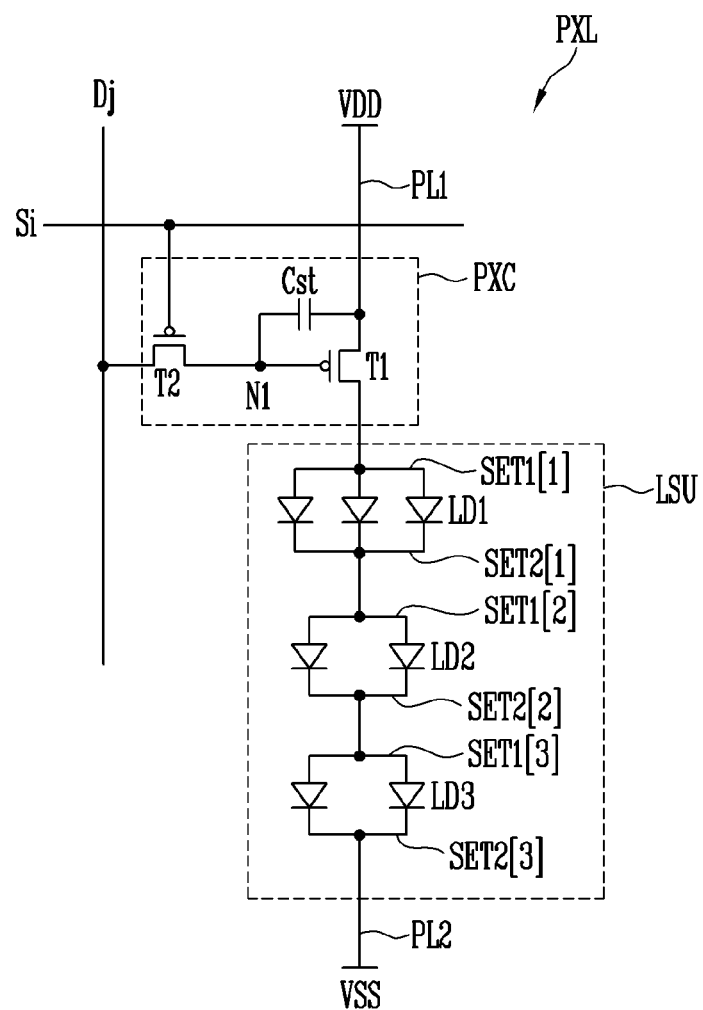
Figure 5F:
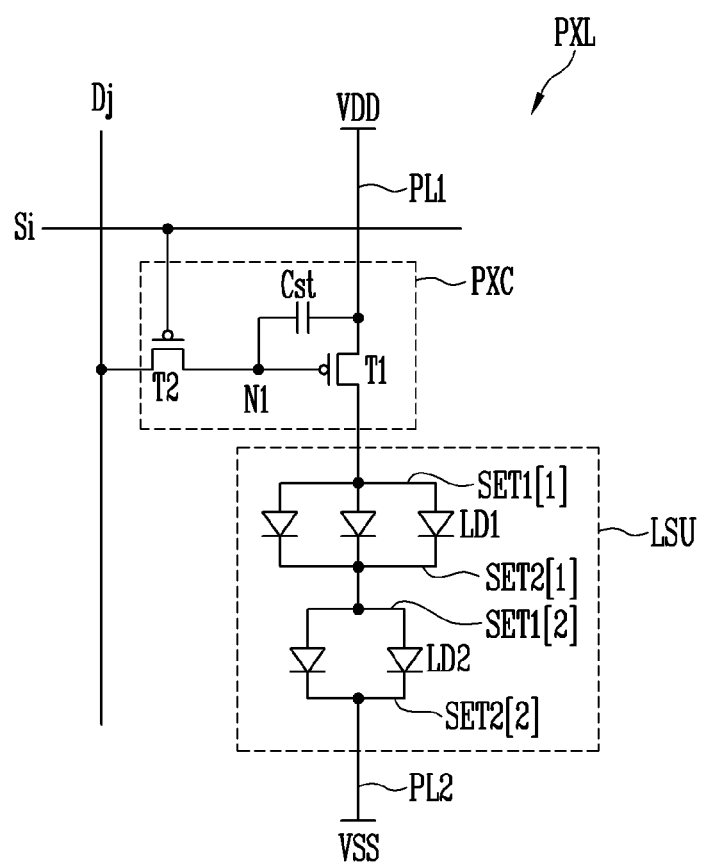
Figure 5G:
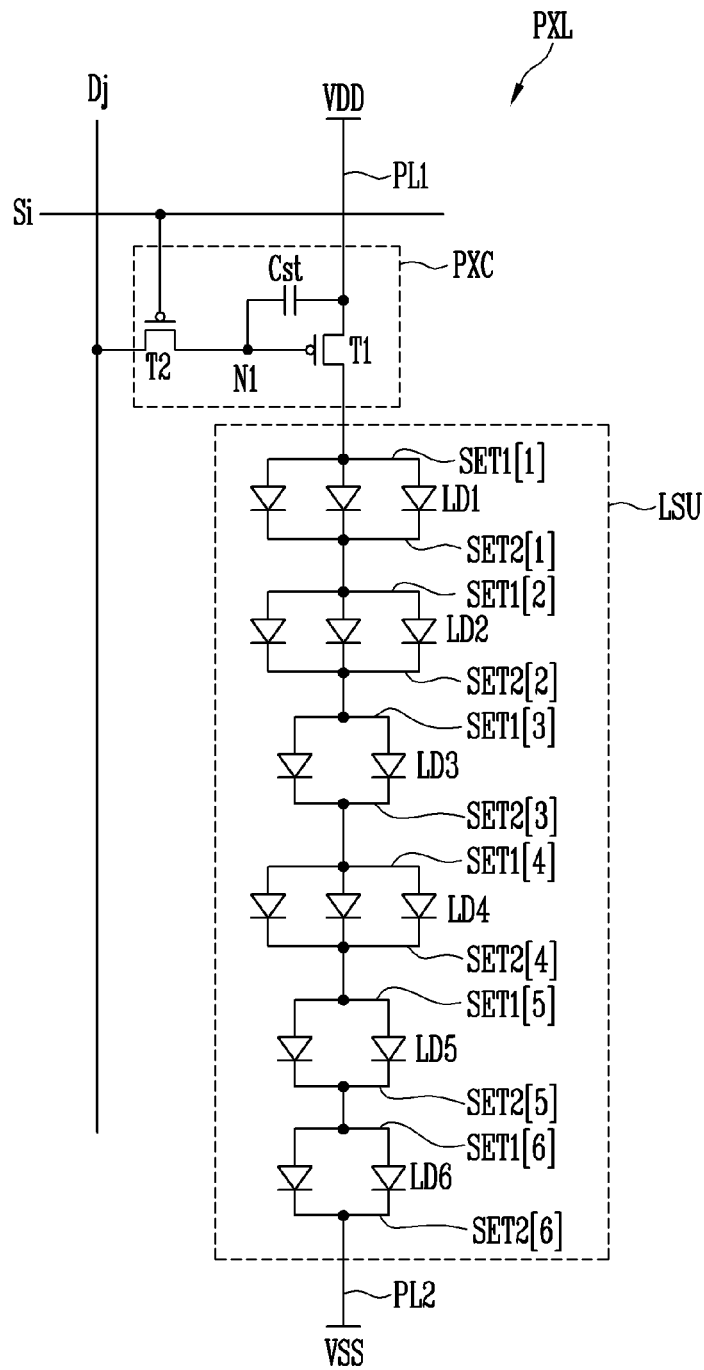

In an embodiment, at least one serial stage may include light emitting elements LD connected in parallel to each other. The light source unit LSU may be formed of a serial/parallel combination structure (or series-parallel combination structure). For example, the light source unit LSU may be as illustrated in FIGS. 5E to 5G. Although, in FIGS. 5E to 5G, there is illustrated only the light emitting elements LD connected between the first and second power supplies VDD and VSS in the forward direction to form valid light sources of the light source unit LSU, the disclosure is not limited thereto. For example, in an embodiment, each pixel PXL illustrated in FIG. 5E to 5G may further include one or more reverse light emitting element LDrv described in the foregoing embodiments. However, in the case where the light emitting elements LD are arranged or disposed in a biased arrangement manner, even in case that at least one reverse light emitting element LDrv is disposed in the pixel PXL, the number of reverse light emitting elements LDrv may be less than the number of valid light sources, for example, light emitting elements LD, disposed in the pixel PXL in the forward direction. Hereinafter, a structure of the light source unit LSU in accordance with an embodiment of FIGS. 5E to 5G will be described, focused on light emitting elements LD that form the valid light sources of the light source unit LSU.

Referring to FIGS. 5E to 5G, the light source unit LSU may include serial stages successively connected between the first and second power supplies VDD and VSS. Each of the serial stages may include one or more light emitting elements LD which are connected in the forward direction between first and second sub-electrodes that form an electrode pair of the corresponding serial stage.

For example, referring to FIG. 5E, the light source unit LSU may include first to third serial stages successively connected between the first and second power supplies VDD and VSS. Each of the first to third serial stages may include first and second sub-electrodes SET1[1] and SET2[1], SET1[2] and SET2[2], or SET1[3] and SET2[3], and one or more light emitting elements LD connected in the forward between the first and second sub-electrodes SET1[1] and SET2[1], SET1[2] and SET2[2], or SET1[3] and SET2[3].

In an embodiment, a first sub-electrode of a first electrode pair (for example, the first sub-electrode SET1[1] of the first serial stage) may be an anode electrode of the light source unit LSU. A second sub-electrode of a last electrode pair (for example, the second sub-electrode SET2[3] of the third serial stage) may be a cathode electrode of the light source unit LSU.

In an embodiment, the first serial stage (also referred to as "first stage") may include a pair of first and second sub-electrodes SET1[1] and SET2[1], and one or more first light emitting elements LD1 electrically connected between the pair of first and second sub-electrodes SET1[1] and SET2[1]. For example, the first serial stage may include a first sub-electrode SET1[1] connected to the first power supply VDD via the pixel circuit PXC, a second sub-electrode SET2[1] which forms, along with the first sub-electrode SET1[1], an electrode pair of the first serial stage and may be connected to the second power supply VSS, and first light emitting elements LD1 which are electrically connected between the first and second sub-electrodes SET1[1] and SET2[1]. In an embodiment, a P-type end of each of the first light emitting elements LD1 may be electrically connected to the first sub-electrode SET1[1] of the first serial stage, and an N-type end of each of the first light emitting elements LD1 may be electrically connected to the second sub-electrode SET2[1] of the first serial stage. In other words, the first light emitting elements LD1 may be connected in parallel between the first and second sub-electrodes SET1[1] and SET2[1] of the first serial stage, and be connected in the forward direction between the first and second power supplies VDD and VSS through the first and second sub-electrodes SET1[1] and SET2[1].

In an embodiment, the second serial stage (also referred to as "second stage") may include a pair of first and second sub-electrodes SET1[2] and SET2[2], and one or more second light emitting elements LD2 electrically connected between the pair of first and second sub-electrodes SET1[2] and SET2[2]. For example, the second serial stage may include a first sub-electrode SET1[2] connected to the first power supply VDD via the first serial stage and the pixel circuit PXC, a second sub-electrode SET2[2] which forms, along with the first sub-electrode SET1[2], an electrode pair of the second serial stage and may be connected to the second power supply VSS, and second light emitting elements LD2 which are electrically connected between the first and second sub-electrodes SET1[2] and SET2[2]. In an embodiment, a P-type end of each of the second light emitting elements LD2 may be electrically connected to the first sub-electrode SET1[2] of the second serial stage, and an N-type end of each of the second light emitting elements LD2 may be electrically connected to the second sub-electrode SET2[2] of the second serial stage. In other words, the second light emitting elements LD2 may be connected in parallel between the first and second sub-electrodes SET1[2] and SET2[2] of the second serial stage, and be connected in the forward direction between the first and second power supplies VDD and VSS through the first and second sub-electrodes SET1[2] and SET2[2].

In an embodiment, the second sub-electrode SET2[1] of the first serial stage and the first sub-electrode SET1[2] of the second serial stage may be integrally or non-integrally connected to each other. The second sub-electrode SET2[1] of the first serial stage and the first sub-electrode SET1[2] of the second serial stage may form an intermediate electrode that connects the first and second serial stages to each other. In an embodiment, in the case where the second sub-electrode SET2[1] of the first serial stage and the first sub-electrode SET1[2] of the second serial stage are integrally connected to each other, they may be regarded as being different areas of one intermediate electrode rather than being separate sub-electrodes.

In an embodiment, the third serial stage (also referred to as "third stage") may include a pair of first and second sub-electrodes SET1[3] and SET2[3], and one or more third light emitting elements LD3 electrically connected between the pair of first and second sub-electrodes SET1[3] and SET2[3]. For example, the third serial stage may include a first sub-electrode SET1[3] connected to the first power supply VDD via the preceding serial stages (for example, the first and second serial stages) and the pixel circuit PXC, a second sub-electrode SET2[3] which forms, along with the first sub-electrode SET1[3], an electrode pair of the third serial stage and may be connected to the second power supply VSS, and third light emitting elements LD3 which are electrically connected between the first and second sub-electrodes SET1[3] and SET2[3]. In an embodiment, a P-type end of each of the third light emitting elements LD3 may be electrically connected to the first sub-electrode SET1[3] of the third serial stage, and an N-type end of each of the third light emitting elements LD3 may be electrically connected to the second sub-electrode SET2[3] of the third serial stage. In other words, the third light emitting elements LD3 may be connected in parallel between the first and second sub-electrodes SET1[3] and SET2[3] of the third serial stage, and be connected in the forward direction between the first and second power supplies VDD and VSS through the first and second sub-electrodes SET1[3] and SET2[3]. Furthermore, the respective numbers of first, second, and third light emitting elements LD1, LD2, and LD3 disposed in the first, second, and third serial stages may be identical with or different from each other. The numbers of first, second, and third light emitting elements LD1, LD2, and LD3 are not limited thereto.

In an embodiment, the second sub-electrode SET2[2] of the second serial stage and the first sub-electrode SET1[3] of the third serial stage may be integrally or non-integrally connected to each other. The second sub-electrode SET2[2] of the second serial stage and the first sub-electrode SET1[3] of the third serial stage may form an intermediate electrode that connects the second and third serial stages to each other. In an embodiment, in the case where the second sub-electrode SET2[2] of the second serial stage and the first sub-electrode SET1[3] of the third serial stage are integrally connected to each other, they may be regarded as being different areas of one intermediate electrode rather than being separate sub-electrodes.

The first and second sub-electrodes SET1[1] to SET1[3] and SET2[1] to SET2[3] disposed in each serial stage may form electrode pairs dispersed in each light source unit LSU. Hereinafter, the term "first sub-electrode SET1" (also referred to as "first electrode") or "first sub-electrodes SET1" will be used to arbitrarily designate at least one first sub-electrode among the first sub-electrodes SET1[1] to SET1[3] (also referred to as "first electrodes") disposed in each serial stage, or collectively designate the first sub-electrodes SET1[1] to SET1[3] disposed in each serial stage. Likewise, the term "second sub-electrode SET2" (also referred to as "second electrode") or "second sub-electrodes SET2" will be used to arbitrarily designate at least one second sub-electrode among the second sub-electrodes SET2[1] to SET2[3] (also referred to as "second electrodes") disposed in each serial stage, or collectively designate the second sub-electrodes SET2[1] to SET2[3] disposed in each serial stage.

As such, in the case where the light source unit LSU of each pixel PXL is formed by connecting light emitting elements LD in a serial/parallel combination structure, driving current/voltage conditions may be readily controlled to correspond to specifications of a desired product. For example, in case that it is assumed that light emitting elements LD having the same conditions (for example, the same size and/or number) are used and express the same luminance, the light source unit LSU in which the light emitting elements LD are connected in the serial/parallel combination structure makes it possible to reduce driving current compared to that of the light source unit LSU having a structure in which all of the light emitting elements LD are connected in parallel to each other as shown in embodiments of FIGS. 5A to 5C, and makes it possible to reduce driving voltages to be applied to the opposite ends of the light source unit LSU compared to that of the light source unit LSU having a structure in which all of the light emitting elements LD are connected in series as shown in embodiment of FIG. 5D. In the case where all of the light emitting elements LD are connected only in series, if at least one of the light emitting elements LD connected in series to each other is not completely oriented in the forward direction, a path along which the driving current is able to flow in the pixel PXL is blocked, whereby a dark spot defect may be caused. On the other hand, in the case where the light emitting elements LD are connected to each other in the serial/parallel combination structure, even if some or a part of light emitting elements LD in each serial stage are not completely or validly connected in the forward direction or defects occur in some or a part of light emitting elements LD, the driving current is allowed to flow through the other light emitting elements LD of the corresponding serial stage. Therefore, defects of the pixel PXL may be prevented or reduced.

In FIG. 5E, the pixel PXL including the light source unit LSU having a three-stage serial/parallel combination structure has been described for illustrative purposes, but the disclosure is not limited thereto. For example, the pixel PXL in accordance with an embodiment may include a light source unit LSU having only a two-stage serial/parallel combination structure, as illustrated in FIG. 5F.

As an example, a pixel PXL in accordance with an embodiment may include a light source unit LSU having a four- or more-stage serial/parallel combination structure. In other words, the pixel PXL in accordance with an embodiment may include a light source unit LSU having a series-parallel structure including at least two serial stages, and the number of serial stages may be changed depending on embodiments. For example, the pixel PXL may include a light source unit LSU having a six-stage serial/parallel combination structure, as illustrated in FIG. 5G.

Referring to FIG. 5G, the light source unit LSU may include first to sixth serial stages successively connected between the first and second power supplies VDD and VSS. Each of the first to sixth serial stages may include a first sub-electrode SET1 and a second sub-electrode SET2 which form an electrode pair of the corresponding serial stage, and one or more light emitting elements LD connected in the forward direction between the first and second sub-electrodes SET1 and SET2. For example, the first serial stage may include a pair of first and second sub-electrodes SET1[1] and SET2[1], and one or more first light emitting elements LD1 (for example, first light emitting elements LD1) electrically connected between the first and second sub-electrodes SET1[1] and SET2[1].

Furthermore, the other serial stages may have a structure similar to that of the first serial stage. For example, the second serial stage may include first and second sub-electrodes SET1[2] and SET2[2], and one or more second light emitting elements LD2 (for example, second light emitting elements LD2) electrically connected between the first and second sub-electrodes SET1[2] and SET2[2]. The third serial stage may include a pair of first and second sub-electrodes SET1[3] and SET2[3], and one or more third light emitting elements LD3 (for example, third light emitting elements LD3) electrically connected between the first and second sub-electrodes SET1[3] and SET2[3]. The fourth serial stage may include a pair of first and second sub-electrodes SET1[4] and SET2[4], and one or more fourth light emitting elements LD4 (for example, fourth light emitting elements LD4) electrically connected between the first and second sub-electrodes SET1[4] and SET2[4]. The fifth serial stage may include a pair of first and second sub-electrodes SET1[5] and SET2[5], and one or more fifth light emitting elements LD5 (for example, fifth light emitting elements LD5) electrically connected between the first and second sub-electrodes SET1[5] and SET2[5]. The sixth serial stage may include a pair of first and second sub-electrodes SET1[6] and SET2[6], and one or more sixth light emitting elements LD6 (for example, sixth light emitting elements LD6) electrically connected between the first and second sub-electrodes SET1[6] and SET2[6]. In this way, a K-th (K is a natural number) serial stage of the light source unit LSU may include first and second sub-electrodes SET1[K] and SET2[K], and one or more K-th light emitting element LDK electrically connected between the first and second sub-electrodes SET1[K] and SET2[K].

Two sub-electrodes connected between respective serial stages may be integrally or non-integrally connected to each other to form each intermediate electrode. For example, the second sub-electrode SET2[1] of the first serial stage and the first sub-electrode SET1[2] of the second serial stage may form an intermediate electrode that connects the first and second serial stages to each other. The second sub-electrode SET2[2] of the second serial stage and the first sub-electrode SET1[3] of the third serial stage may form an intermediate electrode that connects the second and third serial stages to each other. Likewise, the second sub-electrode SET2[3] of the third serial stage and the first sub-electrode SET1[4] of the fourth serial stage may form an intermediate electrode that connects the third and fourth serial stages to each other. The second sub-electrode SET2[4] of the fourth serial stage and the first sub-electrode SET1[5] of the fifth serial stage may form an intermediate electrode that connects the fourth and fifth serial stages to each other. The second sub-electrode SET2[5] of the fifth serial stage and the first sub-electrode SET1[6] of the sixth serial stage may form an intermediate electrode that connects the fifth and sixth serial stages to each other.

In accordance with embodiments of FIGS. 5E to 5G, the light source unit LSU of each pixel PXL may be formed of a series-parallel structure including serial stages. Hence, the emission rate of the light emitting elements LD and the luminance of the pixel PXL may be enhanced.

As described in embodiments of FIGS. 5A to 5G, the pixel PXL may include a pixel circuit PXC and/or a light source unit LSU which may have various structures. The structure of the pixel PXL which may be applied to the disclosure is not limited to embodiments illustrated in FIGS. 5A to 5G, and each pixel PXL may have various structures. For example, the pixel circuit PXC included in each pixel PXL may be formed of a pixel circuit which may have various structures and/or be operated by various driving schemes. In an embodiment, each pixel PXL may be formed in a passive display device, or the like within the spirit and the scope of the disclosure. The pixel circuit PXC may be omitted, and each of the first and second electrodes ET1 and ET2 (or the first sub-electrode SET1 of the first serial stage and the second sub-electrode SET2 of the last serial stage) of the light source unit LSU may be connected to or directly connected to a scan line Si, a data line Dj, a power line, and/or a control line.

Figure 6A:
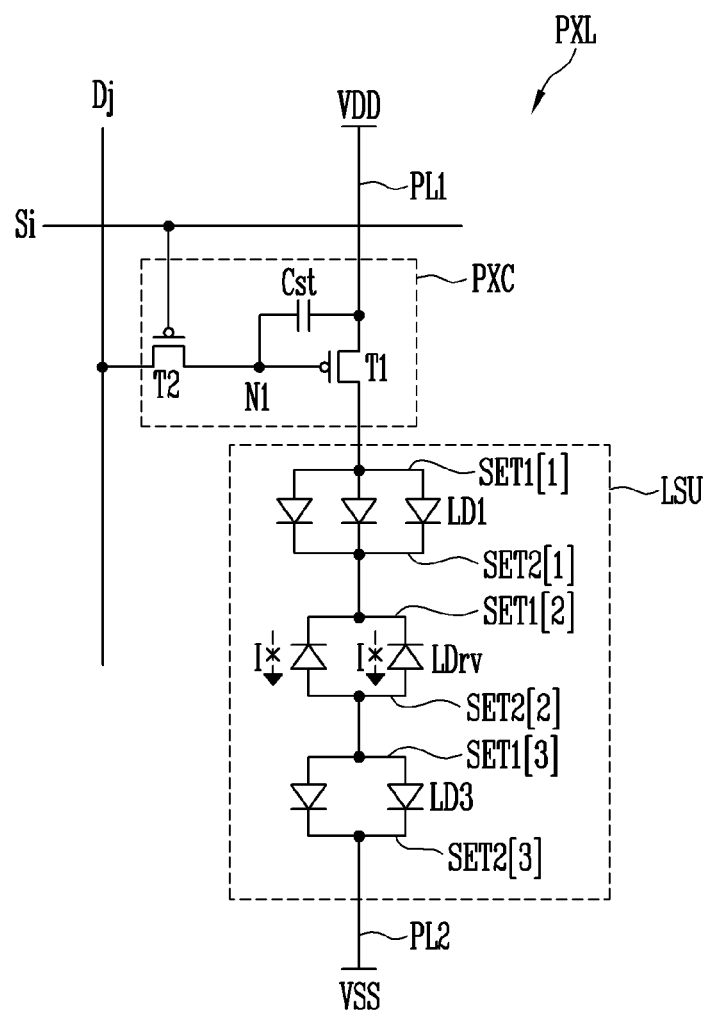
FIGS. 6A and 6B are schematic diagrams of an equivalent circuit each illustrating a pixel in accordance with an embodiment, and for example illustrate different embodiments of a pixel in which open failures have occurred due to different reasons.
Figure 6B:
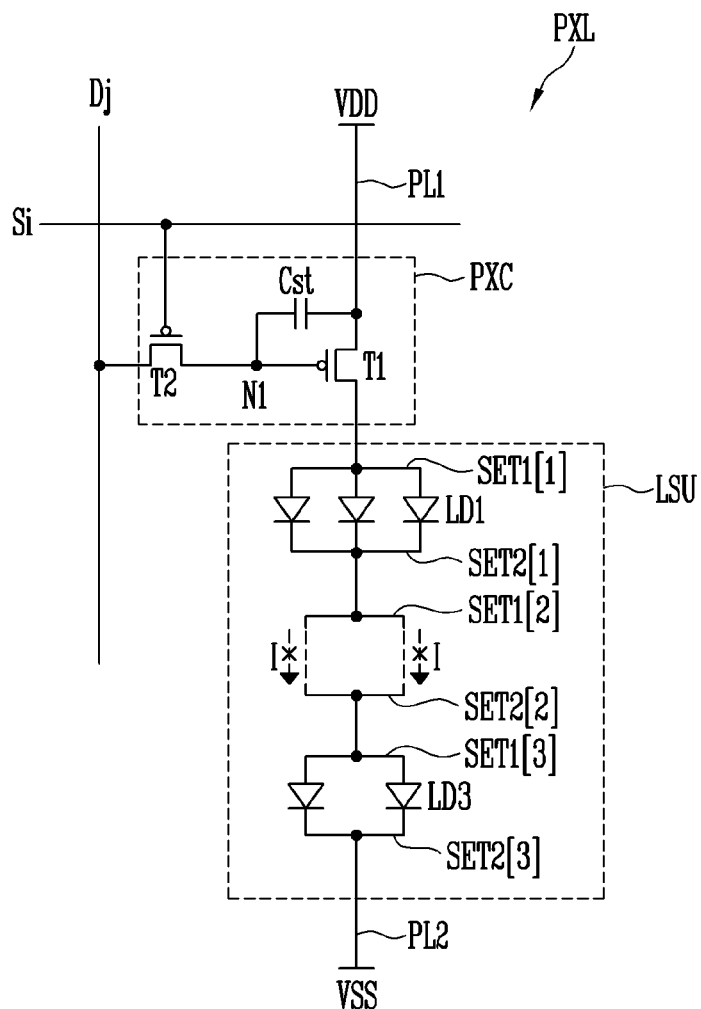

FIGS. 6A and 6B are schematic diagrams of an equivalent circuit each illustrating a pixel PXL in accordance with an embodiment, and for example illustrate different embodiments of a pixel PXL in which open failures have occurred due to different reasons. In an embodiment, FIGS. 6A and 6B illustrate an example of an open failure which may occur in the pixel PXL according to an embodiment of FIG. 5E, and detailed descriptions similar or equal to those of embodiments described above will be omitted.

Referring to FIGS. 5E, 6A, and 6B, if there is no light emitting element LD completely or validly connected in the forward direction between a pair of first and second sub-electrodes SET1 and SET2 that form at least one serial stage, an open failure may occur in the corresponding pixel PXL. Therefore, the pixel PXL may be revealed as a dark spot.

For example, as illustrated in FIG. 6A, there is no light emitting element LD connected in the forward direction between first and second sub-electrodes SET1[2] and SET2[2] of the second serial stage, as illustrated in FIG. 6A, and only a reverse light emitting element LDrv may be connected therebetween. The first and second sub-electrodes SET1[2] and SET2[2] may not be electrically connected to each other and may remain as floating electrodes. Hence, since an open failure occurs in the second serial stage, a current path along which driving current I can flow may be blocked.

As an example, as illustrated in FIG. 6B, any light emitting element LD may not be reliably connected between the first and second sub-electrodes SET1[2] and SET2[2] of the second serial stage. The first and second sub-electrodes SET1[2] and SET2[2] may not be electrically connected to each other and may remain as floating electrodes. Hence, since an open failure occurs in the second serial stage, a current path along which driving current I can flow may be blocked.

Although FIGS. 6A and 6B illustrate an example of the pixel PXL in which an open failure has occurred in the second serial stage, the current path along which the driving current I can flow may be block even in case that an open failure occurs in other serial stages.

In other words, in the pixel PXL including a light source unit LSU having a serial structure (for example, a light source unit LSU having a serial/parallel combination structure), if one or more light emitting elements LD are not reliably connected in the forward direction between a pair of first and second sub-electrodes SET1 and SET2 that form each serial stage, an open failure may occur, so that the pixel may be revealed as a dark spot. Therefore, the disclosure discloses, through embodiments to be described below, a pixel PXL having a structure that can be optimized to a biased alignment scheme and in which a light source unit LSU can be efficiently formed or structured using light emitting elements LD supplied to the emission area of each pixel PXL, and discloses a display device and a method of fabricating the display device.

Figure 7:
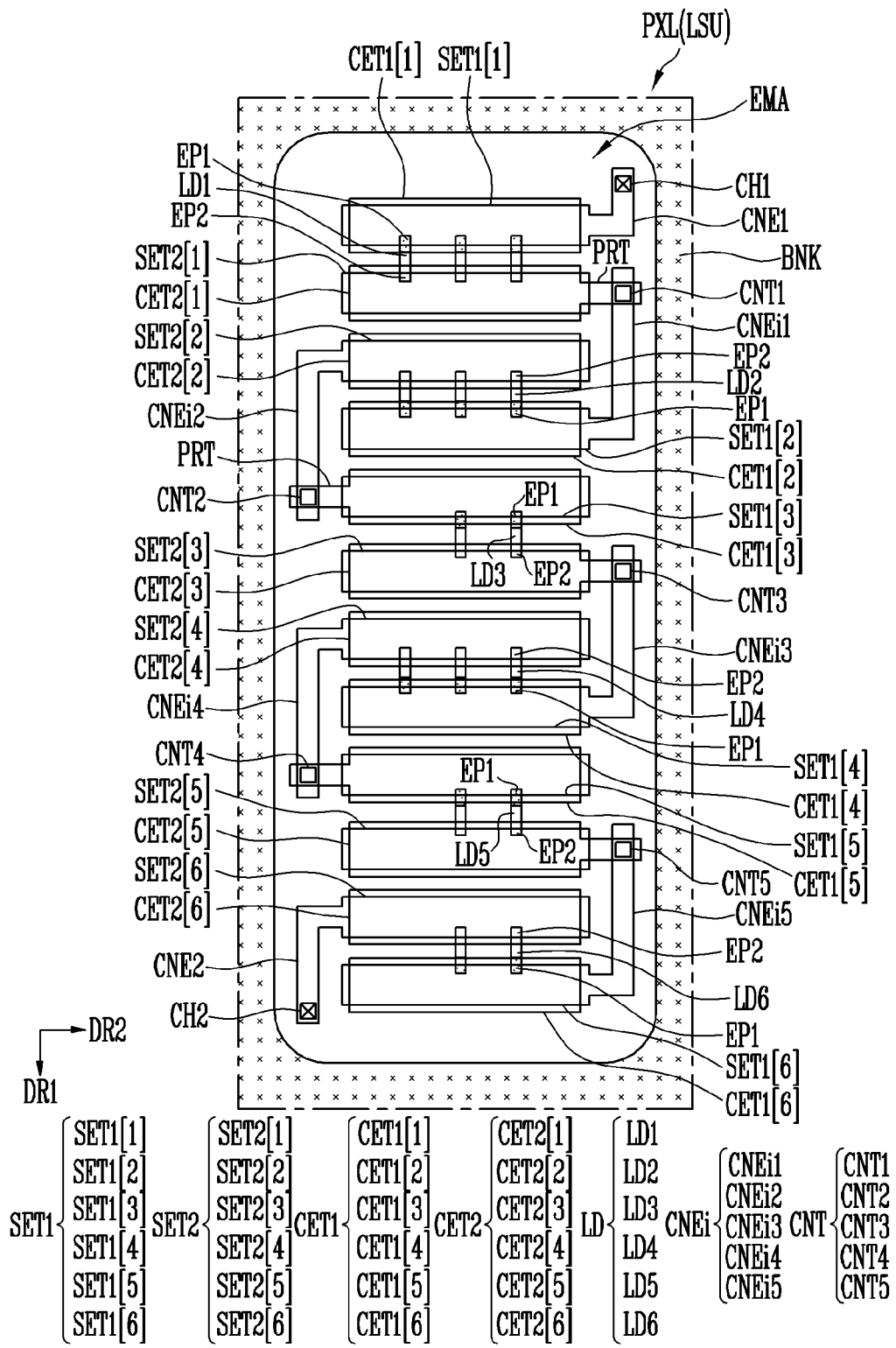
FIG. 7 is a schematic plan view illustrating a pixel in accordance with an embodiment.

FIG. 7 is a schematic plan view illustrating a pixel PXL in accordance with an embodiment. In an embodiment, the pixel PXL illustrated in FIG. 7 may be any one of the pixels PXL illustrated in FIGS. 4 to 5G. For example, the pixel PXL illustrated in FIG. 7 may be a pixel PXL corresponding to an embodiment of FIG. 5G. In an embodiment, the pixels PXL disposed in the display area (DA of FIG. 4) may have substantially identical or similar structures.

In an embodiment, FIG. 7 illustrates the structure of the pixel PXL, focused on each light source unit LSU. Here, the pixel PXL may selectively further include a circuit element (for example, at least one circuit element that forms the pixel circuit PXC of FIGS. 5A to 5G) for controlling the light source unit LSU. In an embodiment, the circuit element may be disposed on a layer different from that of the light source unit LSU. For example, the circuit element may be disposed in a pixel circuit layer located or disposed on one surface or a surface of the base layer BSL, and the light source unit LSU may be disposed in a display element layer disposed on the pixel circuit layer.

Furthermore, FIG. 7 illustrates an embodiment in which each light source unit LSU may be connected, through first and second contact holes CH1 and CH2, to a power line (for example, first and/or second power lines PL1 and/or PL2), a circuit element (for example, at least one circuit element that forms the pixel circuit PXC), and/or a signal line (for example, a scan line Si and/or a data line Dj), but the disclosure is not limited thereto. For example, in an embodiment, at least one sub-electrode (or a first connection electrode CNE1 and/or a second connection electrode CNE2 connected to the at least one sub-electrode) of the first and second sub-electrodes SET1 and SET2 of each pixel PXL may be connected to or directly connected to a power line and/or signal line without passing through a contact hole, an intermediate line, and/or the like within the spirit and the scope of the disclosure.

Referring to FIGS. 4 to 7, the pixel PXL in accordance with an embodiment may include electrode pairs each including a pair of first sub-electrode SET1 and second sub-electrode SET2, light emitting elements LD each of which is electrically connected between any one pair of first and second sub-electrodes SET1 and SET2, a first connection electrode CNE1 connected to any one of the first sub-electrodes SET1 (for example, a first sub-electrode SET1[1] of the first electrode pair), and a second connection electrode CNE2 connected to any one of the second sub-electrodes SET2 (for example, a second sub-electrode SET2[6] of the last electrode pair). In an embodiment, the first sub-electrode SET1 of the first electrode pair may be the first sub-electrode SET1[1] of the first serial stage. The second sub-electrode SET2 of the last electrode pair may be the second sub-electrode SET2[6] of the last serial stage (for example, the sixth serial stage).

Furthermore, the pixel PXL may further include an opaque bank BNK that encloses each emission area EMA in which the electrode pairs and the light emitting elements LD are disposed, first contact electrodes CET1 which are individually disposed on the respective first sub-electrodes SET1 of the electrode pairs disposed in each emission area EMA, second contact electrodes CET2 which are individually disposed on the respective second sub-electrodes SET2 of the electrode pairs, and at least one intermediate connection electrode CNEi connected between two successive serial stages.

In an embodiment, the emission area EMA of each pixel PXL may be an area defined and/or sectioned by the bank BNK. Furthermore, the emission area EMA may be an area in which the light emitting elements LD and the respective first and second sub-electrodes SET1 and SET2 corresponding to serial stages of the corresponding pixel PXL are disposed.

The bank BNK may be disposed in a peripheral area of the pixels PXL and/or between the pixels PXL to enclose the emission area EMA of each of the pixels PXL disposed in the display area DA. For example, the bank BNK may include openings corresponding to the respective emission areas EMA of the pixels PXL and be formed in the display area DA in a mesh shape or substantially mesh shape. In an embodiment, the bank BNK may include light shielding and/or reflective opaque material, so that light leakage may be prevented from occurring between adjacent pixels PXL. Furthermore, the bank BNK may also function as a dam structure for defining each emission area EMA to which the light emitting elements LD are to be supplied, in case that the light emitting elements LD are supplied to each pixel PXL.

In an embodiment, electrode pairs that form each of serial stages may be successively disposed in any one direction. A pair of first and second sub-electrodes SET1 and SET2 that form each serial stage may be sequentially disposed in the any one direction.

For example, each pixel PXL may include electrode pairs which are successively arranged or disposed in a first direction DR1 in each emission area EMA. Each of the electrode pairs may include a first sub-electrode SET1 and a second sub-electrode SET2 which are sequentially disposed in the first direction DR1.

In an embodiment, the first direction DR1 may be a longitudinal direction (also referred to as "vertical direction" or "lengthwise direction") of the emission area EMA, and have a length greater than that of a transverse direction of the emission area EMA. The number of electrode pairs disposed in each pixel PXL may be increased. Hence, the number of serial stages included in the light source unit LSU may be increased. For example, in the case where first and second sub-electrodes SET1 and SET2 are arranged or disposed in the longitudinal direction of the emission area EMA, each light source unit LSU may be formed of three or more electrode pairs, and the light emitting elements LD that form valid light sources of the light source unit LSU may be dispersed in three or more serial stages each including an electrode pair, and be connected to each other in a serial/parallel combination structure. For example, as illustrated in FIGS. 5E and 7, each pixel PXL may include six electrode pairs which are sequentially arranged or disposed in the first direction DR1 and respectively form first to sixth serial stages. Here, the number and/or arrangement structure of the electrode pairs that form each light source unit LSU may be changed in various ways depending on embodiments. As such, if the light source unit LSU of each pixel PXL is formed of a series-parallel structure including serial stages, the emission rate of the light emitting elements LD may be improved, and the luminance of the pixel PXL may be enhanced.

In an embodiment, each of the first and second sub-electrodes SET1 and SET2 may have a shape extending in a second direction DR2 intersecting the first direction DR1. In an embodiment, the second direction DR2 may be a transverse direction of the emission area EMA, but the disclosure is not limited thereto. For example, in an embodiment, the second direction DR2 may be an oblique direction including a diagonal direction of the emission area EMA.

In an embodiment, each of the first and second sub-electrodes SET1 and SET2 may be an electrode having a substantially bar shape extending in the second direction DR2. The shape of each of the first and second sub-electrodes SET1 and SET2 may be changed in various ways. For example, in an embodiment, at least one of the first and second sub-electrodes SET1 and SET2 may have a substantially bar shape extending in an oblique direction inclined with respect to the longitudinal direction and the transverse direction of the emission area EMA, or at least one area may have a substantially curved or substantially bent shape.

The number of electrode pairs (for example, the number of serial stages) disposed in each emission area EMA may be changed in various ways. For example, the number of electrode pairs each including the first and second sub-electrodes SET1 and SET2 may be designed in various ways depending on the shape and/or size (a surface area, a length, a width, etc.) of the emission area EMA, and the shape and/or size of each of the first and second sub-electrodes SET1 and SET2.

In an embodiment, in two electrode pairs that are sequentially arranged or disposed among electrode pairs for forming each of the serial stages, the first and second sub-electrodes SET1 and SET2 for forming the respective electrode pairs may be arranged or disposed in the opposite directions such that the respective first sub-electrodes SET1 or the respective second sub-electrodes SET2 are adjacent to each other. For example, among the electrode pairs disposed in each emission area EMA, the first and second sub-electrodes SET1 and SET2 of each of odd numbered electrode pairs (for example, the first and second sub-electrodes SET1[1], SET2[1], SET1[3], SET2[3], SET1[5], and SET2[5] of the first, third, and fifth serial stages) may be sequentially disposed in the first direction DR1 while the first and second sub-electrodes SET1 and SET2 of each of even numbered electrode pairs (for example, the first and second sub-electrodes SET1[2], SET2[2], SET1[4], SET2[4], SET1[6], and SET2[6] of the second, fourth, and sixth serial stages) may be disposed in reverse order in the first direction DR1. For example, in each emission area EMA, the first sub-electrode SET1[1] of the first serial stage, the second sub-electrode SET2[1] of the first serial stage, the second sub-electrode SET2[2] of the second serial stage, the first sub-electrode SET1[2] of the second serial stage, the first sub-electrode SET1[3] of the third serial stage, the second sub-electrode SET2[3] of the third serial stage, the second sub-electrode SET2[4] of the fourth serial stage, the first sub-electrode SET1[4] of the fourth serial stage, the first sub-electrode SET1[5] of the fifth serial stage, the second sub-electrode SET2[5] of the fifth serial stage, the second sub-electrode SET2[6] of the sixth serial stage, and the first sub-electrode SET1[6] of the sixth serial stage may be arranged or disposed sequentially in the first direction DR1.

In an embodiment, first sub-electrodes SET1 or second sub-electrodes SET2 of two successive electrode pairs may be first integrally or non-integrally connected to each other, and supplied with an identical alignment signal at the step of aligning the light emitting elements LD. The first sub-electrodes SET1 or the second sub-electrodes SET2 of the two successive electrode pairs may be separated from each other after the alignment of the light emitting elements LD has been completed. This will be described in detail later herein.

In an embodiment, a pair of first and second sub-electrodes SET1 and SET2 that form each serial stage may be disposed in each emission area EMA at positions spaced apart from each other at regular intervals. Hence, the light emitting elements LD may be more regularly dispersed and/or aligned in each emission area EMA. The disclosure is not limited thereto, and the disposition intervals of the first and second sub-electrodes SET1 and SET2 may be changed in various ways.

In an embodiment, each of the second sub-electrodes of remaining electrode pairs other than the last electrode pair may be disposed to be spaced apart from the first sub-electrode SET1 of a subsequent electrode pair with at least one first or second sub-electrode SET1 or SET2 interposed therebetween, and be thus electrically connected to the first sub-electrode SET1 of the subsequent electrode pair. For example, the second sub-electrodes SET2[1] to SET2[5] of the first to fifth serial stages may be electrically connected to the first sub-electrodes SET1[2] to SET1[6] of the second to sixth serial stages with the first or second sub-electrode SET1 or SET2 of a subsequent serial stage interposed therebetween. In an embodiment, each of the second sub-electrodes SET2 of the remaining electrode pairs other than the last electrode pair may be integrally or non-integrally connected to the first sub-electrode SET1 of a subsequent electrode pair.

At least one light emitting element LD, for example, light emitting elements LD may be connected between the first and second sub-electrodes SET1 and SET2 of each serial stage. For example, first light emitting elements LD1 may be connected in parallel between the first and second sub-electrodes SET1[1] and SET2[1] of the first serial stage. Likewise, second light emitting elements LD2, third light emitting elements LD3, fourth light emitting elements LD4, fifth light emitting elements LD5, and sixth light emitting elements LD6 may be respectively connected in parallel between the first and second sub-electrodes SET1[2] and SET2[2] of the second serial stage, between the first and second sub-electrodes SET1[3] and SET2[3] of the third serial stage, between the first and second sub-electrodes SET1[4] and SET2[4] of the fourth serial stage, between the first and second sub-electrodes SET1[5] and SET2[5] of the fifth serial stage, and between the first and second sub-electrodes SET1[6] and SET2[6] of the sixth serial stage. In an embodiment, only a single light emitting element LD may be connected between the first and second sub-electrodes SET1 and SET2 of any one serial stage.

In an embodiment, each of the light emitting elements LD may be a light emitting element which is made of material having an inorganic crystal structure and has a subminiature size, for example, ranging from the nanometer scale to the micrometer scale. For example, each light emitting element LD may be a subminiature rod-type light emitting element having a size ranging from the nanometer scale to the micrometer scale, as illustrated in FIGS. 1A to 3B. The size, the type, the shape, etc. of the light emitting elements LD may be changed in various ways.

Although FIG. 7 illustrates that, in the area where a pair of first and second sub-electrodes SET1 and SET2 are disposed to face each other, each light emitting element LD is uniformly vertically arranged or disposed in the first direction DR1 between the first and second sub-electrodes SET1 and SET2, the disclosure is not limited thereto. For example, at least one of the light emitting elements LD may be arranged or disposed and/or connected in a diagonal direction between the first and second sub-electrodes SET1 and SET2. Although not shown in FIG. 7, at least one reverse light emitting element LDrv connected in a reverse direction between a pair of first and second sub-electrodes SET1 and SET2 may be further disposed in each emission area EMA, or at least one light emitting element (for example, another invalid light source other than the reverse light emitting element LDrv) that is not reliably connected between a pair of first and second sub-electrodes SET1 and SET2 may be further disposed in each emission area EMA.

In an embodiment, the light emitting elements LD may be prepared in a diffused form in a solution, and supplied to each pixel area (for example, each emission area enclosed by a bank BNK (also referred to as "pixel defining layer")

disposed between adjacent pixels PXL). In an embodiment, the light emitting elements LD may be supplied to each pixel area by an inkjet scheme, a slit coating scheme, or other various schemes. For example, the light emitting elements LD may be mixed with a volatile solvent and supplied to the emission area EMA of each pixel PXL by an inkjet printing method or a slit coating method. Here, if alignment signals (or alignment voltages) are applied to the first and second sub-electrodes SET1 and SET2, an electric field is formed between the first and second sub-electrodes SET1 and SET2, whereby the light emitting elements LD may be aligned between the first and second sub-electrodes SET1 and SET2. After the light emitting elements LD have been aligned, the solvent may be removed by a volatilization scheme or other schemes. In this way, the light emitting elements LD may be reliably disposed between the first and second sub-electrodes SET1 and SET2.

Each of the light emitting elements LD may include a first end EP1 electrically connected to a first sub-electrode SET1 of any one electrode pair, and a second end EP2 connected to a second sub-electrode SET2 of the any one electrode pair. In an embodiment, the first end EP1 of each of the light emitting elements LD may be a P-type end, and the second end EP2 may be an N-type end. In other words, each of the light emitting elements LD may be connected in the forward direction between the first and second sub-electrodes SET1 and SET2 of any one electrode pair.

In an embodiment, the first end EP1 of each of the light emitting elements LD may be connected to or directly connected to a first sub-electrode SET1 of any one electrode pair, or be connected to the first sub-electrode SET1 of the any one electrode pair through each first contact electrode CET1. Likewise, the second end EP2 of each of the light emitting elements LD may be connected to or directly connected to a second sub-electrode SET2 of any one electrode pair, or be connected to the second sub-electrode SET2 of the any one electrode pair through each second contact electrode CET2. The light emitting elements LD connected in the forward direction between the first and second sub-electrodes SET1 and SET2 of each electrode pair may form valid light sources of each serial stage.

The first connection electrode CNE1 may be electrically connected between the first sub-electrode SET1 of the first electrode pair (for example, the first sub-electrode SET1[1] of the first serial stage) and the first power supply VDD. For example, one end or an end of the first connection electrode CNE1 may be connected to the first sub-electrode SET1[1] of the first electrode pair, and the other end or another end of the first connection electrode CNE1 may be connected to the first power supply VDD via the first contact hole CH1, etc., within the spirit and the scope of the disclosure.

In an embodiment, the first connection electrode CNE1 may be integrally or non-integrally connected with the first sub-electrode SET1[1] of the first electrode pair. In the case where the first connection electrode CNE1 is integrally connected with the first sub-electrode SET1[1] of the first electrode pair, the first connection electrode CNE1 and the first sub-electrode SET1[1] of the first electrode pair may be regarded as being different areas of one electrode, line, or pattern.

In an embodiment, the first connection electrode CNE1 may be electrically connected to a circuit element disposed thereunder through the first contact hole CH1, and be connected to the first power line PL1 through the circuit element. For example, each pixel PXL may further include a pixel circuit PXC connected between the first connection electrode CNE1 and the first power supply VDD. In an embodiment, the pixel circuit PXC may be disposed under or below each light source unit LSU and be connected to the first connection electrode CNE1 of the light source unit LSU through the first contact hole CH1.

In an embodiment, the first connection electrode CNE1 may be connected, via the first contact hole CH1, etc., to a signal line to which a first driving signal is supplied. In an embodiment, the first connection electrode CNE1 may be connected to or directly connected to the first power line PL1 or a signal line without using the first contact hole CH1, and/or the circuit element. The first connection electrode CNE1 may be integrally or non-integrally connected to the first power line PL1 or the signal line.

The first connection electrode CNE1 may be supplied with a voltage of the first power supply VDD or a first driving signal (for example, a scan signal, a data signal, or a other control signal) during a period in which the display device is operated.

The second connection electrode CNE2 may be electrically connected between the second sub-electrode SET2 of the last electrode pair (for example, the second sub-electrode SET2 of the last serial stage) and the second power supply VSS. For example, one end or an end of the second connection electrode CNE2 may be connected to the second sub-electrode SET2 of the last electrode pair (for example, the second sub-electrode SET2[6] of the sixth serial stage), and the other end or another end of the second connection electrode CNE2 may be connected to the second power supply VSS via the second contact hole CH2, etc., within the spirit and the scope of the disclosure.

In an embodiment, the second connection electrode CNE2 may be integrally or non-integrally connected with the second sub-electrode SET2 of the last electrode pair (for example, the second sub-electrode SET2[6] of the sixth serial stage). In the case where the second connection electrode CNE2 is integrally connected with the second sub-electrode SET1 of the last electrode pair, the second connection electrode CNE2 and the second sub-electrode SET2 of the last electrode pair may be regarded as being different areas of one electrode, line, or pattern.

In an embodiment, the second connection electrode CNE2 may be electrically connected to a second contact hole CH2, a circuit element (for example, at least one transistor that forms the pixel circuit PXC), a power line (for example, the second power line PL2), and/or a signal line (for example, a scan line Si, a data line Dj, or a control line). For example, the second connection electrode CNE2 may be connected, through the second contact hole CH2, to the second power line PL2 disposed thereunder. In an embodiment, the second connection electrode CNE2 may be connected to or directly connected to the second power line PL2 or a signal line (for example, a signal line to which a second driving signal is supplied) without passing through the second contact hole CH2 and/or the circuit element, etc., within the spirit and the scope of the disclosure. The second connection electrode CNE2 may be integrally or non-integrally connected to the second power line PL2 or the signal line.

The second connection electrode CNE2 may be supplied with a voltage of the second power supply VSS or a second driving signal (for example, a scan signal, a data signal, or a other control signal) during a period in which the display device is operated.

The first contact electrodes CET1 are individually disposed on the respective first sub-electrodes SET1 of the electrode pairs, so that each first sub-electrode SET1 can be electrically connected to the first end EP1 of an adjacent light emitting element LD. For example, first contact electrodes CET1[1] to CET1[6] of the first to sixth serial stages may be respectively disposed on the first sub-electrodes SET1[1] to SET1[6] of the first to sixth serial stages. The first contact electrodes CET1[1] to CET1[6] of the first to sixth serial stages may electrically connect the first sub-electrodes SET1[1] to SET1[6] of the first to sixth serial stages to the first ends EP1 of the first to sixth light emitting elements LD1 to LD6, respectively.

The first contact electrodes CET1 may be selectively formed depending on embodiments. In an embodiment, in the case where the pixel PXL does not include the first contact electrodes CET1, the first sub-electrodes SET1 may be connected with or directly connected with the respective light emitting elements LD.

The second contact electrodes CET2 are individually disposed on the respective second sub-electrodes SET2 of the electrode pairs, so that each second sub-electrode SET2 can be electrically connected to the second end EP2 of an adjacent light emitting element LD. For example, second contact electrodes CET2[1] to CET2[6] of the first to sixth serial stages may be respectively disposed on the second sub-electrodes SET2[1] to SET2[6] of the first to sixth serial stages. The second contact electrodes CET2[1] to CET2[6] of the first to sixth serial stages may electrically connect the second sub-electrodes SET2[1] to SET2[6] of the first to sixth serial stages to the second ends EP2 of the first to sixth light emitting elements LD1 to LD6, respectively.

The second contact electrodes CET2 may be selectively formed depending on embodiments. In an embodiment, in the case where the pixel PXL does not include the second contact electrodes CET2, the second sub-electrodes SET2 may be connected with or directly connected with the respective light emitting elements LD.

Since the first and second contact electrodes CET1 and CET2 are formed, the light emitting elements LD may be more reliably connected between the first and second sub-electrodes SET1 and SET2.

In an embodiment, each of the second sub-electrodes SET2 of the remaining electrode pairs other than the last electrode pair may be connected to the first sub-electrode SET1 of a subsequent electrode pair through each corresponding intermediate connection electrode CNEi. In an embodiment, each intermediate connection electrode CNEi may integrally extend from any one sub-electrode of the second sub-electrode SET2 of each of the remaining electrode pairs and the first sub-electrode SET1 of the subsequent electrode pair. The first or second contact electrode CET1 or CET2 disposed on the other sub-electrode of the second sub-electrode SET2 of each of the remaining electrode pairs and the first sub-electrode SET1 of the subsequent electrode pair may include a protrusion PRT which protrudes from any one end or an end in the second direction DR2 and is electrically connected to each corresponding intermediate connection electrode CNEi.

For example, the second sub-electrode SET2[1] of the first serial stage and the first sub-electrode SET1[2] of the second serial stage may be electrically connected to each other both through a protrusion PRT that integrally extends from the second contact electrode CET2[1] of the first serial stage that is disposed on the second sub-electrode SET2[1] of the first serial stage and through the first intermediate connection electrode CNEi1 that integrally extends from the first sub-electrode SET1[2] of the second serial stage. In an embodiment, the protrusion PRT and the first intermediate connection electrode CNEi1 may be electrically connected to each other through a first contact part CNT1. In an embodiment, each contact part CNT including the first contact part CNT1 may be implemented by a contact hole or the like, but the disclosure is not limited thereto.

The second sub-electrode SET2[2] of the second serial stage and the first sub-electrode SET1[3] of the third serial stage may be electrically connected to each other both through the second intermediate connection electrode CNEi2 that integrally extends from the second sub-electrode SET2[2] of the second serial stage and through a protrusion PRT that integrally extends from the first contact electrode CET1[3] of the third serial stage that is disposed on the first sub-electrode SET1[3] of the third serial stage. In an embodiment, the protrusion PRT and the second intermediate connection electrode CNEi2 may be electrically connected to each other through a second contact part CNT2.

Likewise, the second sub-electrode SET2[3] of the third serial stage and the first sub-electrode SET1[4] of the fourth serial stage may be electrically connected to each other both through a protrusion PRT that integrally extends from the second contact electrode CET2[3] of the third serial stage that is disposed on the second sub-electrode SET2[3] of the third serial stage and through a third intermediate connection electrode CNEi3 that integrally extends from the first sub-electrode SET1[4] of the fourth serial stage. In an embodiment, the protrusion PRT and the third intermediate connection electrode CNEi3 may be electrically connected to each other through a third contact part CNT3.

The second sub-electrode SET2[4] of the fourth serial stage and the first sub-electrode SET1[5] of the fifth serial stage may be electrically connected to each other both through a fourth intermediate connection electrode CNEi4 that integrally extends from the second sub-electrode SET2[4] of the fourth serial stage and through a protrusion PRT that integrally extends from the first contact electrode CET1[5] of the fifth serial stage that is disposed on the first sub-electrode SET1[5] of the fifth serial stage. In an embodiment, the protrusion PRT and the fourth intermediate connection electrode CNEi4 may be electrically connected to each other through a fourth contact part CNT4.

The second sub-electrode SET2[5] of the fifth serial stage and the first sub-electrode SET1[6] of the sixth serial stage may be electrically connected to each other both through a protrusion PRT that integrally extends from the second contact electrode CET2[5] of the fifth serial stage that is disposed on the second sub-electrode SET2[5] of the fifth serial stage and through a fifth intermediate connection electrode CNEi5 that integrally extends from the first sub-electrode SET1[6] of the sixth serial stage. In an embodiment, the protrusion PRT and the fifth intermediate connection electrode CNEi5 may be electrically connected to each other through a fifth contact part CNT5.

In an embodiment, the first to fifth intermediate connection electrodes CNEi1 to CNEi5 may be alternately disposed on different sides (for example, a left side and a right side) of the emission area EMA. Hence, even in case that all of the first to fifth intermediate connection electrodes CNEi1 to CNEi5 are formed on an identical layer, they may be prevented from short-circuiting with each other.

As described above, the pixel PXL in accordance with an embodiment may include electrode pairs which are successively disposed in the first direction DR1 and form each serial stage. Each electrode pair may include a pair of first and second sub-electrodes SET1 and SET2 that are successively disposed in the first direction DR1.

Furthermore, the second sub-electrode SET2 of each of the remaining electrode pairs other than the last electrode pair may be disposed to be spaced apart from the first sub-electrode SET1 of a subsequent electrode pair with at least one first or second sub-electrode SET1 or SET2 interposed therebetween. For example, in the electrode pairs disposed in each emission area EMA, the first and second sub-electrodes SET1 and SET2 of the respective electrode pairs may be disposed in the opposite direction based on the first direction DR1 such that the first sub-electrodes SET1 or the second sub-electrodes SET2 of two successive electrode pairs are adjacent to each other. The second sub-electrode SET2 of each of the remaining electrode pairs may be electrically connected to the first sub-electrode SET1 of a subsequent electrode pair through each intermediate connection electrode CNEi, etc., within the spirit and the scope of the disclosure.

In the pixel PXL in accordance with the foregoing embodiment and the display device including the pixel PXL, the light source unit LSU including serial stages (for example, a light source unit LSU having a serial/parallel combination structure) may be formed efficiently using light emitting elements LD supplied to the emission area EMA of each pixel PXL, and the light emitting elements LD may be more uniformly arranged or disposed between electrode pairs corresponding to respective serial stages. For example, light emitting elements LD may be connected in an identical direction between a pair of first and second sub-electrodes SET1 and SET2 by using the biased alignment scheme.

For example, the light emitting elements LD may be biased-aligned such that the respective first ends EP1 of the light emitting elements LD are disposed to face any one first sub-electrode SET1, and the respective second ends EP2 of the light emitting elements LD are disposed to face any one second sub-electrode SET2 adjacent to the any one first sub-electrode SET1. In the case where the biased alignment scheme is not used, the rates at which the light emitting elements LD are respectively aligned in the forward direction and the reverse direction between a pair of first and second sub-electrodes SET1 and SET2 may be substantially identical or similar to each other. However, in the case where the biased alignment scheme is used, approximately 80% or more (ideally 100%) of the light emitting elements LD supplied to the emission area EMA of each pixel PXL may be aligned in the forward direction between the first and second sub-electrodes SET1 and SET2.

After the alignment of the light emitting elements LD have been completed, the first sub-electrodes SET1 and the second sub-electrodes SET2 are separated from each other, and the sub-electrodes may be re-connected to each other such that electrode pairs are connected in series to each other, for example, as shown in FIG. 7. Hence, the light emitting elements LD supplied to the emission area EMA of each pixel PXL are maximally connected in the forward direction between the first and second sub-electrodes SET1 and SET2, so that an application efficiency of the light emitting elements LD may be enhanced. Furthermore, since a reverse light emitting element LDrv is prevented or mitigated from occurring, leakage current due to the reverse light emitting element LDrv may be blocked or reduced.

In the foregoing embodiments, in the case where the first and second sub-electrodes SET1 and SET2 are arranged or disposed in the longitudinal direction of the emission area EMA, the number of serial stages included in the light source unit LSU having a serial/parallel combination structure may be increased. Furthermore, in case that an apparatus, for example, an inkjet nozzle, for supplying light emitting elements LD to each emission area EMA moves in the longitudinal direction of the emission area EMA (for example, in the longitudinal direction of the pixel PXL), a liquid drop of a light-emitting-element mixed solution (for example, light-emitting-element ink) including the light emitting elements LD may spread to the left and the right in the transverse direction of the emission area EMA. The light emitting elements LD may be relatively regularly distributed in the longitudinal direction of the emission area EMA even if they are irregularly distributed in the transverse direction of the emission area EMA. Therefore, a distribution deviation (for example, a deviation in number) of the light emitting elements LD between the serial stages may be reduced, and the light emitting elements LD may be relatively regularly distributed in the respective serial stages. Hence, an open failure of the pixel PXL which may occur because no light emitting element LD may be connected in the forward direction in a specific or given serial stage can be prevented or minimized. Furthermore, since the numbers of light emitting elements LD connected in the forward direction in the respective serial stages are relatively uniform, alignment/driving current may be prevented from being focused on a small number of light emitting elements LD aligned in the forward direction in any one serial stage. Therefore, each pixel PXL may be more reliably driven.

In other words, in the pixel PXL in accordance with the foregoing embodiments and the display device including the pixel PXL, the emission efficiency and the luminance of each pixel PXL may be enhanced, and a failure rate may be mitigated.

FIGS. 8 to 11 are schematic plan views each illustrating a pixel PXL in accordance with an embodiment, and for example illustrate different embodiments pertaining to the pixel PXL of FIG. 7. In embodiments of FIGS. 8 to 11, like reference numerals are used to designate identical or similar components as those of at least one above-mentioned embodiment including an embodiment of FIG. 7, and detailed descriptions thereof will be omitted.

Figure 8:
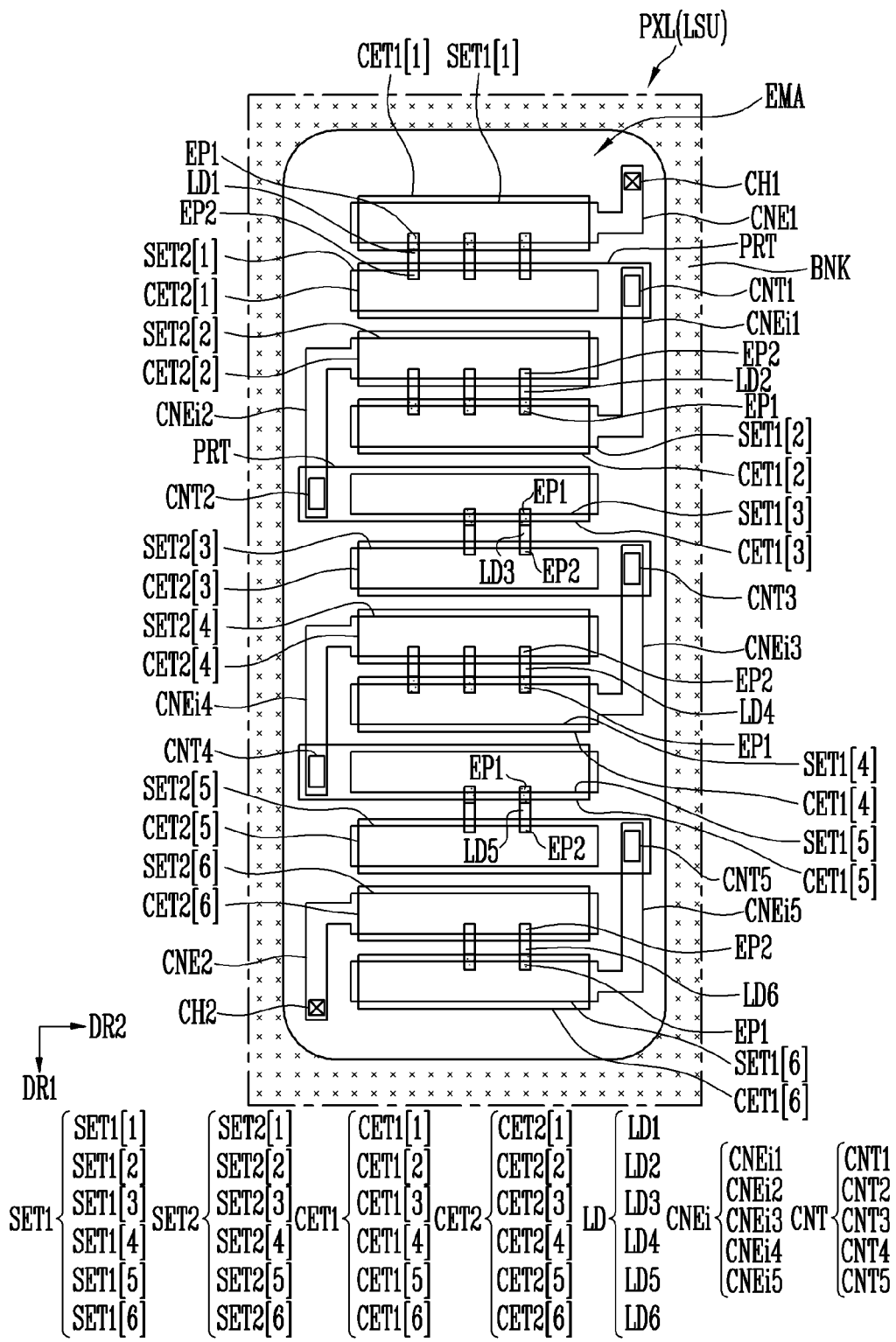
FIGS. 8 to 11 are schematic plan views each illustrating a pixel in accordance with an embodiment, and for example illustrate different modified embodiments of the pixel of FIG. 7.

Referring to FIG. 8, the shape and/or size of each protrusion PRT that extends from any one first or second contact electrode CET1 or CET2 for connection with each intermediate connection electrode CNEi may be changed in various ways. For example, each protrusion PRT may have a width less than that of the first or second contact electrode CET1 or CET2 connected thereto, as shown in FIG. 7, or may have a width substantially identical with that of the first or second contact electrode CET1 or CET2 connected thereto, as shown in an embodiment of FIG. 8.

In FIGS. 7 and 8, there are illustrated the pixels PXL capable of simplifying a fabricating process by integrally forming each protrusion PRT with any one first or second contact electrode CET1 or CET2, and integrally forming each intermediate connection electrode CNEi with any one first or second sub-electrode SET1 or SET2. However, the disclosure is not limited thereto. For example, in an embodiment, at least one protrusion PRT and/or an intermediate connection electrode CNEi may be formed through a process different from that of the first and second sub-electrodes SET1 and SET2 and the first and second contact electrodes CET1 and CET2 and formed on a layer different from that thereof. In other words, in an embodiment, a connection structure between serial stages may be changed in various ways.

Figure 9:
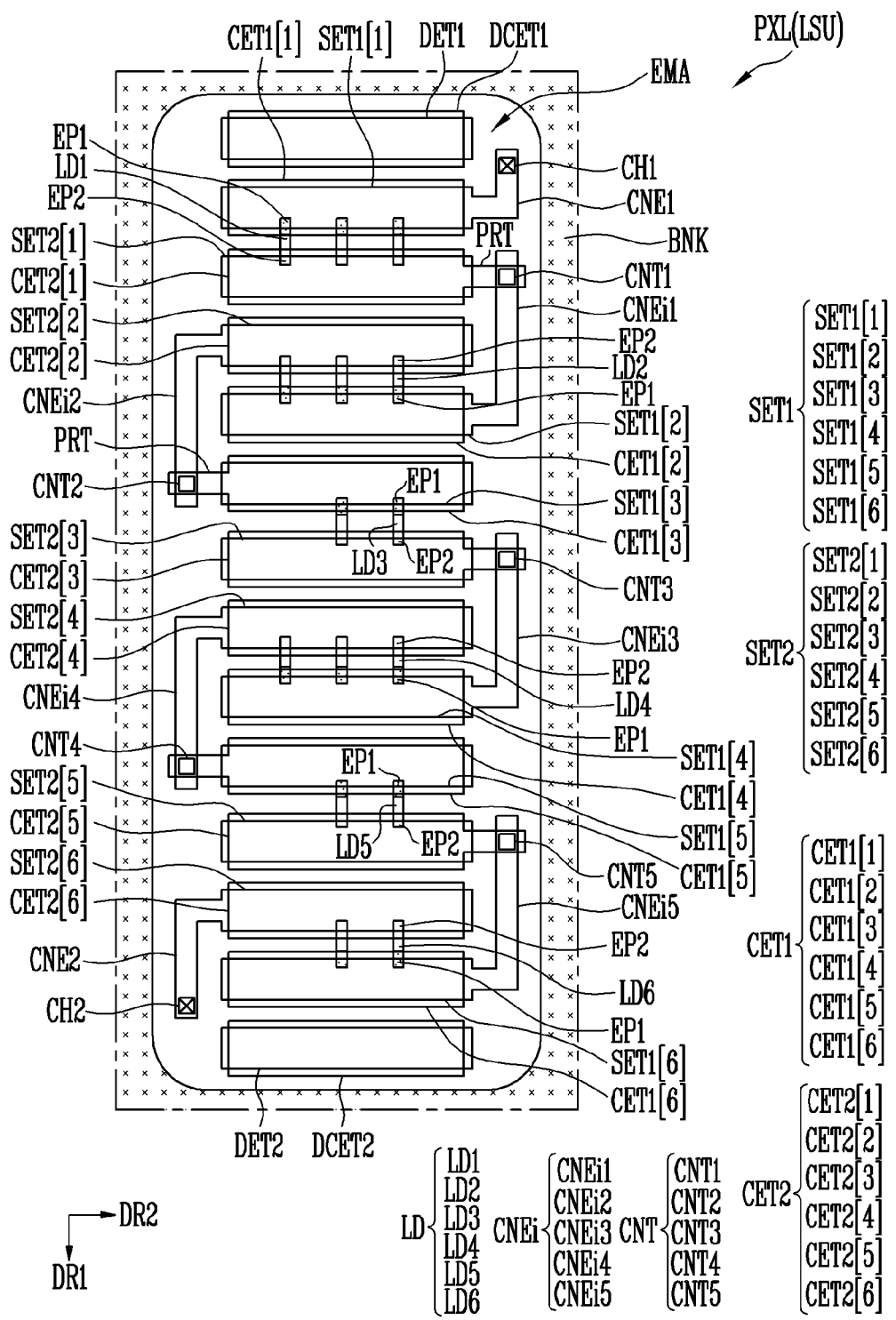

Referring to FIG. 9, the pixel PXL may further include at least one of a first dummy electrode DET1 disposed adjacent to the first electrode pair (for example, the first and second sub-electrodes SET1[1] and SET2[1] of the first serial stage) and a second dummy electrode DET2 disposed adjacent to the last electrode pair (for example, the first and second sub-electrodes SET1[6] and SET2[6] of the sixth serial stage). The first and second dummy electrodes DET1 and DET2 each may be a floating electrode which is electrically isolated.

The first dummy electrode DET1 may be disposed adjacent to the first or second sub-electrode SET1[1] or SET2[1] of the first electrode pair. For example, in the case where the first sub-electrode SET1[1] of the first and second sub-electrodes SET1[1] and SET2[1] of the first electrode pair is disposed at a relatively outer position, the first dummy electrode DET1 may be disposed in an outer area (for example, an upper outer area) of the emission area EMA such that the first dummy electrode DET1 is adjacent to the first sub-electrode SET1[1] of the first electrode pair. In an embodiment, the first dummy electrode DET1 may be first fabricated to be connected with the first sub-electrode SET1[1] of the first electrode pair, and thereafter separated and electrically isolated from the first sub-electrode SET1[1] of the first electrode pair after the alignment of the light emitting elements LD is completed.

The second dummy electrode DET2 may be disposed adjacent to the first or second sub-electrode SET1[6] or SET2[6] of the last electrode pair, for example, the first or second sub-electrode SET1[6] or SET2[6] of the sixth serial stage. For example, in the case where the first sub-electrode SET1[6] of the first and second sub-electrodes SET1[6] and SET2[6] of the sixth serial stage is disposed at a relatively outer position, the second dummy electrode DET2 may be disposed in another outer area (for example, a lower outer area) of the emission area EMA such that the second dummy electrode DET2 is adjacent to the first sub-electrode SET1[6] of the sixth serial stage. In an embodiment, the second dummy electrode DET2 may be first fabricated to be connected with the first sub-electrode SET1[6] of the sixth serial stage, and thereafter separated and electrically isolated from the first sub-electrode SET1[6] of the sixth serial stage after the alignment of the light emitting elements LD is completed.

In an embodiment, the pixel PXL may selectively further include a first dummy contact electrode DCET1 disposed on the first dummy electrode DET1, and a second dummy contact electrode DCET2 disposed on the second dummy electrode DET2. In an embodiment, the first dummy contact electrode DCET1 may be electrically connected with the first dummy electrode DET1 to form a floating electrode having a multilayer structure. The second dummy contact electrode DCET2 may be electrically connected with the second dummy electrode DET2 to form a floating electrode having a multilayer structure. In an embodiment, the first and second dummy contact electrodes DCET1 and DCET2 may be formed along with the first and second contact electrodes CET1 and CET2, and have individual patterns separated therefrom.

Figure 10:
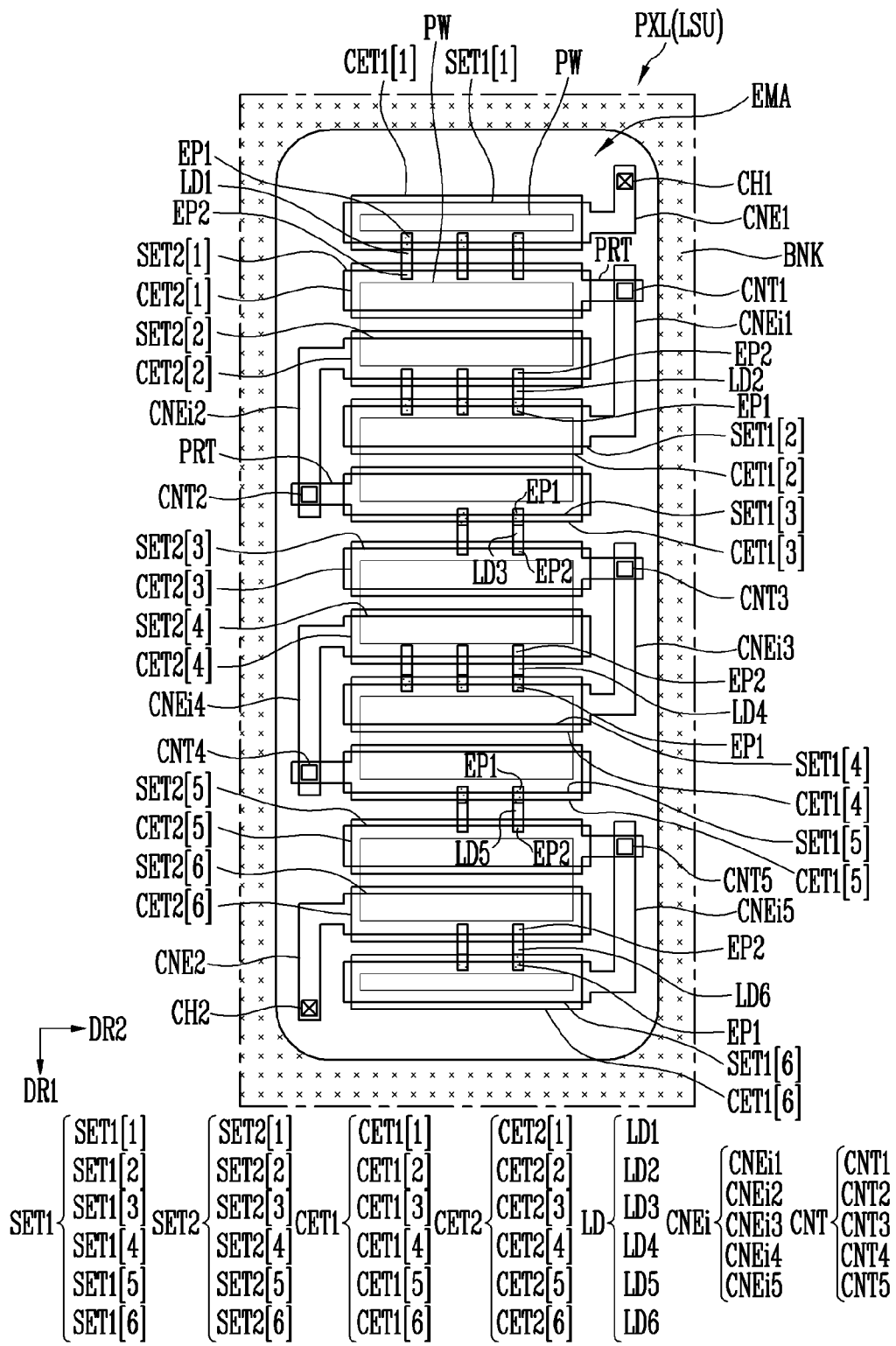
Figure 11:
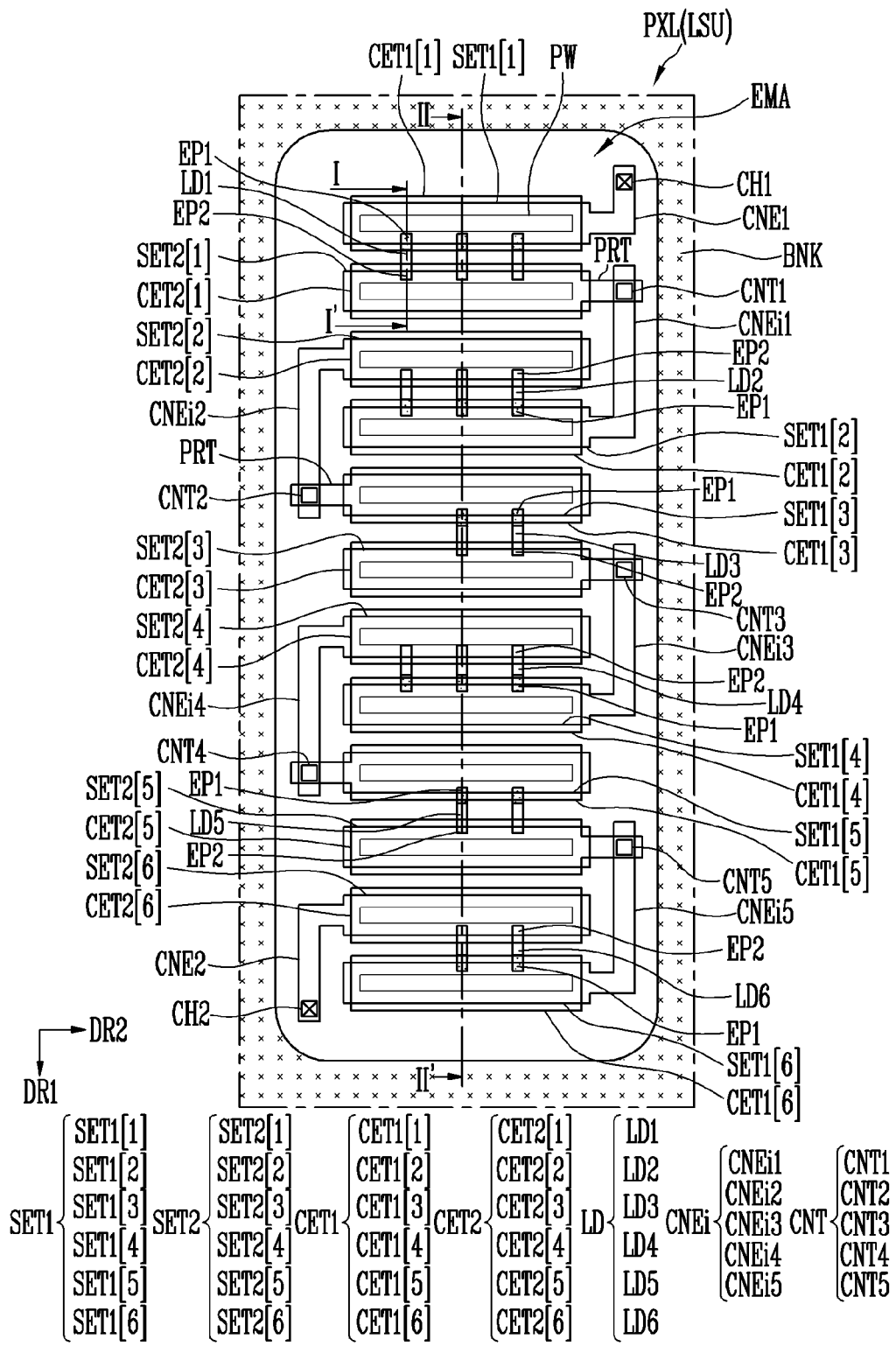

Referring to FIGS. 10 and 11, the pixel PXL may further include partition walls or banks PW (also referred to as "walls" or "bank patterns") disposed in each emission area EMA. Each partition wall PW may be disposed under or below at least one first sub-electrode SET1 or at least one second sub-electrode SET2.

In an embodiment, as illustrated in FIG. 10, partition walls PW each having an individual pattern may be disposed under or below sub-electrodes arranged or disposed at the first and last positions with respect to the first direction DR1, for example, under or below the first sub-electrode SET1[1] of the first serial stage and the first sub-electrode SET1[6] of the sixth serial stage. Partition walls PW may be disposed under or below the other sub-electrodes, for example, first and second sub-electrodes SET1 and SET2 arranged or disposed at intermediate positions such that each partition wall PW overlap first or second sub-electrodes SET1 or SET2. For example, each of the partition walls PW arranged or disposed at the intermediate positions of the emission area EMA may be disposed under or below two first or second sub-electrodes SET1 or SET2 that are successively disposed in the first direction DR1 (for example, first or second sub-electrodes SET1 or SET2 of two successive serial stages disposed adjacent to each other) such that the partition wall PW overlaps the two first or second sub-electrodes SET1 or SET2 in common.

In an embodiment, as illustrated in FIG. 11, the partition walls PW may be individually separately disposed under or below the first and second sub-electrodes SET1 and SET2, respectively. In other words, the shape, size, and/or arrangement structure of the partition walls PW may be changed in various ways depending on embodiments.

In case that the partition walls PW are respectively disposed under or below the first and second sub-electrodes SET1 and SET2, the first and second sub-electrodes SET1 and SET2 may protrude upward in an area in which the partition walls PW are disposed. Hence, light emitted from the opposite ends of the light emitting elements LD that face the first and second sub-electrodes SET1 and SET2, for example, from the first and second ends EP1 and EP2 of the light emitting elements LD, may be more effectively controlled to travel in a frontal direction of the display device.

Each pixel PXL in accordance with the above-mentioned embodiments may have a structure optimized to the biased alignment scheme in the same manner as that of the pixel PXL in accordance with an embodiment of FIG. 7, and obtain effects corresponding to that of an embodiment of FIG. 7. In other words, in accordance with at least one embodiment of the above-mentioned embodiments, the light source unit LSU including serial stages are formed efficiently using light emitting elements LD supplied to the emission area EMA of each pixel PXL, and the light emitting elements LD may be uniformly arranged or disposed in each serial stage. Consequently, the emission efficiency and the luminance of each pixel PXL may be enhanced, and a failure rate may be reduced.

FIGS. 12A to 12D each are a schematic cross-sectional view illustrating a pixel PXL in accordance with an embodiment, and for example illustrate different embodiments of a cross-section of the pixel PXL corresponding to line I-I' of FIG. 11. In an embodiment, FIGS. 12A to 12D each illustrate a cross-sectional structure of each pixel PXL focused on any one first light emitting element LD1 and a peripheral area thereof, and the pixels PXL may have a substantially identical or similar cross-sectional structure in the respective serial stages.

Referring to FIGS. 4 to 12D, the pixel PXL in accordance with an embodiment and the display device including the pixel PXL may include a display element layer DPL including light emitting elements LD disposed in the emission area EMA of each pixel PXL. Furthermore, the pixel PXL or the display device including the pixel PXL may selectively further include a pixel circuit layer PCL. For example, the pixel PXL or the display device including the pixel PXL may further include a pixel circuit layer PCL disposed between the base layer BSL and the display element layer DPL.

In an embodiment, the pixel circuit layer PCL may include at least one circuit element electrically connected to the light emitting elements LD of the corresponding pixel PXL. For example, the pixel circuit layer PCL may include at least one circuit element which forms the pixel circuit PXC of each pixel PXL.

For example, the pixel circuit layer PCL may include transistors T and a storage capacitor Cst that are disposed in each pixel area and form the corresponding pixel circuit PXC, and further include at least one power line and/or at least one signal line that may be connected to the pixel circuit PXC and/or the light source unit LSU. Here, in the case where the pixel circuit PXC is omitted and each light source unit LSU may be connected to or directly connected to the first and second power lines PL1 and PL2 (or signal lines), the pixel circuit layer PCL may be omitted. For the sake of explanation, FIGS. 12A to 12D representatively illustrate only any one transistor T among the circuit elements and the lines that are disposed in the pixel circuit layer PCL. Here, the plane/section structure of the pixel circuit layer PCL may be changed in various ways. The positions and cross-sectional structures of each transistor T may be changed in various ways depending on embodiments.

Furthermore, the pixel circuit layer PCL may include insulating layers disposed between respective electrodes and/or lines. In an embodiment, the pixel circuit layer PCL may include a buffer layer BFL, a gate insulating layer GI, an interlayer insulating layer ILD, and a passivation layer PSV which may be successively stacked each other on one surface or a surface of the base layer BSL. In an embodiment, the pixel circuit layer PCL may further include at least one light shielding pattern (not shown) disposed under or below at least some or a part of transistors T.

The buffer layer BFL may prevent impurities from diffusing into each circuit element. The buffer layer BFL may be formed of a single layer, or may be formed of multiple layers having at least two layers. In the case where the buffer layer BFL has a multilayer structure, the respective layers may be formed of the same material or different materials. In an embodiment, the buffer layer BFL may be omitted.

In an embodiment, each transistor T may include a semiconductor layer SCL, a gate electrode GE, and first and second transistor electrodes TE1 and TE2. Although FIGS. 12A to 12D illustrate an embodiment in which each transistor T may include the first and second transistor electrodes TE1 and TE2 that are formed separately from the semiconductor layer SCL, the disclosure is not limited thereto. For example, in an embodiment, the first and/or second transistor electrode TE1 and/or TE2 provided in at least one transistor T disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the base layer BSL on which the buffer layer BFL is formed. The semiconductor layer SCL may include a first area which comes into contact with each first transistor electrode TE1, a second area which comes into contact with each second transistor electrode TE2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc., within the spirit and the scope of the disclosure. The channel area of the semiconductor layer SCL may be an intrinsic semiconductor, which is an undoped semiconductor pattern. Each of the first and second areas of the semiconductor layer SCL may be a semiconductor pattern doped with an impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes TE1 and TE2 may be disposed on each semiconductor layer SCL with at least one interlayer insulating layer ILD interposed therebetween. For example, the first and second transistor electrodes TE1 and TE2 may be disposed on respective different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be connected to the first and second areas of the semiconductor layer SCL through corresponding contact holes which pass through the gate insulating layer GI and the interlayer insulating layer ILD. In an embodiment, any one of the first and second transistor electrodes TE1 and TE2 may be a source electrode, and the other may be a drain electrode.

At least one transistor T provided in the pixel circuit PXC may be connected to at least one pixel electrode. For example, any one (for example, the drain electrode) of the first and second transistor electrodes TE1 and TE2 of the first transistor T1 illustrated in FIG. 5G may be electrically connected to a first first-sub-electrode SET1 (for example, the first sub-electrode SET1[1] of the first serial stage) of the corresponding pixel PXL both through a contact hole (for example, the first contact hole CH1) passing through the passivation layer PSV and through the first connection electrode CNE1 provided or disposed over the passivation layer PSV.

In an embodiment, at least one signal line and/or power line that may be connected to each pixel PXL may be disposed on a layer identical with that of one electrode of each of the circuit elements that form the pixel circuit PXC. For example, the scan line Si of each pixel PXL may be disposed on the same layer or a same layer as that of the gate electrodes GE. The data line Dj of each pixel PXL may be disposed on the same layer or a same layer as that of the first and second transistor electrodes TE1 and TE2 of the transistors T. Furthermore, the first and/or second power lines PL1 and PL2 may be disposed on the same layer or a same layer as that of the gate electrodes GE or the first and second transistor electrodes TE1 and TE2 of the transistors T.

In an embodiment, the display element layer DPL may include a light source unit LSU of each of the pixels PXL. For example, the display element layer DPL may include first and second sub-electrodes SET1 and SET2 of each of electrode pairs disposed in the emission area EMA of each pixel PXL, and light emitting elements LD arranged or disposed between the first and second sub-electrodes SET1 and SET2. Furthermore, the display element layer DPL may selectively further include partition walls PW that protrude areas of the first and second sub-electrodes SET1 and SET2 upward, and first and second contact electrodes CET1 and CET2 to more reliably connect the light emitting elements LD between the first and second sub-electrodes SET1 and SET2. The display element layer DPL may further include, for example, at least one conductive layer and/or insulating layer.

In an embodiment, the display element layer DPL may include partition walls PW, first and second sub-electrodes SET1 and SET2, a first insulating layer INS1, light emitting elements LD, an insulating pattern INP, first and second contact electrodes CET1 and CET2, and a second insulating layer INS2, which are successively disposed and/or formed over the base layer BSL and/or the pixel circuit layer PCL.

The partition walls PW may be disposed at positions spaced apart from each other in the emission area EMA of each pixel PXL. The partition walls PW may protrude from the base layer BSL and/or the pixel circuit layer PCL in a height direction of the base layer BSL. In an embodiment, the partition walls PW may have substantially the same height, but the disclosure is not limited thereto.

In an embodiment, the partition walls PW may be disposed between the base layer BSL and/or the pixel circuit layer PCL and each first or second sub-electrode SET1 or SET2. The partition walls PW may be disposed adjacent to the first and second ends EP1 and EP2 of the light emitting elements LD. For example, the partition walls PW may be disposed to face the first and/or second ends EP1 and/or EP2 of the light emitting elements LD adjacent thereto.

Figure 12A:
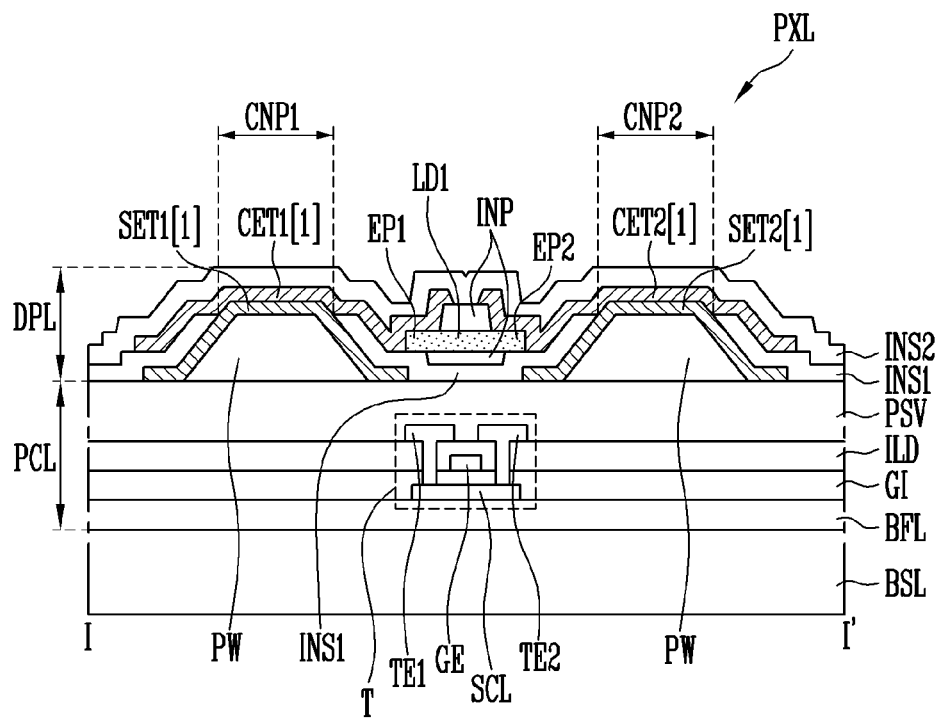
FIGS. 12A to 12D are schematic cross-sectional views each illustrating a pixel in accordance with an embodiment, and for example illustrate different embodiments of a cross-section of the pixel corresponding to line I-I' of FIG. 11.
Figure 12B:
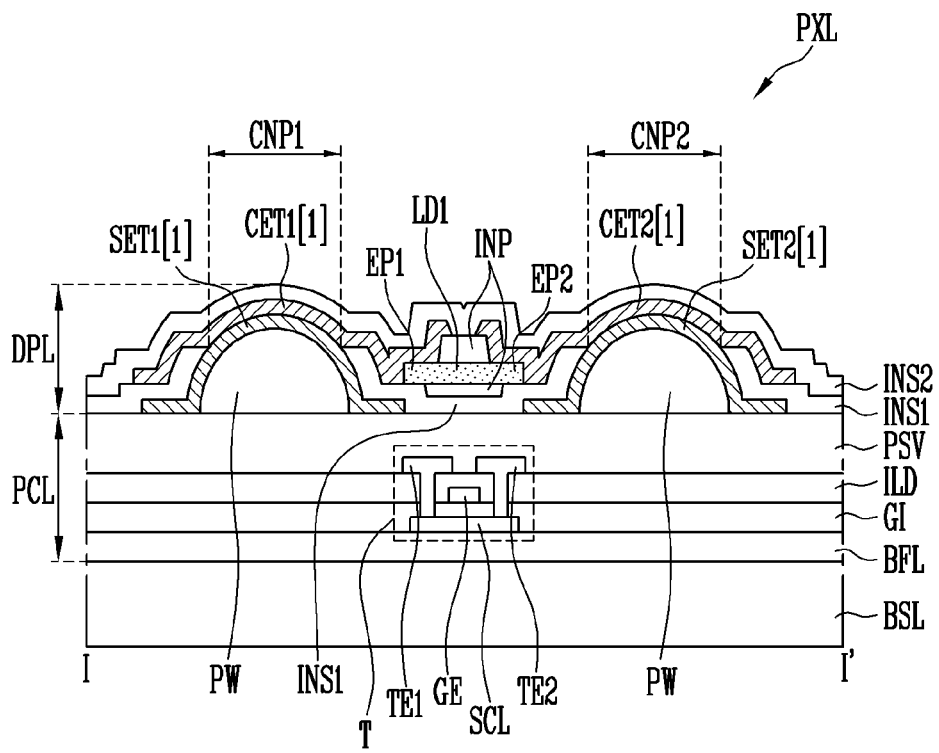
Figure 12C:
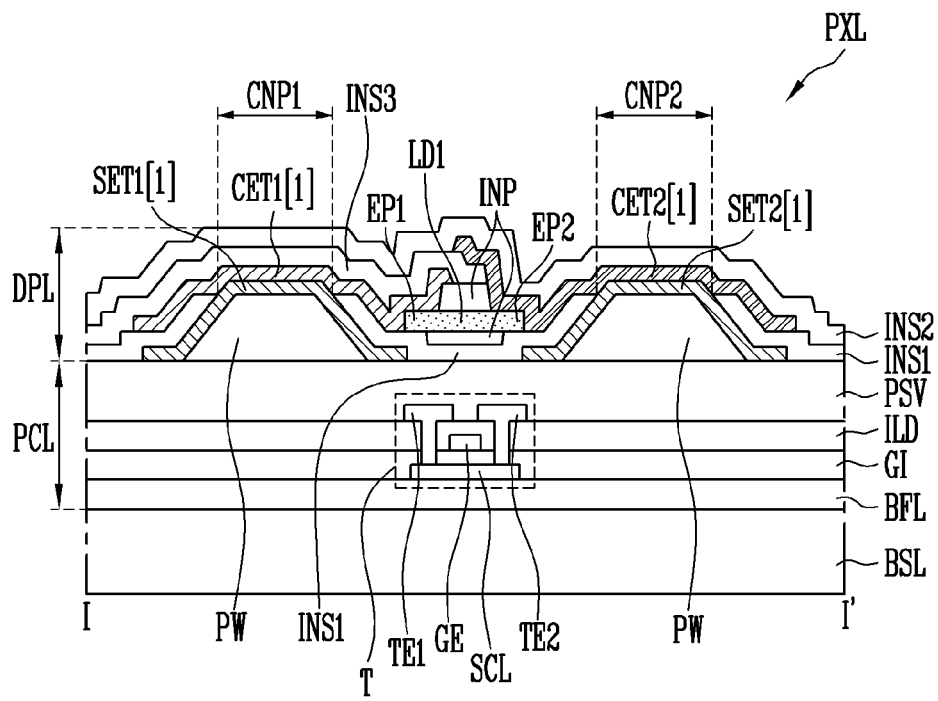
Figure 12D:
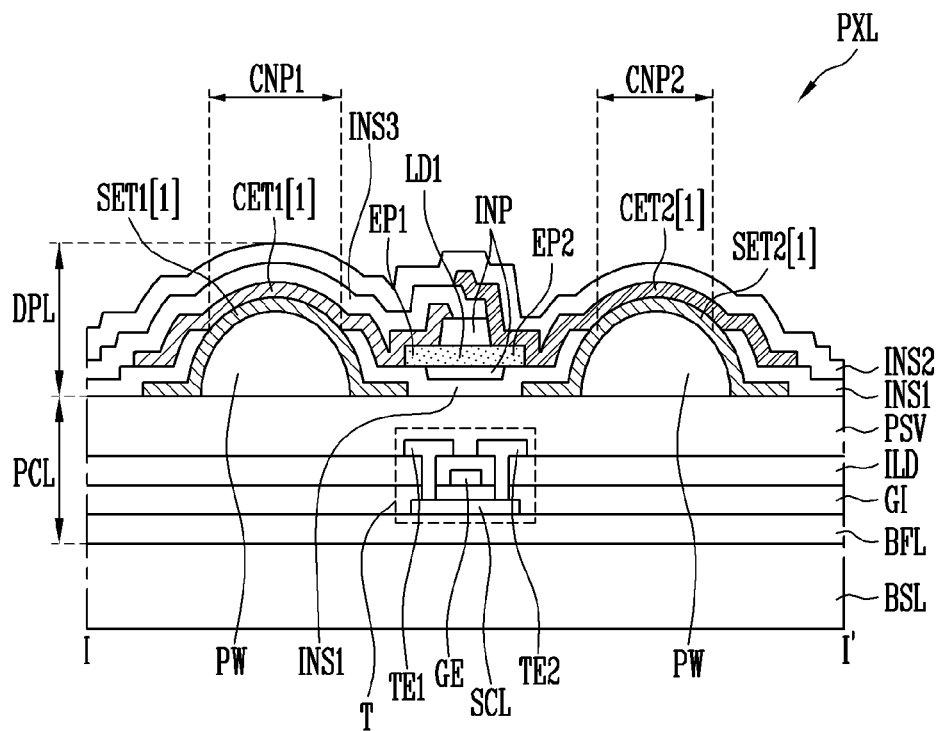

Depending on embodiments, the partition walls PW may have various shapes. In an embodiment, the partition walls PW each may have a substantially trapezoidal cross-section which may be reduced in width upward, as illustrated in FIGS. 12A and 12C. Each of the partition walls PW may have an inclined surface on at least one side surface or a side surface. In an embodiment, as illustrated in FIGS. 12B and 12D, the partition walls PW each may have a substantially semi-circular or substantially semi-elliptical cross-section, the width of which may be gradually reduced upward. Each of the partition walls PW may have a substantially curved surface on at least one side surface or a side surface, and at least electrode (or a sub-electrode) and/or an insulating layer that may be disposed over the partition walls PW may have a substantially curved surface in areas corresponding to the partition walls PW.

In other words, in the disclosure, the shape of the partition walls PW is not particularly limited, and it may be changed in various ways. Furthermore, in an embodiment, at least one of the partition walls PW may be omitted, or the position thereof may be changed.

The partition walls PW may include insulating material including at least one inorganic material and/or organic material. For example, the partition walls PW may include at least one inorganic layer including various inorganic insulating materials such as silicon nitride (SiN$_x$) or silicon oxide (SiO$_x$). As an example, the partition walls PW each may include at least one organic layer and/or photoresist layer containing various kinds of organic insulating materials, or may form a single- or multi-layer insulator containing organic/inorganic materials in combination. In an embodiment, the constituent material of the partition walls PW may be changed in various ways.

In an embodiment, the partition walls PW each may function as a reflector. For example, the partition walls PW, along with the first and second sub-electrodes SET1 and SET2 provided or disposed thereover, may function as reflectors that guide light emitted from each light emitting element LD in a desired direction, thus enhancing the light efficiency of the pixel PXL.

The first and second sub-electrodes SET1 and SET2 may be disposed over the respective partition walls PW. The first and second sub-electrodes SET1 and SET2 may be disposed at positions spaced apart from each other in each pixel area (by way of example, each emission area EMA).

In an embodiment, the first and second sub-electrodes SET1 and SET2, etc. that are disposed over the respective partition walls PW may have shapes corresponding to respective shapes of the partition walls PW. For example, the first and second sub-electrodes SET1 and SE2 each may have a substantially inclined surface or a substantially curved surface corresponding to that of each corresponding partition wall PW and protrude in a height direction of the base layer BSL.

In an embodiment, the partition walls PW may not be formed. Each of the first and second sub-electrodes SET1 and SET2 may be formed in a substantially planar shape on the passivation layer PSV.

Each of the first and second sub-electrodes SET1 and SET2 may include at least one conductive material. For example, each of the first and second sub-electrodes SET1 and SET2 may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), zinc oxide (ZnO), antimony zinc oxide (AZO), indium tin zinc oxide (ITZO), tin oxide (SnO$_2$), and a conductive polymer such as PEDOT, but the disclosure is not limited thereto. For example, each of the first and second sub-electrodes SET1 and SET2 may include other conductive materials such as a carbon nano tube and a graphene. In other words, each of the first and second sub-electrodes SET1 and SET2 may include at least one of various conductive materials to have conductivity, and the constituent material thereof is not particularly limited. Furthermore, each of the first and second sub-electrodes SET1 and SET2 may have the same conductive material, or at least one different conductive material.

Each of the first and second sub-electrodes SET1 and SET2 may have a single-layer or multilayer structure. For example, each of the first and second sub-electrodes SET1 and SET2 may include a reflective electrode layer including reflective conductive material. Each of the first and second sub-electrodes SET1 and SET2 may selectively further include at least one of at least one transparent electrode layer disposed over and/or under or below the reflective electrode layer, and at least one conductive capping layer covering or overlapping an upper portion of the reflective electrode layer and/or the transparent electrode layer.

In an embodiment, the reflective electrode layer of each of the first and second sub-electrodes SET1 and SET2 may be formed of conductive material having a uniform reflectivity. For example, the reflective electrode layer may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, but the disclosure is not limited thereto. In other words, reflective electrode layer may be formed of various reflective conductive materials. Each of the first and second sub-electrodes SET1 and SET2 that may include the reflective electrode layer may enable light emitted from the opposite ends of each of the light emitting elements LD, for example, the first and second ends EP1 and EP2, to travel in a direction (for example, in a frontal direction) in which an image is displayed. By way of example, if the first and second sub-electrodes SET1 and SET2 have substantially inclined or substantially curved surfaces corresponding to the shapes of the respective partition walls PW and are disposed to face the first and second ends EP1 and EP2 of the light emitting elements LD, light emitted from the first and second ends EP1 and EP2 of each of the light emitting elements LD may be reflected by the first and second sub-electrodes SET1 and SET2 and thus further reliably travel in the frontal direction of the display panel PNL (for example, in an upward direction of the base layer BSL). Thereby, the efficiency of light emitted from the light emitting elements LD may be enhanced.

Furthermore, the transparent electrode layer of each of the first and second sub-electrodes SET1 and SET2 may be formed of various transparent conductive materials. For example, the transparent electrode layer may include ITO, IZO or ITZO, but the disclosure is not limited thereto. In an embodiment, each of the first and second sub-electrodes SET1 and SET2 may have a three-layer structure having a stacked structure of ITO/Ag/ITO. As such, if the first and second sub-electrodes SET1 and SET2 each are formed of a multilayer structure having at least two layers, a voltage drop due to signal delay (RC delay) may be minimized. Thus, a desired voltage can be effectively transmitted to the light emitting elements LD.

If each of the first and second sub-electrodes SET1 and SET2 may include the conductive capping layer that covers or overlaps the reflective electrode layer and/or the transparent electrode layer, it is possible to prevent the reflective electrode layer of the first and second sub-electrodes SET1 and SET2 from being damaged due to defects caused during the fabricating process of the pixel PXL. However, the conductive capping layer may be selectively included in the first and second sub-electrodes SET1 and SET2, and may be omitted depending on embodiments. Furthermore, the conductive capping layer may be considered as a component of each of the first and second sub-electrodes SET1 and SET2, or considered as a separate component disposed on the first and second sub-electrodes SET1 and SET2.

The first insulating layer INS1 may be disposed on an area of each of the first and second sub-electrodes SET1 and SET2. For example, the first insulating layer INS1 may be formed to cover or overlap areas of the first and second sub-electrodes SET1 and SET2, and may include an opening to expose other areas of the first and second sub-electrodes SET1 and SET2. For example, the first insulating layer INS1 may expose the first and second sub-electrodes SET1 and SET2 in first and second contact areas CNP1 and CNP2. In an embodiment, the first insulating layer INS1 may not be formed. The light emitting elements LD may be disposed on or directly disposed on the passivation layer PSV and/or one end or an end of each of the first and second sub-electrodes SET1 and SET2.

In an embodiment, the first insulating layer INS1 may be primarily formed to cover or overlap the overall surfaces of the first and second sub-electrodes SET1 and SET2. After the light emitting elements LD are supplied and aligned on the first insulating layer INS1, the first insulating layer INS1 may be partially open to expose the first and second sub-electrodes SET1 and SET2 in respective areas (for example, the respective first and second contact areas CNP1 and CNP2) on the partition walls PW. In an embodiment, the first insulating layer INS1 may be patterned in the form of an individual pattern which is sectionally disposed under or below the light emitting elements LD after the supply and alignment of the light emitting elements LD have been completed.

In other words, the first insulating layer INS1 may be interposed between the first and second sub-electrodes SET1 and SET2 and the light emitting elements LD, and may expose at least one area of each of the first and second sub-electrodes SET1 and SET2. After the first and second sub-electrodes SET1 and SET2 are formed, the first insulating layer INS1 may be formed to cover or overlap the first and second sub-electrodes SET1 and SET2, so that it is possible to prevent the first and second sub-electrodes SET1 and SET2 from being damaged or to prevent metal from being precipitated in a subsequent process. Furthermore, the first insulating layer INS1 may stably support each light emitting element LD.

The first insulating layer INS1 may be formed of a single layer or multiple layers, and include at least one inorganic insulating material and/or organic insulating material. For example, the first insulating layer INS1 may include various kinds of organic/inorganic insulating materials including silicon nitride ($SiN_x$), silicon oxide ($SiO_x$), aluminum oxide ($Al_2O_3$), etc., within the spirit and the scope of the disclosure. The constituent material of the first insulating layer INS1 is not particularly limited.

Light emitting elements LD may be supplied to and aligned in each pixel area, by way of example, the emission area EMA of each pixel PXL, in which the first insulating layer INS1 is formed. For example, light emitting elements LD may be supplied to each emission area EMA through an inkjet scheme or a slit-coating scheme, and the light emitting elements LD may be aligned with the directionality between the first and second sub-electrodes SET1 and SET2 by alignment signals (or alignment voltages) applied to the first and second sub-electrodes SET1 and SET2.

In an embodiment, at least some or a part of the light emitting elements LD may be disposed in the horizontal direction between a pair of first and second sub-electrodes SET1 and SET2 such that the opposite ends (for example, the first and second ends EP1 and EP2) of each light emitting element LD with respect to the longitudinal direction thereof overlap the pair of first and second sub-electrodes SET1 and SET2. Furthermore, in an embodiment, other some or a part of the light emitting elements LD may be disposed in a diagonal direction between the pair of first and second sub-electrodes SET1 and SET2. In an embodiment, at least some or a part of the light emitting elements LD may be disposed between a pair of first and second sub-electrodes SET1 and SET2 such that the at least some or a part of light emitting elements LD do not overlap the first and second sub-electrodes SET1 and SET2, and may be connected to the first and second sub-electrodes SET1 and SET2 respectively through the first contact electrode CET1 and the second contact electrode CET2.

The insulating pattern INP may be disposed on areas of the light emitting elements LD. For example, the insulating pattern INP may expose the first and second ends EP1 and EP2 of the light emitting elements LD and be partially disposed over only the areas of the light emitting elements LD including respective central areas of the light emitting elements LD. The insulating pattern INP may be formed in an independent pattern in each emission area EMA, but the disclosure is not limited thereto. The insulating pattern INP may be omitted depending on embodiments. The opposite ends of the first and second contact electrodes CET1 and CET2 may be disposed on or directly disposed on the light emitting elements LD.

The insulating pattern INP may be formed of a single layer or multiple layers, and include at least one inorganic insulating material and/or organic insulating material. For example, the insulating pattern INP may include various kinds of organic/inorganic insulating materials including silicon nitride ($SiN_x$), silicon oxide ($SiO_x$), aluminum oxide ($Al_2O_3$), photoresist (PR) material, etc., within the spirit and the scope of the disclosure. The constituent material of the insulating pattern INP is not particularly limited.

After the alignment of the light emitting elements LD has been completed, the insulating pattern INP is formed on the light emitting elements LD so that the light emitting elements LD may be prevented from being removed from the aligned position. Furthermore, in the case where space may be present between the first insulating layer INS1 and the light emitting elements LD, the space may be filled with the insulating material drawn thereinto during a process of forming the insulating pattern INP. Consequently, the light emitting elements LD may be more stably supported. For example, in an embodiment, the insulating pattern INP may be formed only over the light emitting elements LD, or may be formed both over and under or below the light emitting elements LD.

The opposite ends of the light emitting elements LD, for example, the first and second ends EP1 and EP2, which are not covered with or overlapped by the insulating pattern INP, may be respectively covered with or overlapped by the first and second contact electrodes CET1 and CET2. For example, respective ends of the first and second contact electrodes CET1 and CET2 may be disposed, at positions spaced apart from each other, on the first and second ends EP1 and EP2 of the light emitting elements LD, with the insulating pattern INP interposed therebetween.

In an embodiment, the first and second contact electrodes CET1 and CET2 may be simultaneously formed on the same layer or a same layer on one surface or a surface of the base layer BSL, as illustrated in FIGS. 12A and 12B. Hence, a process of fabricating the pixel PXL and the display device including the pixel PXL may be simplified. For example, compared to the case where the first and second contact electrodes CET1 and CET2 are formed through respective mask processes, the number of mask processes needed to form the pixel PXL may be reduced, and the first and second contact electrodes CET1 and CET2 may be more readily formed.

In an embodiment, the first and second contact electrodes CET1 and CET2 may be successively formed on different layers on one surface or a surface of the base layer BSL, as illustrated in FIGS. 12C and 12D. An additional third insulating layer INS3 may be disposed between the first and second contact electrodes CET1 and CET2. In other words, the positions and the relative disposition relationship of the first and second contact electrodes CET1 and CET2 may be changed in various ways.

Furthermore, the first and second contact electrodes CET1 and CET2 may be disposed over the first and second sub-electrodes SET1 and SET2 to cover or overlap exposed areas (for example, the first and second contact areas CNP1 and CNP2) of the first and second sub-electrodes SET1 and SET2. For example, the first and second contact electrodes CET1 and CET2 may be disposed on at least areas of the first and second sub-electrodes SET1 and SET2 to come into contact with the first and second sub-electrodes SET1 and SET2 in the first and second contact areas CNP1 and CNP2. Hence, the first and second contact electrodes CET1 and CET2 may be respectively electrically connected to the first and second sub-electrodes SET1 and SET2. The first and second sub-electrodes SET1 and SET2 may be respectively electrically connected to the first and second ends EP1 and EP2 of the light emitting elements LD through the first and second contact electrodes CET1 and CET2.

In an embodiment, the first and second contact electrodes CET1 and CET2 may be formed of various transparent conductive materials. For example, the first and second contact electrodes CET1 and CET2 may include a transparent electrode layer including at least one of various transparent conductive materials including ITO, IZO, and ITZO. Since the first and second contact electrodes CET1 and CET2 are formed to be substantially transparent or translucent to satisfy a transmittance, light emitted from the light emitting elements LD through the respective first and second ends EP1 and EP2 may be emitted outside the display device after passing through the first and second contact electrodes CET1 and CET2.

The second insulating layer INS2 may be disposed on the first and second contact electrodes CET1 and CET2. For example, to cover or overlap the partition walls PW, the first and second sub-electrodes SET1 and SET2, the light emitting elements LD, the insulating pattern INP, and the first and second contact electrodes CET1 and CET2, the second insulating layer INS2 may be formed and/or disposed on the overall surface of the display area DA of the base layer BSL on which the partition walls PW, the first and second sub-electrodes SET1 and SET2, the light emitting elements LD, the insulating pattern INP, and the first and second contact electrodes CET1 and CET2 are formed. In an embodiment, the second insulating layer INS2 may be formed on the overall surface of the display area DA to cover or overlap the bank BNK that encloses each emission area EMVA, but the disclosure is not limited thereto. The second insulating layer INS2 may include at least one inorganic layer and/or organic layer.

In an embodiment, the second insulating layer INS2 may be formed of a single layer or multiple layers, and include at least one inorganic insulating material and/or organic insulating material. For example, the second insulating layer INS2 may include various kinds of organic/inorganic insulating materials including silicon nitride ($SiN_x$), silicon oxide ($SiO_x$), etc., within the spirit and the scope of the disclosure. The constituent material of the second insulating layer INS2 is not particularly limited.

In an embodiment, the second insulating layer INS2 may include a thin-film encapsulation layer having a multi-layered structure. For example, the second insulating layer INS2 may be formed of a thin-film encapsulation layer having a multilayer structure including at least two inorganic insulating layers, and at least one organic insulating layer interposed between the at least two inorganic insulating layers. Here, the constituent material and/or structure of the second insulating layer INS2 may be changed in various ways. In an embodiment, at least one overcoat layer, and/or an encapsulation substrate, etc., may be further disposed over the second insulating layer INS2.

Figure 13:
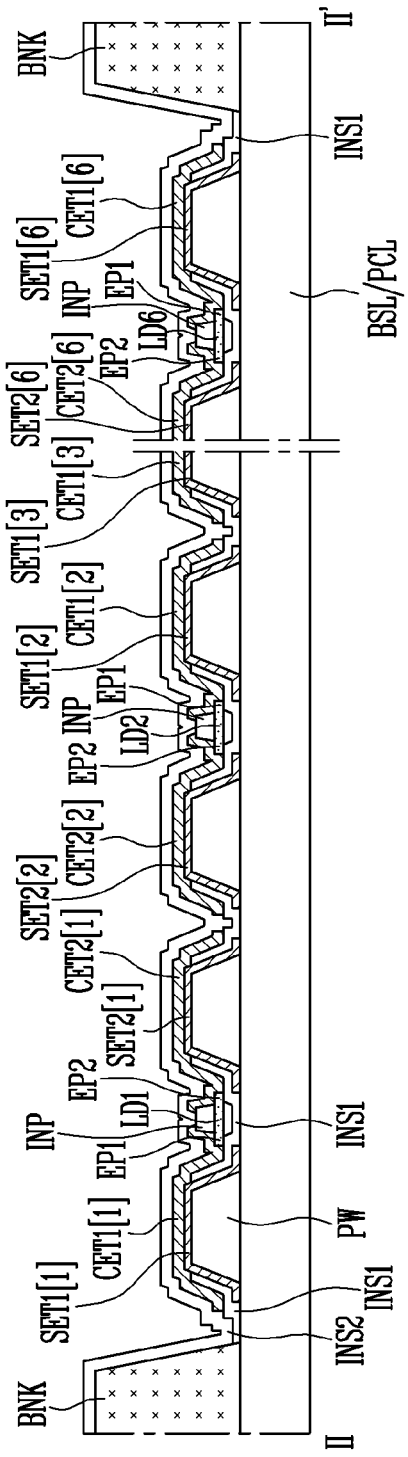
FIG. 13 is a schematic cross-sectional view illustrating a pixel in accordance with an embodiment and for example illustrates an embodiment of a cross-section of the pixel corresponding to line II-II' of FIG. 11.

FIG. 13 is a schematic cross-sectional view illustrating a pixel PXL in accordance with an embodiment and for example illustrates an embodiment of a cross-section of the pixel PXL corresponding to line II-II' of FIG. 11. FIG. 13 schematically illustrates a structure of the pixel PXL, focused on the above-described display element layer DPL. In the description of FIG. 13, like reference numerals will be used to designate components similar or equal to those of the previous embodiments, and detailed explanation thereof will be omitted.

Referring to FIGS. 4 to 13, light emitting elements LD disposed in different serial stages may be spaced apart from each other with at least two sub-electrodes interposed therebetween. For example, a first light emitting element LD1 disposed between the first and second sub-electrodes SET1[1] and SET2[1] of the first serial stage may be spaced apart from a second light emitting element LD2 disposed between the first and second sub-electrodes SET1[2] and SET2[2] of the second serial stage with the second sub-electrodes SET2[1] and SET2[2] of the first and second serial stages that are adjacent to each other interposed therebetween. The first and second ends EP1 and EP2 of the first light emitting element LD1 may be successively disposed with respect to the first direction DR1. The first and second ends EP1 and EP2 of the second light emitting element LD2 may be disposed in reverse order with respect to the first direction DR1. In this way, the first to sixth light emitting elements LD1 to LD6 may be arranged or disposed in the first direction DR1 at intervals corresponding to two sub-electrodes.

The light emitting element LD may not be disposed between the first sub-electrodes SET1 or the second sub-electrodes SET2 that are adjacent to each other. For example, any light emitting element LD may not be connected between the second sub-electrode SET2[1] of the first serial stage and the second sub-electrode SET2[2] of the second serial stage that are successively disposed in the first direction DR1. In an embodiment, the first or second sub-electrodes SET1 or SET2 that are adjacent to each other may be integrally or non-integrally connected to each other at the step of aligning the light emitting elements LD, and thus be supplied with an identical alignment signal (or alignment voltage).

Figure 14:
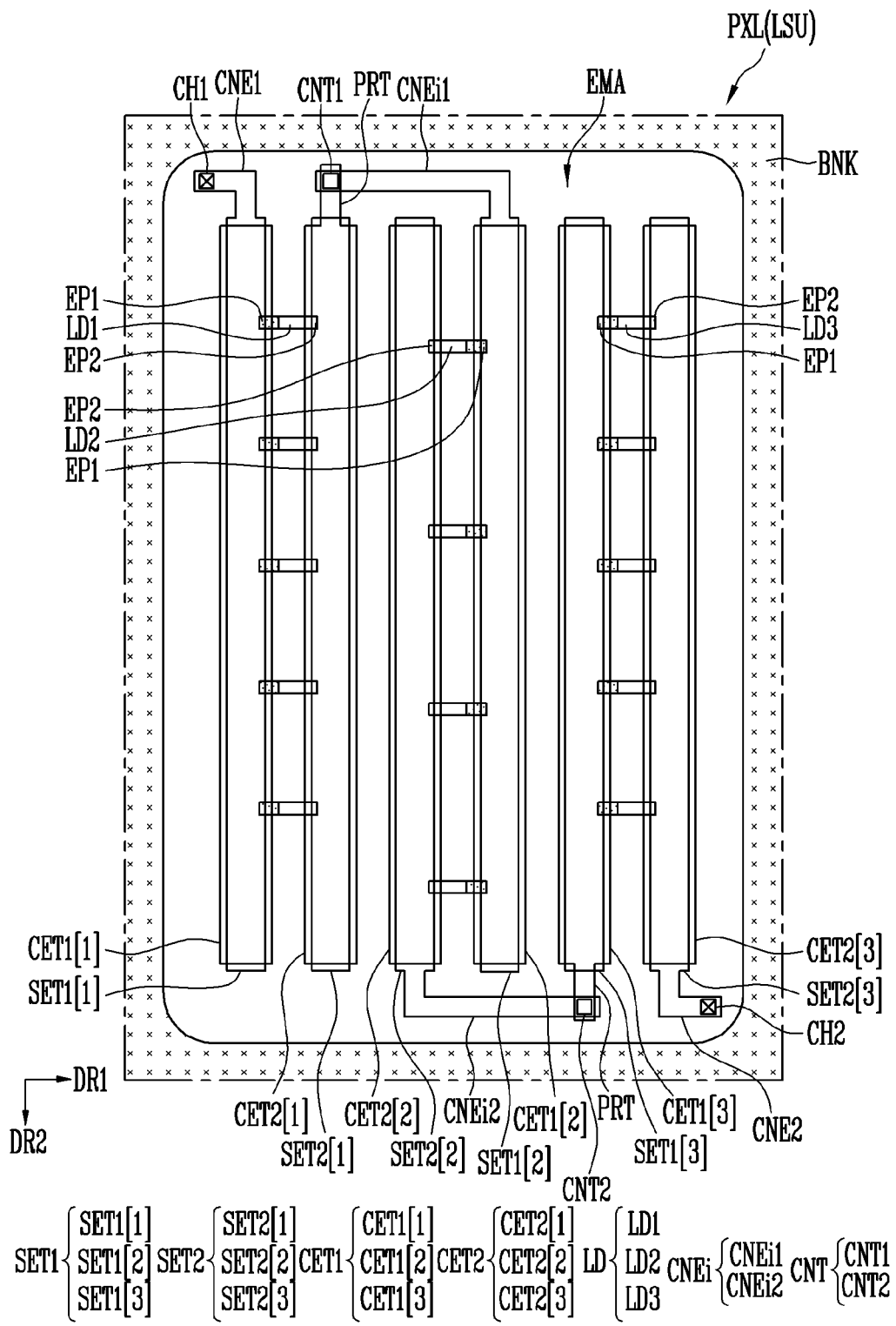
FIGS. 14 to 15 are schematic plan views each illustrating a pixel in accordance with an embodiment, and for example illustrate different modified embodiments of the pixel of FIG. 7.
Figure 15:
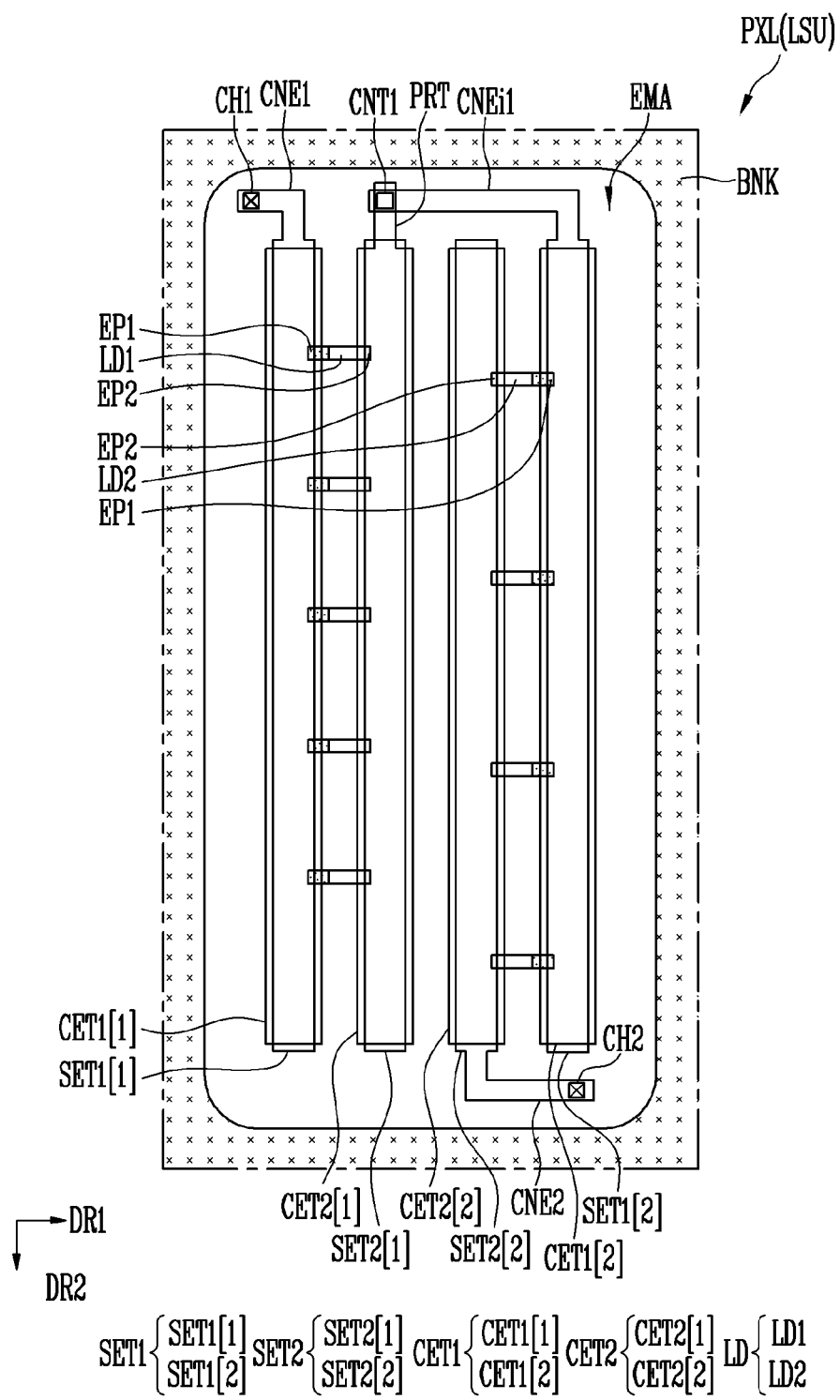

FIGS. 14 and 15 are schematic plan views each illustrating a pixel PXL in accordance with an embodiment, and for example illustrate different embodiments pertaining to the pixel PXL of FIG. 7. In the description of FIGS. 14 and 15, like reference numerals are used to designate components similar or equal to those of at least one above-described embodiment, for example, an embodiment of FIG. 7, and detailed explanation thereof will be omitted.

Referring to FIGS. 14 and 15, electrode pairs each including a pair of first and second sub-electrodes SET1 and SET2 may be successively arranged or disposed in the first direction DR1 that is set as the transverse direction of the emission area EMA. Each of the first and second sub-electrodes SET1 and SET2 may extend in the second direction DR2 that is set as the longitudinal direction of the emission area EMA.

In an embodiment, in the case where a width of the emission area EMA with respect to the transverse direction is less than a length of the emission area EMA with respect to the longitudinal direction, each of the first and second sub-electrodes SET1 and SET2 in accordance with embodiments of FIGS. 14 and 15 may have a length greater than that of each of the first and second sub-electrodes SET1 and SET2 in accordance with an embodiment of FIG. 7. Furthermore, the number of electrode pairs disposed in each of the pixels PXL in accordance with embodiments of FIGS. 14 and 15 (or a total number of first and second sub-electrodes SET1 and SET2) may be less than the number of electrode pairs disposed in the pixel PXL in accordance with an embodiment of FIG. 7.

Here, the number of electrode pairs disposed in each pixel PXL in accordance with embodiments of FIGS. 14 and 15 is not particularly limited. For example, as illustrated in FIG. 14, the pixel PXL may include three pairs of first and second sub-electrodes SET1 and SET2, or more pairs of first and second sub-electrodes SET1 and SET2. As an example, as illustrated in FIG. 15, the pixel PXL may include only two pairs of first and second sub-electrodes SET1 and SET2. In other words, in the case where the first and second sub-electrodes SET1 and SET2 are arranged or disposed in the transverse direction of the emission area EMA, the pixel PXL may be formed of two or more electrode pairs, and include at least two serial stages.

FIGS. 16A to 16D are schematic plan views sequentially illustrating a method of fabricating a display device in accordance with an embodiment and for example illustrate an embodiment of a method of fabricating a display device including the pixel PXL of FIG. 11. In an embodiment, FIGS. 16A to 16D illustrate a plane structure of the pixel PXL, centered on the display element layer DPL in which the light source unit LSU of the pixel PXL is disposed. In FIGS. 16A to 16D, illustration of the bank BNK, which may be formed before or after the first and second sub-electrodes SET1 and SET2 are formed, and of which the position and the forming step may be changed in various ways, will be omitted.

Referring to FIGS. 4 to 16A, electrode pairs for constituting the serial stages of the light source unit LSU are formed in each pixel area (by way of example, the emission area EMA of each pixel PXL) on the base layer BSL (or the pixel circuit layer PCL and/or one surface or a surface of the base layer BSL on which the partition walls PW are formed). In an embodiment, each pixel area may be an area including an emission area EMA of each pixel PXL, and a peripheral area provided or disposed around a perimeter of the emission area EMA, and may be an area embracing the emission area EMA in which the light source unit LSU of the corresponding pixel PXL is formed, and a pixel circuit area in which the pixel circuit PXC of the pixel PXL is formed. Electrode pairs are formed in the emission area EMA of each of the pixels PXL disposed in the display area DA. The pixels PXL may be formed to have a substantially identical or similar structure.

In an embodiment, each of electrode pairs formed in the emission area EMA of each pixel PXL may include a pair of first and second sub-electrodes SET1 and SET2. The electrode pairs may be successively arranged or disposed in the first direction DR1 in each emission area EMA.

In an embodiment, the first or second sub-electrodes SET1 or SET2 of electrode pairs that are successively disposed based on the first direction DR1 may be successively disposed in the first direction DR1. Furthermore, the first or second sub-electrodes SET1 or SET2 of the successive electrode pairs may be integrally connected to each other, thus forming each double electrode pattern. For example, the first or second sub-electrodes SET1 or SET2 of the successive electrode pairs may be integrally connected to each other on at least one end or an end thereof (for example, on opposite ends thereof), thus forming each double electrode pattern.

For example, the second sub-electrode SET2[1] of the first serial stage and the second sub-electrode SET2[2] of the second serial stage may be integrally connected to each other on the opposite ends thereof and thus formed as one double electrode pattern. Likewise, the first sub-electrode SET1[2] of the second serial stage and the first sub-electrode SET1[3] of the third serial stage may be integrally connected to each other on the opposite ends thereof and thus formed as one double electrode pattern. In this way, the first or second sub-electrodes SET1 or SET2 of two successive electrode pairs may be formed as each double electrode pattern.

Figure 16A:
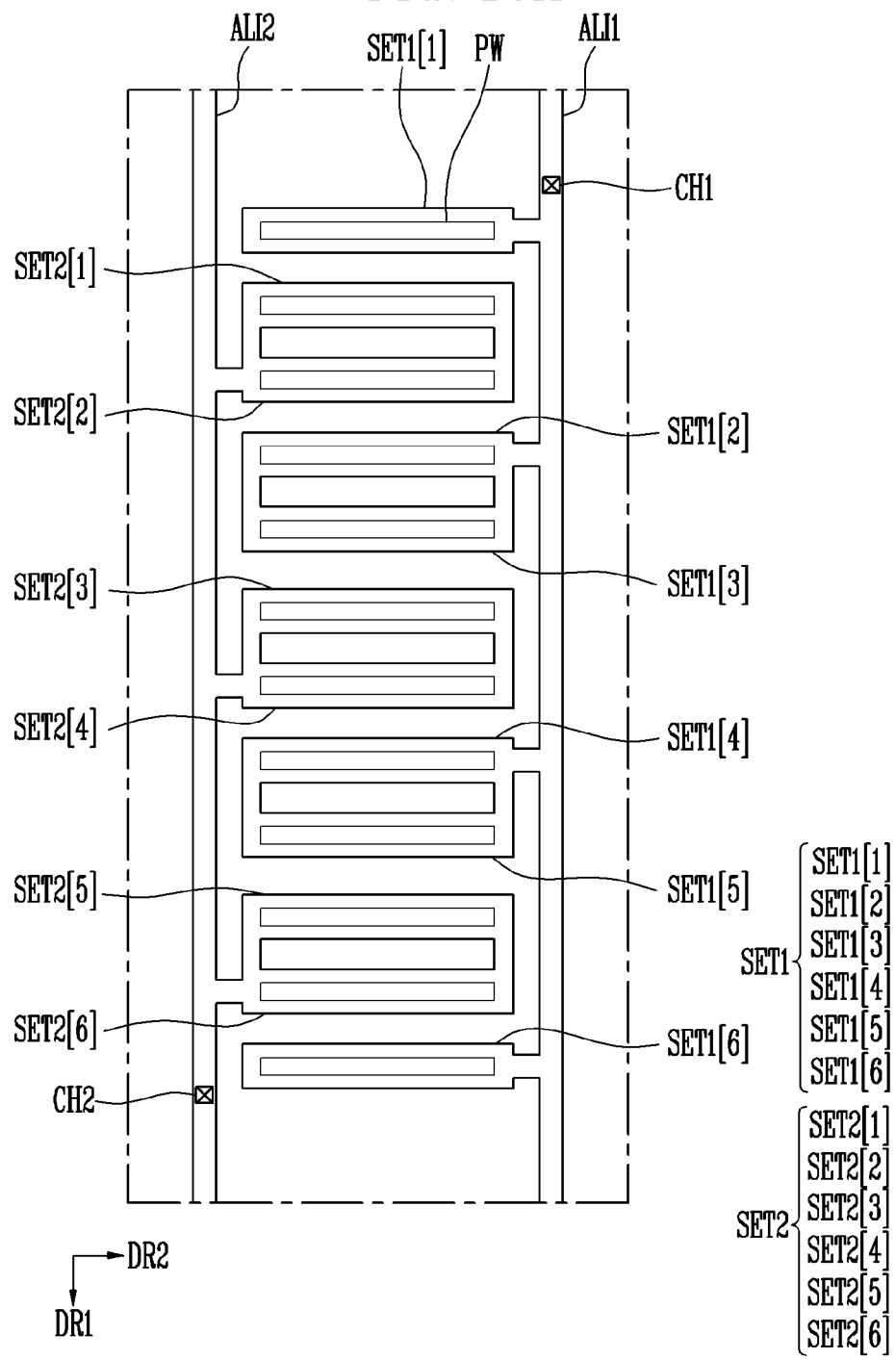
FIGS. 16A to 16D are schematic plan views sequentially illustrating a method of fabricating a display device in accordance with an embodiment and for example illustrate an embodiment of a method of fabricating a display device including the pixel of FIG. 11.
Figure 16B:
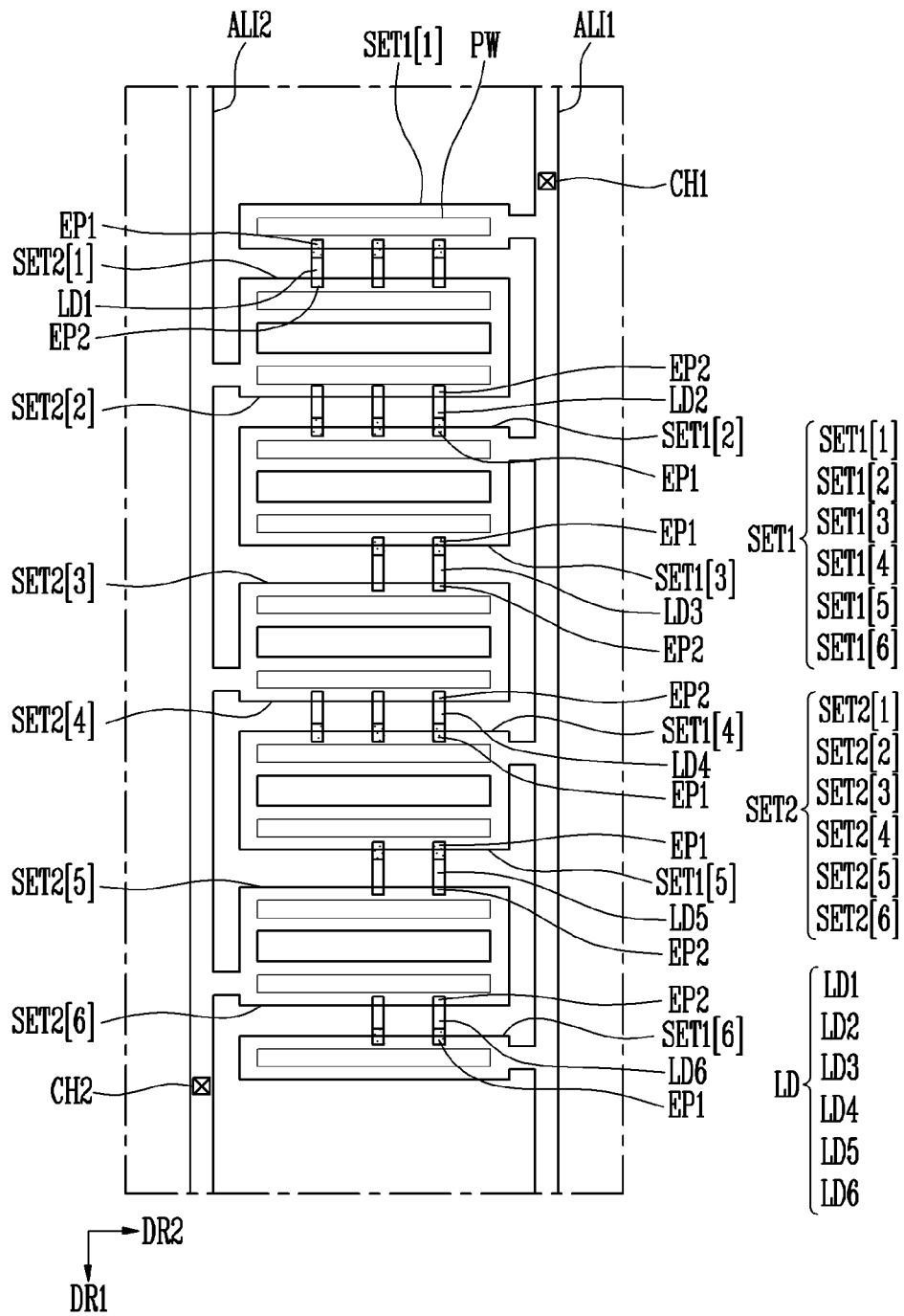
Figure 16C:
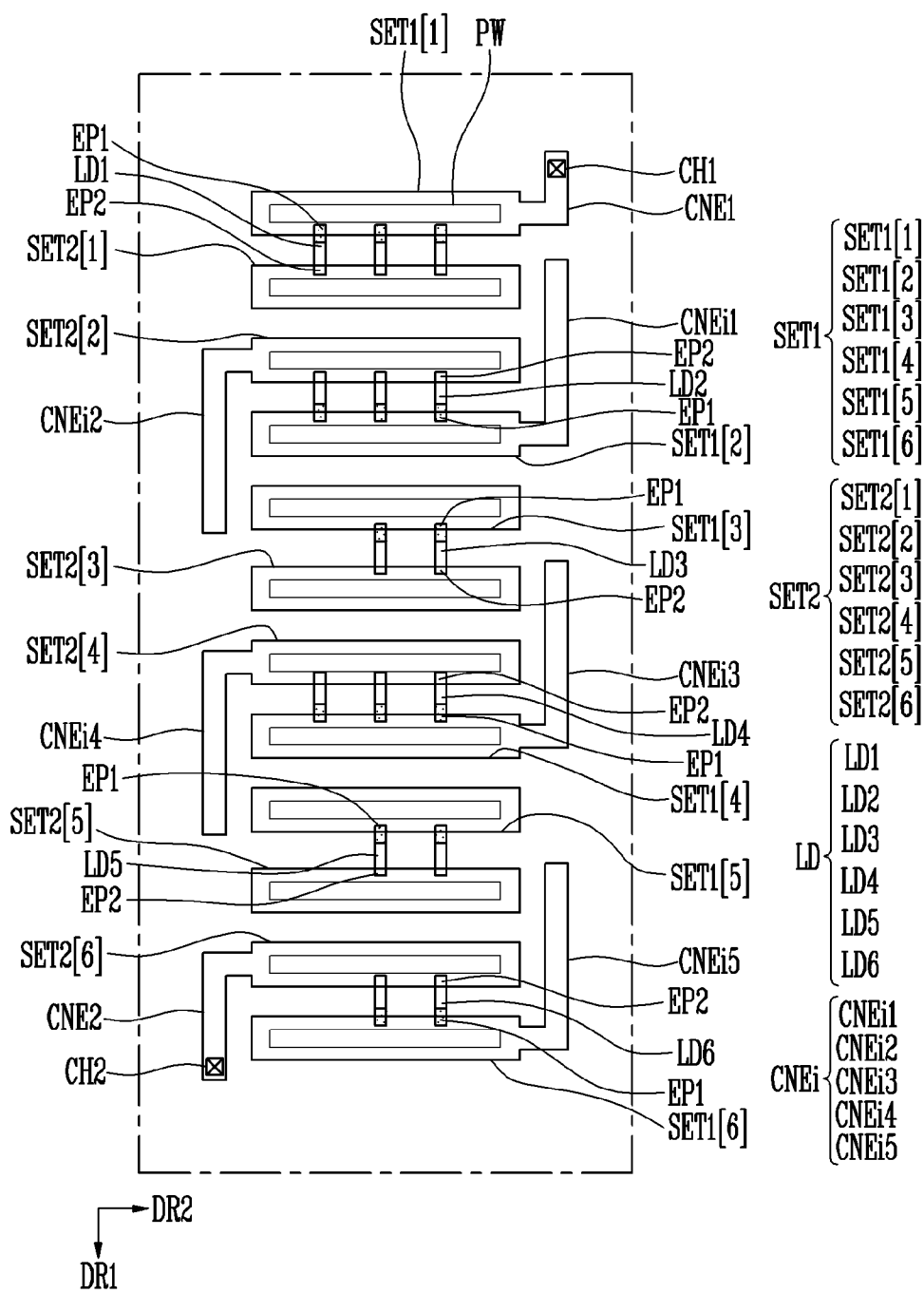
Figure 16D:
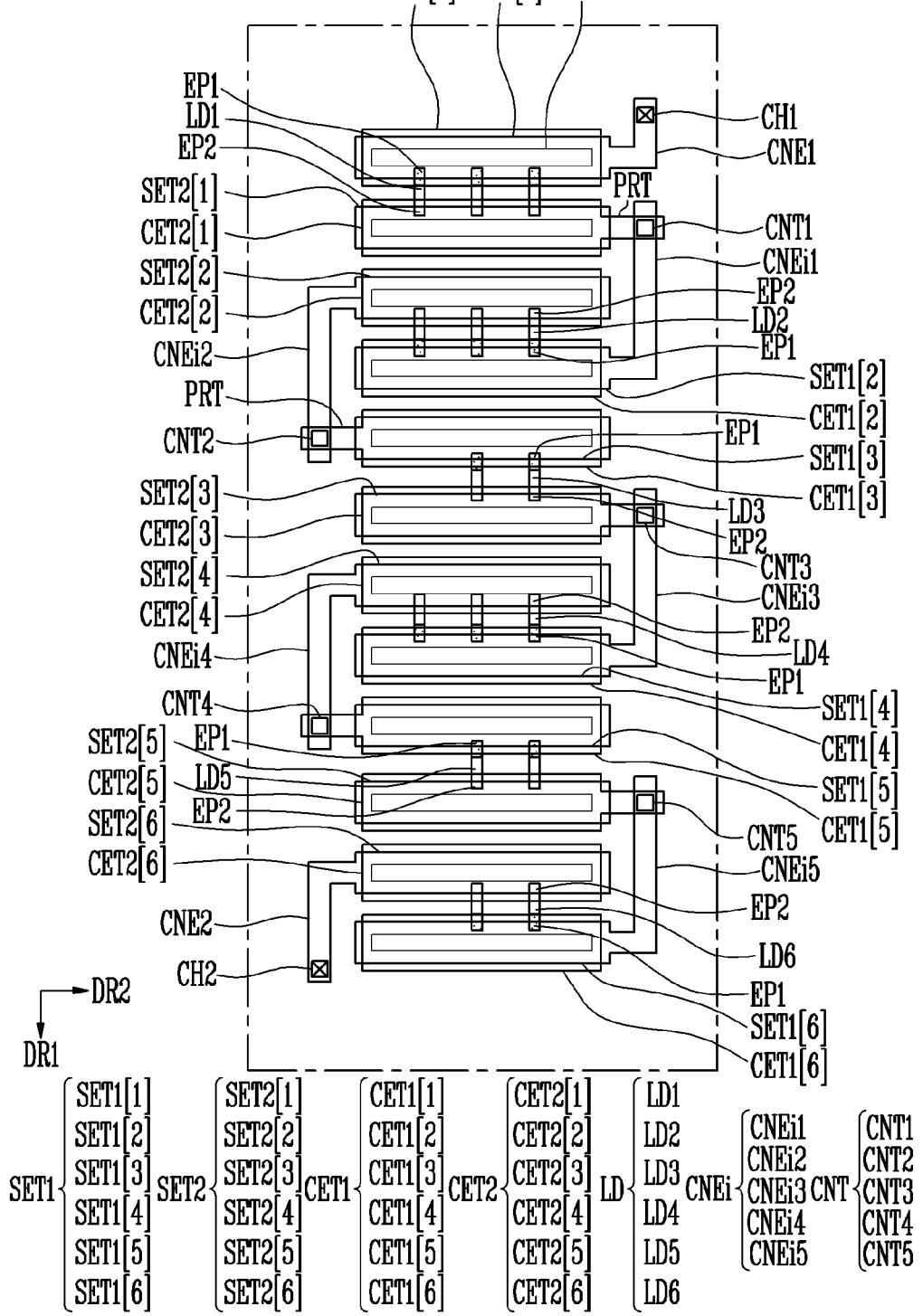

Although in FIGS. 11 and 16A there has been described that the sub-electrodes disposed at the first and last positions in each emission area EMA with respect to the first direction DR1 (for example, the first sub-electrode SET1[1] of the first serial stage and the first sub-electrode SET1[6] of the sixth serial stage) each are formed as a single electrode pattern, and the other sub-electrodes disposed at the intermediate position each are formed as a double electrode pattern, the disclosure is not limited thereto. For example, in an embodiment, each of the sub-electrodes disposed at the first and last positions in each emission area EMA may be also formed as a double electrode pattern. Here, each double electrode pattern may be divided later into sub-electrodes. Each of the double electrode patterns disposed at the first and last positions in the first direction DR1 in the emission area EMA may be divided into a first or last sub-electrode (for example, the first sub-electrode SET1[1] of the first serial stage or the first sub-electrode SET1[6] of the sixth serial stage) and a dummy electrode (for example, a first or second dummy electrode DET1 or DET2 of FIG. 9). Each of the double electrode patterns disposed at the intermediate position in the emission area EMA may be divided into first or second sub-electrodes SET1 or SET2 of two successive serial stages.

In an embodiment, at the step of forming the first and second sub-electrodes SET1 and SET2 of the pixels PXL, a first alignment line ALI1 to be connected in common to the first sub-electrodes SET1 of the pixels PXL and a second alignment line ALI2 to be connected in common to the second sub-electrodes SET2 of the pixels PXL may be formed together.

In an embodiment, the first sub-electrodes SET1 of the pixels PXL may be integrally connected to each other through the first alignment line ALI1. The second sub-electrodes SET2 of the pixels PXL may be integrally connected to each other through the second alignment line ALI2. However, the disclosure is not limited thereto. For example, the first sub-electrodes SET1 of the pixels PXL may be integrally or non-integrally electrically connected to each other. The second sub-electrodes SET2 of the pixels PXL may be integrally or non-integrally electrically connected to each other.

Referring to FIGS. 4 to 16B, light emitting elements LD may be supplied to and aligned in each pixel area (by way of example, in the emission area EMA of each pixel PXL) including the first and second sub-electrodes SET1 and SET2. For example, light emitting elements LD may be supplied to each emission area EMA by an inkjet scheme, a slit-coating scheme, or other various schemes. Thereafter, the light emitting elements LD may be aligned by respectively supplying a first alignment signal (or a first alignment voltage) and a second alignment signal (or a second alignment voltage) to the first alignment line ALI1 and the second alignment line ALI2. In an embodiment, the first and second alignment signals may be respectively supplied to the first and second sub-electrodes SET1 and SET2 through the first and second alignment lines ALI1 and ALI2 simultaneously with the supply of the light emitting elements LD or after the supply of the light emitting elements LD.

In an embodiment, to minimize effects of the pixel circuit PXC, a reference potential voltage (for example, a ground voltage) may be applied to the first alignment line ALI1, and an alignment signal having an AC waveform may be applied to the second alignment line ALI2. However, the disclosure is not limited thereto. For example, in an embodiment, the alignment signal having an AC waveform may be applied to the first alignment line ALI11, and the reference potential voltage (for example, the ground voltage) may be applied to the second alignment line ALI2. Furthermore, the type and/or waveform, etc. of the first alignment signal (or the first alignment voltage) and the second alignment signal (or the second alignment voltage) to be respectively supplied to the first alignment line ALI1 and the second alignment line ALI2 may be changed in various ways. As alignment signals are applied to the first and second sub-electrodes SET1 and SET2 of the pixels PXL, an electric field is formed between the first and second sub-electrodes SET1 and SET2. Hence, the light emitting elements LD are aligned between the first and second sub-electrodes SET1 and SET2.

In an embodiment, the light emitting elements LD may be biased-aligned between the first and second sub-electrodes SET1 and SET2 by controlling alignment signals or forming a magnetic field. For example, the light emitting elements LD may be biased-aligned such that the first end EP1 of each light emitting element LD is disposed to face any one first sub-electrode SET1, and the second end EP2 of each light emitting element LD is disposed to face any one second sub-electrode SET2 that makes a pair with the any one first sub-electrode SET1.

Here, two first sub-electrodes SET1 or second sub-electrodes SET2 that are successively disposed and form each double electrode pattern may be supplied with an identical alignment signal to form an equipotential surface. Therefore, the light emitting element LD may not be disposed between the two first sub-electrodes SET1 or second sub-electrodes SET2 that form each double electrode pattern.

Referring to FIGS. 4 to 16C, after the alignment of the light emitting elements LD has been completed, the first and second sub-electrodes SET1 and SET2 may be individually separated from each other through an etching scheme or the like within the spirit and the scope of the disclosure. Furthermore, during this process, the first and second sub-electrodes SET1 and SET2 may be respectively separated from the first and second alignment lines ALI1 and ALI2.

In an embodiment, at the step of individually separating the first and second sub-electrodes SET1 and SET2, each double electrode pattern may be separated into the respective first or second sub-electrodes SET1 and SET2. Furthermore, the first and/or second alignment lines ALI1 and/or ALI2 may be disconnected between adjacent pixels PXL so that each pixel PXL can be independently driven.

In an embodiment, during a process of separating the first and second sub-electrodes SET1 and SET2 from each other, connection portions between some or a part of sub-electrodes and the first or second alignment line ALI1 or ALI2 may selectively remain, as needed. Consequently, the first and second connection electrodes CNE1 and CNE2 and the intermediate connection electrodes CNEi may be formed. However, the disclosure is not limited thereto. For example, in an embodiment, at least one of the first and second connection electrodes CNE1 and CNE2 and the intermediate connection electrodes CNEi may be formed separately from the first and second sub-electrodes SET1 and SET2.

Referring to FIGS. 4 to 16D, the first and second contact electrodes CET1 and CET2 may be respectively formed on the first and second sub-electrodes SET1 and SET2. Furthermore, in an embodiment, during a process of forming the first and second contact electrodes CET1 and CET2, the first and second sub-electrodes SET1 and SET2 of each pixel PXL may be re-connected such that the light emitting elements LD (for example, the first to sixth light emitting elements LD1 to LD6) aligned between the first and second sub-electrodes SET1 and SET2 of each serial stage are connected in the forward direction between the first and second sub-electrodes SET1 and SET2. For example, the second sub-electrodes SET2 of the electrode pairs other than the last electrode pair may be electrically connected to the first sub-electrode SET1 of a subsequent electrode pair.

For example, the second sub-electrode SET2[1] of the first serial stage connected to the second end EP2 of the first light emitting element LD1 may be electrically connected to the first sub-electrode SET1[2] of the second serial stage connected to the first end EP1 of the second light emitting element LD2. In this way, the first and second sub-electrodes SET1 and SET2 are re-connected, whereby the light source unit LSU having a serial/parallel combination structure including serial stags may be formed.

While the scope of the disclosure is described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the claims.

The scope of the disclosure is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

The invention claimed is:

1. A pixel comprising:
   electrode pairs successively disposed in a first direction, and each of the electrode pairs including a first sub-electrode and a second sub-electrode successively disposed in the first direction;
   light emitting elements, each of the light emitting elements including:
      a first polarity end portion being electrically connected to the first sub-electrode, and
      a second polarity end portion being electrically connected to the second sub-electrode of any one of the electrode pairs;
   a first connection electrode electrically connected between the first sub-electrode of a first electrode pair of the electrode pairs and a first power supply; and
   a second connection electrode electrically connected between the second sub-electrode of a last electrode pair of the electrode pairs and a second power supply,
   wherein the second sub-electrode of a remaining electrode pair other than the last electrode pair of the electrode pairs is spaced apart from the first sub-electrode of a subsequent electrode pair with at least one first sub-electrode or at least one second sub-electrode disposed between the second sub-electrode of the remaining electrode pair and the first sub-electrode of the subsequent electrode pair, and is electrically connected to the first sub-electrode of the subsequent electrode pair.

2. The pixel according to claim 1, wherein respective first sub-electrodes and respective second sub-electrodes of two electrode pairs successively disposed among the electrode pairs are disposed in opposite directions such that the respective first sub-electrodes of the two electrode pairs or the respective second sub-electrodes of the two electrode pairs are adjacent to each other.

3. The pixel according to claim 2, wherein
   a first sub-electrode and a second sub-electrode of each odd-number-th electrode pair among the electrode pairs are successively disposed in the first direction, and
   a first sub-electrode and a second sub-electrode of each even-number-th electrode pair among the electrode pairs are disposed in reverse order in the first direction.

4. The pixel according to claim 1, wherein
   the first polarity end portion and the second polarity end portion of each of the light emitting elements are a P-type end portion and an N-type end portion, respectively, and
   each of the light emitting elements is electrically connected in a forward direction between the first sub-electrode and the second sub-electrode of one of the electrode pairs.

5. The pixel according to claim 1, further comprising:
   first contact electrodes respectively disposed on first sub-electrodes of the electrode pairs and electrically and respectively connecting each of the first sub-electrodes to the first polarity end portion of an adjacent light emitting element; and
   second contact electrodes respectively disposed on second sub-electrodes of the electrode pairs and electrically and respectively connecting each of the respective second sub-electrodes to the second polarity end portion of an adjacent light emitting element.

6. The pixel according to claim 5, wherein the second sub-electrode of the remaining electrode pair other than the last electrode pair is electrically connected to the first sub-electrode of the subsequent electrode pair through a corresponding one of intermediate connection electrodes.

7. The pixel according to claim 6, wherein the each intermediate connection electrode integrally extends from one of the second sub-electrode of the remaining electrode pair and the first sub-electrode of the subsequent electrode pair.

8. The pixel according to claim 7, wherein the first contact electrode or the second contact electrode that is disposed on a remaining sub-electrode of the second sub-electrode of the remaining electrode pair and the first sub-electrode of the subsequent electrode pair comprises a protrusion protruding in a second direction intersecting the first direction and is electrically connected to the each intermediate connection electrode.

9. The pixel according to claim 5, wherein
   each of the first sub-electrode and the second sub-electrode of the electrode pairs comprises a reflective electrode layer including a reflective conductive material, and
   each of the first contact electrode and the second contact electrode comprises a transparent electrode layer including a transparent conductive material.

10. The pixel according to claim 1, further comprising:
    an emission area enclosed by an opaque bank and including the electrode pairs and the light emitting elements,
    wherein the first direction is a longitudinal direction of the emission area.

11. The pixel according to claim 10, wherein
    the electrode pairs comprise three or more electrode pairs, and
    the light emitting elements are dispersed and disposed in three or more serial stages including the respective electrode pairs, and are electrically connected to each other in a series-parallel combination structure.

12. The pixel according to claim 1, further comprising:
    an emission area enclosed by an opaque bank and including the electrode pairs and the light emitting elements, and
    wherein the first direction is a transverse direction of the emission area.

13. The pixel according to claim 12, wherein the electrode pairs comprise two or more electrode pairs each including first sub-electrodes and second sub-electrodes extending in a longitudinal direction of the emission area.

14. The pixel according to claim 1, further comprising at least one of:
    a first dummy electrode electrically isolated and disposed adjacent to the first electrode pair; and
    a second dummy electrode electrically isolated and disposed adjacent to the last electrode pair.

15. The pixel according to claim 1, further comprising:
banks respectively disposed below at least one of the first sub-electrode and the second sub-electrode of the electrode pairs.

16. The pixel according to claim 15, wherein a part of the banks are respectively disposed below two first sub-electrodes or two second sub-electrodes successively disposed in the first direction among the first sub-electrodes and second sub-electrodes of the electrode pairs such that the part of the banks overlap the two first sub-electrodes or the two second sub-electrodes.

17. The pixel according to claim 15, wherein the banks are individually separated and disposed below each of the first sub-electrodes and the second sub-electrodes of the electrode pairs.

18. The pixel according to claim 1, wherein
the electrode pairs include a first electrode pair and a second electrode pair adjacent to each other in the first direction, and
the first sub-electrode of the first electrode pair, the second sub-electrode of the first electrode pair, the second sub-electrode of the second electrode pair, and the first sub-electrode of the second electrode pair are sequentially disposed in the first direction.

19. The pixel according to claim 18, wherein
the electrode pairs further include a third electrode pair adjacent to the second electrode pair in the first direction, and
the first sub-electrode of the first electrode pair, the second sub-electrode of the first electrode pair, the second sub-electrode of the second electrode pair, the first sub-electrode of the second electrode pair, the first sub-electrode of the third electrode pair, and the second sub-electrode of the third electrode pair are sequentially disposed in the first direction.

20. A display device comprising:
a pixel disposed in a display area, the pixel comprising:
electrode pairs successively disposed in a first direction, and each of the electrode pairs including a first sub-electrode and a second sub-electrode that are successively disposed in the first direction;
light emitting elements, each of the light emitting elements including:
a first polarity end portion being electrically connected to first sub-electrodes, and
a second polarity end portion being electrically connected to second sub-electrodes of any one of the electrode pairs;
a first connection electrode electrically connected between a first sub-electrode of a first electrode pair of the electrode pairs and a first power supply;
a second connection electrode electrically connected between the second sub-electrode of a last electrode pair of the electrode pairs and a second power supply,
wherein the second sub-electrode of a remaining electrode pair other than the last electrode pair of the electrode pairs is spaced apart from the first sub-electrode of a subsequent electrode pair with at least one first sub-electrode or second sub-electrode disposed between the second sub-electrode of the remaining electrode pair and the first sub-electrode of the subsequent electrode pair, and is electrically connected to the first sub-electrode of the subsequent electrode pair.

21. A method of fabricating a display device, comprising:
forming, in an emission area of each pixel, electrode pairs, each of the electrode pairs including a pair of first sub-electrode and second sub-electrode and successively disposed in a first direction, and a first alignment line and a second alignment line respectively electrically connected to the first sub-electrode and the second sub-electrode of any one of the electrode pairs;
supplying light emitting elements to the emission area, and applying alignment signals to the first alignment line and the second alignment line to align the light emitting elements;
individually separating the first sub-electrode and the second sub-electrode; and
re-connecting the first sub-electrode and the second sub-electrode such that the aligned light emitting elements are electrically connected in a forward direction between the first sub-electrode and the second sub-electrode of each of the electrode pairs, wherein
the forming of the electrode pairs comprises forming a double electrode pattern by successively disposing a first sub-electrode or a second sub-electrode of each of successive electrode pairs of the electrode pairs and forming the first sub-electrode or second sub-electrode of each of the successive electrode pairs to be integral with each other, and
the individually separating of the first sub-electrode and second sub-electrode comprises separating the double electrode pattern into respective first sub-electrodes and respective second sub-electrodes.

* * * * *